US007106292B2

(12) United States Patent
Moon

(10) Patent No.: US 7,106,292 B2
(45) Date of Patent: Sep. 12, 2006

(54) SHIFT REGISTER, LIQUID CRYSTAL DISPLAY DEVICE HAVING THE SHIFT REGISTER AND METHOD OF DRIVING SCAN LINES USING THE SAME

(75) Inventor: Seung-Hwan Moon, Yongin-si (KR)

(73) Assignee: Samsung Electronics Co., Ltd., (KR)

( * ) Notice: Subject to any disclaimer, the term of this patent is extended or adjusted under 35 U.S.C. 154(b) by 491 days.

(21) Appl. No.: 10/458,053

(22) Filed: Jun. 10, 2003

(65) Prior Publication Data

US 2003/0227433 A1 Dec. 11, 2003

(30) Foreign Application Priority Data

Jun. 10, 2002 (KR) ...................... 10-2002-0032368
Jul. 2, 2002 (KR) ...................... 10-2002-0037944

(51) Int. Cl.
*G09G 3/36* (2006.01)

(52) U.S. Cl. ...................................... 345/100; 345/204

(58) Field of Classification Search ................ 345/205, 345/89, 90, 91, 92, 93, 94, 95, 96, 97, 98, 345/99, 100
See application file for complete search history.

(56) References Cited

U.S. PATENT DOCUMENTS 5,136,622 A * 8/1992 Plus ............................ 377/64
6,501,456 B1 * 12/2002 Saito et al. ................... 345/98

* cited by examiner

*Primary Examiner*—Richard Hjerpe
*Assistant Examiner*—Jean Lesperance
(74) *Attorney, Agent, or Firm*—Cantor Colburn LLP

(57) ABSTRACT

In a bi-directional shift register and a liquid crystal display device having the bi-directional shift register, the shift register further includes a dummy stage for resetting a last stage. The dummy stage is reset by a control signal of the last stage or by the output signal of the dummy stage. Therefore, power consumption and layout area may be reduced. The shift register includes a plurality of stages and two dummy stages, and two selection signals for selecting shift direction is applied to each of the stages.

23 Claims, 37 Drawing Sheets

SHIFT REGISTER, LIQUID CRYSTAL DISPLAY DEVICE HAVING THE SHIFT REGISTER AND METHOD OF DRIVING SCAN LINES USING THE SAME

CROSS-REFERENCE TO RELATED APPLICATIONS

This application relies for priority upon Korean Patent Application No. 2002-32368 filed on Jun. 10, 2002 and Korean Patent Application No. 2002-37944 filed on July, 2002, the contents of which are herein incorporated by reference in their entirety.

BACKGROUND OF THE INVENTION

1. Field of the Invention

The present invention relates to a shift register, a liquid crystal display (LCD) device having the shift register and a method of driving scan lines using the same.

2. Description of the Related Art

An LCD device has advantages over other display devices, for example CRT type display device. In detail, the LCD device may be manufactured in a thinner and lighter structure having a lower power consumption, may require a lower driving voltage compared with the other display devices, and may provide image display quality similar to that of the CRT type display device. The LCD device is widely used in various electronic apparatus.

When voltage is applied to liquid crystal molecules, the alignment angle of the liquid crystal molecules is changed, the transmissivity of the liquid crystal molecules is regulated, and thus an image is displayed.

The LCD device is classified into a twisted nematic (TN) type LCD device and a super-twisted nematic (STN) type LCD device. The LCD device also may be classified into an active matrix type LCD device and a passive matrix type LCD device according to a method of driving the LCD device. The active matrix type LCD device employs switching elements and TN liquid crystal. The active matrix type LCD device is used in a thin film transistor (TFT) LCD device. However, the passive matrix type LCD device employs STN liquid crystal.

The active matrix type LCD device uses the thin film transistors as a switching element so as to drive the LCD device. However, the passive matrix type LCD device does not use transistors so as to drive the LCD device, so that the passive matrix type LCD device does not require complicated circuits for driving the LCD device.

The TFT LCD device is classified into amorphous-Si TFT LCD (or a-Si TFT LCD) device and a poly-Si TFT LCD device. The poly-silicon TFT LCD (or poly-Si TFT LCD) device has lower power consumption and a low price, but is manufactured through complex processes compared with the a-Si TFT LCD device. Accordingly, the poly-Si TFT LCD is used in a display device having a small display screen such as a mobile phone.

The a-Si TFT LCD device may provide a large display screen and a high yield (or high productivity), and is used in a display device having a large display screen such as a laptop computer, an LCD monitor or a high definition television (HDTV).

FIG. 1 is a schematic view showing a conventional poly-silicon thin film transistor LCD, and FIG. 2 is a schematic view showing a conventional a-Si thin film transistor LCD.

As shown in FIG. 1, the poly-Si TFT LCD device includes a poly-Si TFT pixel array formed on a glass substrate 10. A data driver circuit 12 and a gate driver circuit 14 are formed on the glass substrate 10. An integrated printed circuit board 20 is connected to a terminal part 16 by means of a film cable 18, so that the cost for manufacturing the poly-Si TFT LCD device may be reduced and power consumption may be minimized because the data driver circuit 12 and the gate driver circuit 14 are integrated on the glass substrate 10.

However, as shown in FIG. 2, in the a-Si TFT LCD device, a data driver chip 34 is mounted on a flexible printed circuit board 32 via a chip on film (COF), and a data printed circuit board 36 is connected to a data line terminal on the a-Si TFT pixel array through the flexible printed circuit board 32. A gate driver chip 40 is mounted on the flexible printed circuit board 32 via the chip on film (COF), and a gate printed circuit board 42 is connected to a gate line terminal on the a-Si TFT pixel array through a flexible printed circuit board 40.

The a-Si TFT LCD device has an advantage in aspect of yield (or productivity), but has disadvantage in aspect of manufacturing cost and thickness.

A power supply for supplying a power voltage to the gate driver circuit may be mounted on the data printed circuit board so as to remove the gate printed circuit board.

However, even when the gate driver circuit is mounted on the data printed circuit board, the gate driver circuit is mounted on the flexible printed circuit. Since a plurality of flexible printed circuits is bonded to the glass substrate, the a-Si TFT LCD device uses a complicate outer lead bonding process so as to bind the flexible printed circuits to the glass substrate. Accordingly, the cost for manufacturing the a-Si TFT LCD device increases.

Therefore, according to a recent method of manufacturing the a-Si TFT LCD device, the data driver circuit and the gate driver circuit are formed on the glass substrate in the same process as the process of forming the pixel array on the glass substrate so as to reduce the number of steps for manufacturing the a-Si TFT LCD device.

However, the shift direction is fixed in the shift register of the conventional a-Si TFT LCD device, and the conventional a-Si TFT LCD device does not provide a bi-directional shift register in which a forward shift or a backward shift occurs.

SUMMARY OF THE INVENTION

Accordingly, the present invention is provided to substantially obviate one or more problems due to limitations and disadvantages of the related art.

It is an aspect of the present invention to provide a shift register, which may drive a liquid crystal display device having a large display screen, may have low power consumption and may have a reduced layout area required for designing the shift register.

It is another aspect of the present invention to provide a liquid crystal display device having the shift register, which may drive the liquid crystal display device having a large display screen, may have low power consumption and may have a reduced layout area required for designing the shift register.

It is still another aspect of the present invention to provide a shift register having a bidirectional shift function so that an image may be displayed upside down on the display screen.

It is still another aspect of the present invention to provide a liquid crystal display device including the shift register having a bidirectional shift function so that an image may be displayed upside down on the display screen.

In one aspect of the present invention, there is provided a shift register including a plurality of stages and a dummy stage. The stages include odd numbered stages and even numbered stages. The odd numbered stages respectively receives a first clock and a first control signal, the first clock is prevented from being outputted from each of the odd numbered stages in response to the first control signal, and the even numbered stages respectively receives a second clock and a second control signal. The second clock is prevented from being outputted from each of the even numbered stages in response to the second control signal. The second clock has a first phase 180° different from a second phase of the first clock. The stages respectively delay the first clock or the second clock by a first period to sequentially output the first clock and the second clock as a scan line driving signal. The dummy stage generates a dummy output signal, and the scan line driving signal of a last stage falls below a first predetermined voltage level in response to the dummy output signal of the dummy stage. The dummy output signal is delayed by a second period and falls below a second predetermined voltage level in response to the dummy output signal.

In another aspect of the present invention, there is provided a shift register including a plurality of stages and a dummy stage. The stages include odd numbered stages and even numbered stages. The odd numbered stages respectively receives a first clock and a first control signal, the first clock is prevented from being outputted from each of the odd numbered stages in response to the first control signal, and the even numbered stages respectively receives a second clock and a second control signal. The second clock is prevented from being outputted from each of the even numbered stages in response to the second control signal. The second clock has a first phase 180° different from a second phase of the first clock. The stages respectively delay the first clock or the second clock by a first period to sequentially output the first clock and the second clock as a scan line driving signal. The dummy stage is coupled to a last stage and generates a dummy output signal. The scan line driving signal of the last stage falls below a first predetermined voltage level in response to the dummy output signal of the dummy stage, and the dummy output signal is delayed by a second period and falls below a second predetermined voltage level in response to a control signal of the last stage.

In further another aspect of the present invention, there is provided a liquid crystal display device including a display cell array, a data driver circuit and a gate driver circuit. The display cell array is formed on a transparent substrate and includes a plurality of gate lines, a plurality of data lines and a plurality of switching elements. The switching elements respectively are coupled to each of the data lines and each of the gate lines. The data driver circuit is coupled with the data lines and provides the data lines with image signals. The gate driver circuit is coupled with the gate lines and drives the switching elements. The gate driver circuit includes a plurality of stages and a dummy stage. The stages include odd numbered stages and even numbered stages, and the odd numbered stages respectively receives a first clock and a first control signal. The first clock is prevented from being outputted from each of the odd numbered stages in response to the first control signal. The even numbered stages respectively receive a second clock and a second control signal, and the second clock is prevented from being outputted from each of the even numbered stages in response to the second control signal. The second clock has a first phase 180° different from a second phase of the first clock. The stages respectively delay the first clock or the second clock by a first period and sequentially output the first clock and the second clock as a gate line driving signal to sequentially select the gate lines. The dummy stage generates a dummy output signal. The gate line driving signal of a last stage falls below a first predetermined voltage level in response to the dummy output signal of the dummy stage, and the dummy output signal is delayed by a second period, and falls below a second predetermined voltage level in response to the dummy output signal.

In still another aspect of the present invention, there is provided a liquid crystal display device including a display cell array, a data driver circuit and a gate driver circuit. The display cell array is formed on a transparent substrate, and the display cell array includes a plurality of gate lines, a plurality of data lines and a plurality of switching elements. The switching elements respectively are coupled to each of the data lines and each of the gate lines. The data driver circuit is coupled with the data lines and provides the data lines with image signals. The gate driver circuit is coupled with the gate lines and drives the switching elements. The gate driver circuit includes a plurality of stages and a dummy stage. The stages include odd numbered stages and even numbered stages. The odd numbered stages respectively receive a first clock and a first control signal. The first clock is prevented from being outputted from each of the odd numbered stages in response to the first control signal, and the even numbered stages respectively receive a second clock and a second control signal. The second clock is prevented from being outputted from each of the even numbered stages in response to the second control signal. The second clock has a first phase 180° different from a second phase of the first clock, and the stages respectively delay the first clock or the second clock by a first period to sequentially output the first clock and the second clock as a gate line driving signal. The dummy stage is coupled to a last stage and generates a dummy output signal. The gate line driving signal of the last stage falls below a first predetermined voltage level in response to the dummy output signal of the dummy stage, and the dummy output signal is delayed by a second period and falling below a second predetermined voltage level in response to a control signal of the last stage.

In still another aspect of the present invention, there is provided a method of driving a plurality of scan lines by providing a display panel with a plurality of scan line driving signals. A scan start signal is received so as to generate a first scan line driving signal, and a first voltage level of the first scan line driving signal is lowered so as to inactivate a first scan line in response to a second scan line driving signal. A (N−1)th scan line driving signal is received so as to generate a Nth scan line driving signal, and a second voltage level of the Nth scan line driving signal is lowered so as to inactivate a Nth scan line in response to an (N+1)th scan line driving signal. N is a natural number more than 2. A Mth scan line driving signal is generated in response to a (M−1)th scan line driving signal, and M is the integer greater than N and has a same number as a number of the scan lines. A control signal is generated in response to the Mth scan line driving signal, and a third voltage level of the Mth scan line driving signal is lowered so as to inactivate a Mth scan line. A fourth voltage level of the control signal is lowered after a predetermined period of delay in response to the control signal.

In still another aspect of the present invention, there is provided a method of driving a plurality of scan lines by providing a display panel with a plurality of scan line driving signals. A scan start signal is received so as to generate a first scan line driving signal, and a first voltage level of the first scan line driving signal is lowered so as to inactivate a first scan line in response to a second scan line driving signal. A (N−1)th scan line driving signal is received so as to generate a Nth scan line driving signal, and a second voltage level of the Nth scan line driving signal is lowered so as to inactivate a Nth scan line in response to an (N+1)th scan line driving signal. N is a natural number more than 2. A Mth scan line driving signal is generated in response to a (M−1)th scan line driving signal, and M is the integer greater than N and has a same number as a number of the scan lines. A dummy output signal is generated in response to the Mth scan line driving signal, and a third voltage level of the Mth scan line driving signal is lowered so as to inactivate a Mth scan line. The Mth scan line driving signal has a first voltage level. A fourth voltage level of the dummy output signal is lowered in response to a control signal, and the control signal has substantially the first voltage level.

In still another aspect of the present invention, there is provided a shift register including odd numbered stages and even numbered stages. The odd numbered stages respectively receive a first clock, and the even numbered stages respectively receive a second clock having a first phase 180° different from a second phase of the first clock. The shift register includes a first stage, an Nth stage (N is an integer greater than or equal to 2), a last stage, a first dummy stage and a second dummy stage. The first stage performs a forward shift from the first stage to a last stage when a first selection signal has a first voltage level and performs a backward shift from the last stage to the first stage when a second selection signal has the first voltage level. The Nth stage performs the forward shift from the first stage to the last stage when the first selection signal has the first voltage level and performs the backward shift from the last stage to the first stage when the second selection signal has the first voltage level. The last stage performs the forward shift from the first stage to the last stage when the first selection signal has the first voltage level and performs the backward shift from the last stage to the first stage when the second selection signal has the first voltage level. The first dummy stage inactivates (or reset) the last stage during the forward shift. A second dummy stage inactivates the first stage during the backward shift.

In still another aspect of the present invention, there is provided a shift register including odd numbered stages and even numbered stages. The odd numbered stages respectively receive a first clock, and the even numbered stages respectively receive a second clock having a first phase 180° different from a second phase of the first clock. The stages of the shifter register are sequentially shifted in synchronization with the first and second clock signals in a forward direction and in a backward direction. The shift register including a first stage, an Nth stage (N is an integer greater than or equal to 2), a last stage, a first dummy stage and a second dummy stage. The first stage receives a scan start signal, generates a first scan line driving signal when a first selection signal has a first voltage level, and lowers a second voltage level of the first scan line driving signal in response to a second scan line driving signal generated from a second stage. The first stage generates the first scan line driving signal in response to the second scan line driving signal when a second selection signal has the first voltage level, and lowers the second voltage level of the first scan line driving signal in response to a second dummy output signal. The Nth stage generates a Nth scan line driving signal in response to a (N−1)th scan line driving signal outputted from a (N−1)th stage when the first selection signal has the first voltage level, and lowers a third voltage level of the Nth scan line driving signal in response to an (N+1)th scan line driving signal outputted from an (N+1)th stage. The Nth stage generates the Nth scan line driving signal in response to the (N+1)th scan line driving signal when the second selection signal has the first voltage level, and lowers the third voltage level of the Nth scan line driving signal in response to the (N−1)th scan line driving signal. N is an integer greater than 2. A Mth stage generates a Mth scan line driving signal in response to a (M−1)th scan line driving signal outputted from a (M−1)th stage when the first selection signal has the first voltage level, and lowers a fourth voltage level of the Mth scan line driving signal in response to a first dummy output signal. The Mth stage generates the Mth scan line driving signal in response to the scan start signal when the second selection signal has the first voltage level, and lowers the fourth voltage level of the Mth scan line driving signal in response to the (M−1)th scan line driving signal. M is the integer greater than N. A first dummy stage receives the first clock signal and the Mth scan line driving signal to generate the first dummy output signal, and the first dummy stage lowers a fifth voltage level of the first dummy output signal in response to the scan start signal. The second dummy stage receives the second clock signal and the first scan line driving signal to generate the second dummy output signal, and the second dummy stage lowers a sixth voltage level of the second dummy output signal in response to the scan start signal.

In still another aspect of the present invention, there is provided a liquid crystal display device including a display cell array, a data driver circuit and a gate driver circuit. The display cell array is formed on a transparent substrate. The display cell array includes a plurality of gate lines, a plurality of data lines and a plurality of switching elements. The switching elements respectively are coupled to each of the data lines and each of the gate lines. The data driver circuit is coupled with the data lines and provides the data lines with image signals. A gate driver circuit includes odd numbered stages and even numbered stages. The odd numbered stages respectively receive a first clock, and the even numbered stages respectively receive a second clock having a first phase 180° different from a second phase of the first clock. The gate driver circuit includes a first stage, an Nth stage (N is an integer greater than or equal to 2), a last stage, a first dummy stage and a second dummy stage. The first stage performs a forward shift from the first stage to a last stage when a first selection signal has a first voltage level and performs a backward shift from the last stage to the first stage when a second selection signal has the first voltage level. The Nth stage performs the forward shift from the first stage to the last stage when the first selection signal has the first voltage level and performs the backward shift from the last stage to the first stage when the second selection signal has the first voltage level. The last stage performs the forward shift from the first stage to the last stage when the first selection signal has the first voltage level and performs the backward shift from the last stage to the first stage when the second selection signal has the first voltage level. The first dummy stage inactivates the last stage during the forward shift, and the second dummy stage inactivates the first stage during the backward shift.

In still another aspect of the present invention, there is provided a liquid crystal display device including a display cell array, a data driver circuit and a gate driver circuit. The display cell array is formed on a transparent substrate. The display cell array includes a plurality of gate lines, a plurality of data lines and a plurality of switching elements. The switching elements respectively are coupled to each of the data lines and each of the gate lines. The data driver circuit is coupled with the data lines and provides the data lines with image signals. The gate driver circuit includes odd numbered stages and even numbered stages. The odd numbered stages respectively receive a first clock, and the even numbered stages respectively receive a second clock having a first phase 180° different from a second phase of the first clock. The stages of the shifter register are sequentially shifted in synchronization with the first and second clock signals in a forward direction and in a backward direction. The gate driver circuit includes a first stage, an Nth stage (N is an integer greater than or equal to 2), an Mth stage (M is the integer greater than N), a last stage, a first dummy stage and a second dummy stage. The first stage receives a scan start signal to generate a first gate line driving signal when a first selection signal has a first voltage level and lowers a second voltage level of the first scan line driving signal in response to a second gate line driving signal generated from a second stage. The first stage generates the first gate line driving signal in response to the second gate line driving signal when a second selection signal has the first voltage level and lowers the second voltage level of the first gate line driving signal in response to a second dummy output signal. The Nth stage generates a Nth gate line driving signal in response to a (N−1)th gate line driving signal outputted from a (N−1)th stage when the first selection signal has the first voltage level and lowers a third voltage level of the Nth gate line driving signal in response to an (N+1)th gate line driving signal outputted from an (N+1)th stage. The Nth stage generates the Nth gate line driving signal in response to the (N+1)th gate line driving signal when the second selection signal has the first voltage level and lowers the third voltage level of the Nth gate line driving signal in response to the (N−1)th gate line driving signal.

The Mth stage generates a Mth gate line driving signal in response to a (M−1)th gate line driving signal outputted from a (M−1)th stage when the first selection signal has the first voltage level and lowers a fourth voltage level of the Mth gate line driving signal in response to a first dummy output signal. The Mth stage generates the Mth gate line driving signal in response to the scan start signal when the second selection signal has the first voltage level and lowers the fourth voltage level of the Mth gate line driving signal in response to the (M−1)th gate line driving signal. The first dummy stage receives the first clock signal and the Mth gate line driving signal to generate the first dummy output signal, and the first dummy stage lowers a fifth voltage level of the first dummy output signal in response to the scan start signal. The second dummy stage receives the second clock signal and the first gate line driving signal to generate the second dummy output signal. The second dummy stage lowers a sixth voltage level of the second dummy output signal in response to the scan start signal.

In still another aspect of the present invention, there is provided a liquid crystal display device including a first transparent substrate, a second transparent substrate facing the first transparent substrate, a liquid crystal layer interposed between the first and second transparent substrates, a display cell array, a gate driver circuit, a data driver circuit and a flexible printed circuit board. The display cell array is formed on the first transparent substrate. The display cell array includes a plurality of gate lines, a plurality of data lines and a plurality of first switching elements, and the first switching elements respectively are coupled to each of the data lines and each of the gate lines. The gate driver circuit is formed on the first transparent substrate and performs a bi-directional shift operation in which the gate lines are selected sequentially in a forward direction or in a backward direction. The gate driver circuit includes a plurality of stages, a first dummy stage and a second dummy stage. The first dummy stage lowers a first voltage level of a last gate line driving signal outputted from a last stage, and the second dummy stage lowers a second voltage level of a first gate line driving signal outputted from a first stage and inactivates the first dummy stage. The data driver circuit is formed on the first transparent substrate and provides the data lines an image signal. The date driver circuit includes a shift register and a plurality of data line blocks. The data line blocks respectively have a plurality of second switching elements, a first electrode of each of the second switching elements coupled to a data input terminal, second electrodes of the second switching elements coupled to respective data lines, third electrodes of the second switching elements commonly coupled to respective block selection terminals. The shift register has a plurality of data stages cascade-connected to each other, and a first data stage receives a scan start signal for initiating a selection of the data line blocks. The data stages outputs a block selection signal so as to sequentially select each of the data line blocks. The flexible printed circuit board provides the gate driver circuit and the data driver circuit with a control signal and the image signal, respectively. The flexible printed circuit includes a control integrated circuit and a data driver integrated circuit mounted thereon.

In still another aspect of the present invention, there is provided a method of driving a plurality of scan lines. The scan lines are sequentially selected in a forward shift from a first scan line to a last scan line or in a backward shift from the last scan line to the first scan line. In the forward shift, a first scan line driving signal is generated when a first selection signal has a first voltage level. In the backward shift, the first scan line driving signal is generated when a second selection signal has the first voltage level. In the forward shift, 2nd, 3rd, . . . , (N−1)th scan line driving signals are generated when the first selection signal has the first voltage level. In the backward shift, the 2nd, 3rd, . . . , (N−1)th scan line driving signals are generated when the second selection signal has the first voltage level, and N is an integer greater than 4. In the forward shift, an Nth scan line driving signal is generated when the first selection signal has the first voltage level. In the backward shift, the Nth scan line driving signal is generated when the second selection signal has the first voltage level. A first dummy output signal is generated during the forward shift to lower a second voltage level of the Nth scan line driving signal. A second dummy output signal is generated during the backward shift to lower a third voltage level of the first scan line driving signal.

In still another aspect of the present invention, there is provided a method of driving a plurality of scan lines. The scan lines are sequentially selected in a forward shift from a first scan line to a last scan line or in a backward shift from the last scan line to the first scan line. A first scan line driving signal is generated in response to a scan start signal, and a first voltage level of the first scan line driving signal is lowered in response to a second scan line driving signal so as to perform the forward shift when a first selection signal has a first level. The first scan line driving signal is generated in response to the second scan line driving signal, and the first voltage level of the first scan line driving signal is lowered in response to a second dummy output signal so as to perform the backward shift when a second selection signal has the first level. 2nd, 3rd, . . . , and (N−1)th scan line driving signals are generated in response to a previous scan line driving signal, and a second voltage level of each of the 2nd, 3rd, . . . , and (N−1)th scan line driving signals are lowered in response to a next scan line driving signal so as to perform the forward shift when the first selection signal has the first level. The 2nd, 3rd, . . . , and (N−1)th first scan line driving signals are generated in response to the next scan line driving signal, and the second voltage level of each of the 2nd, 3rd, . . . , and (N−1)th scan line driving signals are lowered in response to the previous scan line driving signal so as to perform the backward shift when the second selection signal has the first level, N being an integer greater than 4. A Nth scan line driving signal are generated in response to a (N−1)th scan line driving signal, and a third voltage level of the Nth scan line driving signal is lowered in response to the first dummy output signal so as to perform the forward shift when the first selection signal has the first level. The Nth scan line driving signal is generated in response to the scan start signal, and the third voltage level of the Nth scan line driving signal is lowered in response to the (N−1)th scan line driving signal so as to perform the backward shift when the second selection signal has the first level. The first dummy output signal is generated in response to the Nth scan line driving signal, and the third voltage level of the Nth scan line driving signal is lowered in response to the first dummy output signal during the forward shift. Then, a fourth voltage level of the first dummy output signal is lowered. The second dummy output signal is generated in response to the first scan line driving signal, and the first voltage level of the first scan line driving signal is lowered in response to the second dummy output signal during the backward shift. A fifth voltage level of the second dummy output signal is lowered.

As described above, according to the shift register of this invention, the shift register includes a plurality of stages and a dummy stage for resetting the last stage. the dummy stage is reset (or inactivated) by a control signal of the last stage or by the output signal of the dummy stage instead of the scan start signal. Since the output signal of the dummy stage does not exist during a display blanking period, the power consumption due to the output signal of the dummy stage may be reduced. In addition, since the dummy stage is reset not by the scan start signal, the layout area for gate driver circuit of the TFT LCD is reduced. In addition, the parasitic capacitance due to the scan start signal line may be reduced, the distortion of the signals may be reduced, and the power consumption of the first and second clocks due to the parasitic capacitance may be reduced.

Further, the shift register includes a plurality of stages and two dummy stages, and two selection signals for selecting shift direction is applied to each of the stages. The first and second clock signals ckv and ckvb may be alternately applied to the first and second clock terminals so as to change the shift direction. Accordingly, a bi-directional shift operation (forward or backward shift operation) may be performed without adding another circuits to the shift register.

BRIEF DESCRIPTION OF THE DRAWINGS

The above and other advantages of the present invention will become more apparent by describing in detail the preferred embodiments thereof with reference to the accompanying drawings, in which.

DESCRIPTION OF EMBODIMENTS

Hereinafter the preferred embodiment of the present invention will be described in detail with reference to-the accompanying drawings.

Figure 1:
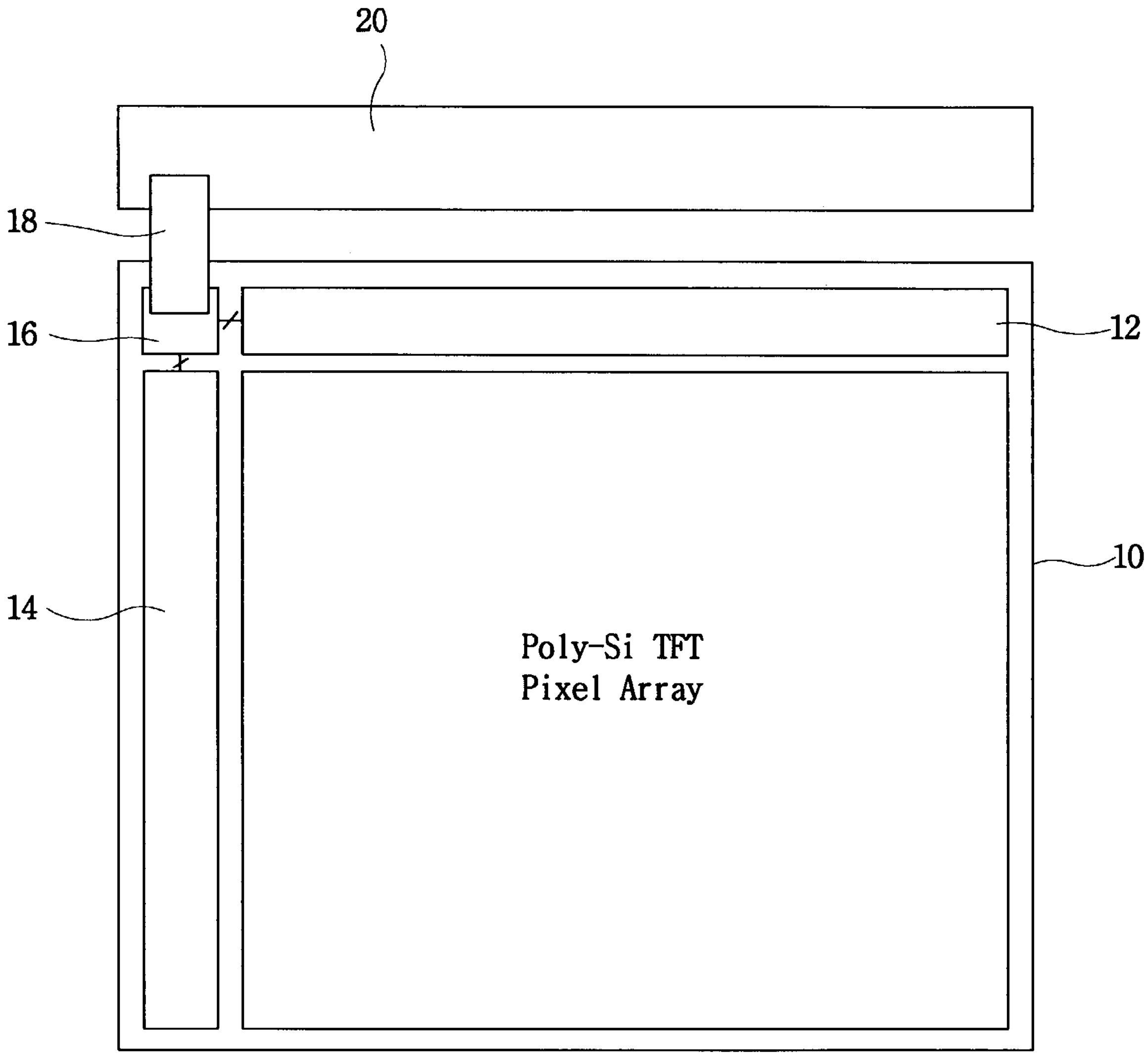
FIG. 1 is a schematic view showing a conventional poly-silicon thin film transistor LCD.
Figure 2:
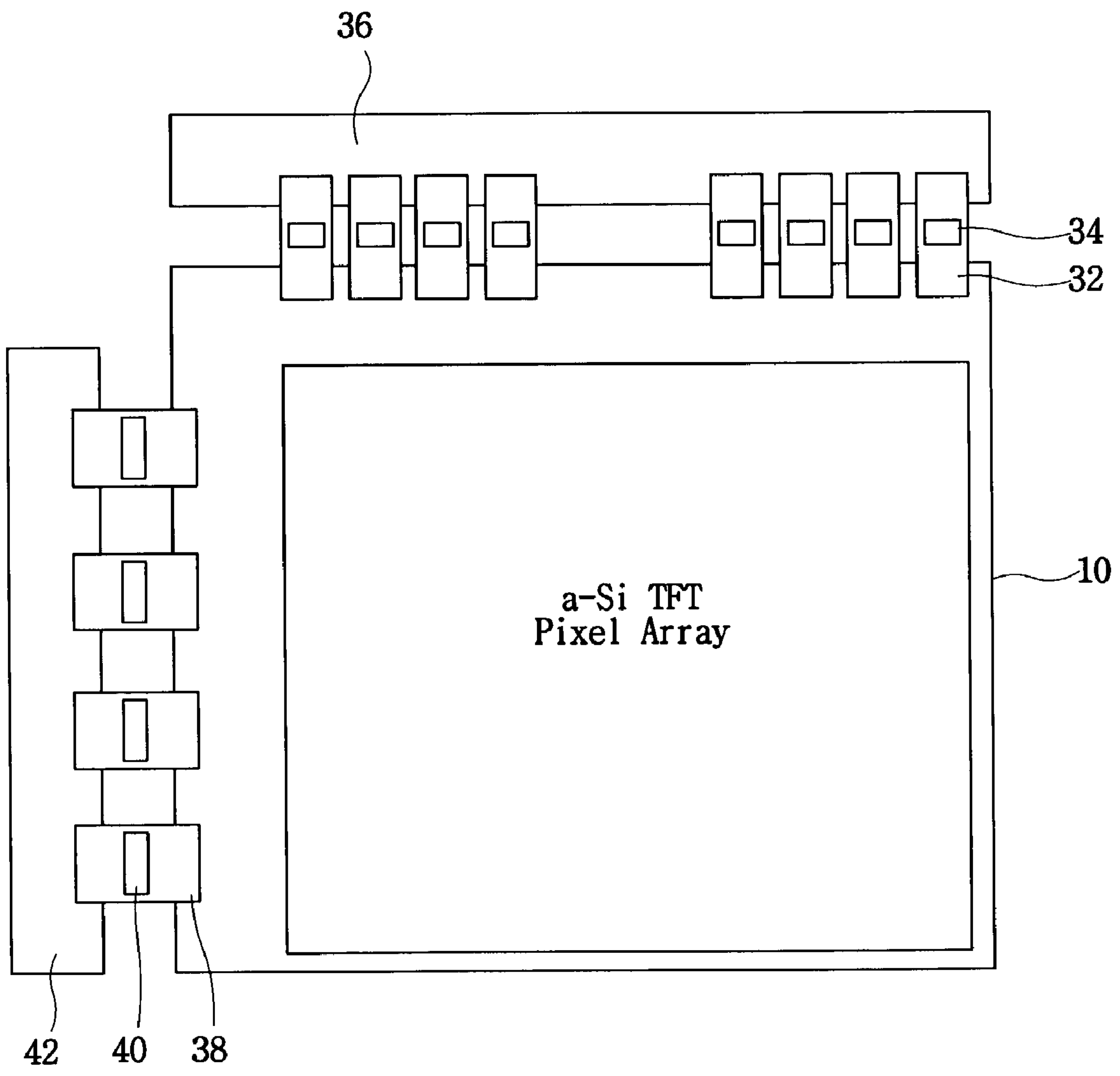
FIG. 2 is a schematic view showing a conventional a-Si thin film transistor LCD.
Figure 3:
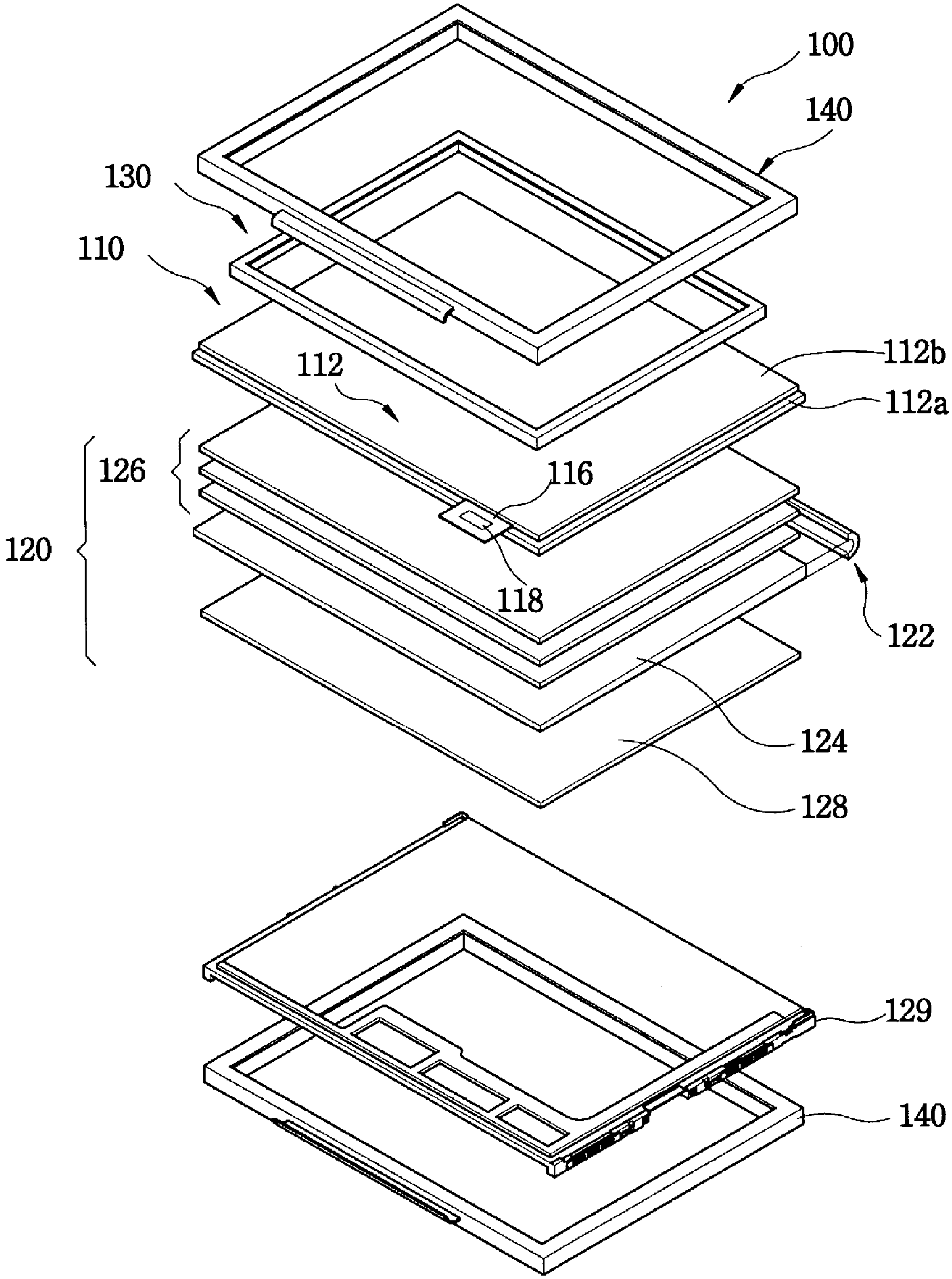
FIG. 3 is an exploded perspective view showing an a-Si thin film transistor LCD according to one exemplary embodiment of the present invention.

FIG. 3 is an exploded perspective view showing an a-Si thin film transistor LCD according to one exemplary embodiment of the present invention.

Referring to FIG. 3, the liquid crystal display device 100 includes a liquid crystal display panel assembly 110, a backlight assembly 120, a chassis 130 and a cover case 140.

The liquid crystal display panel assembly 110 includes a liquid crystal display panel 112, a flexible printed circuit board 116 and an integrated control chip 118. The liquid crystal display panel 112 includes a TFT substrate 112*a* and a color filter substrate 112*b*.

A display cell array, a data driver circuit, a gate driver circuit and external connection terminals are formed on the TFT substrate 112*a*. Color filters and transparent common electrodes are formed on the color filter substrate 112*b*. The color filter substrate 112*b* faces the TFT substrate 112*a*, and liquid crystal is filled between the color filter substrate 112*b* and the TFT substrate 112*a*.

The integrated control chip 118 is electrically connected to the thin film transistors formed on display cell array of the TFT substrate 112*a* through the flexible printed circuit 116. Data signal, data timing signal, gate timing signal and power voltage for driving the gate driver circuit is supplied to the data driver circuit and the gate driver circuit formed on the TFT substrate 112*a*. The display cell array includes a plurality of gate lines, a plurality of data lines and a plurality of switching elements, and the switching elements respectively is connected to each of the data lines and each of the gate lines. The gate driver circuit is connected with the gate lines, and drives the switching elements. The data driver circuit is connected with the data lines, and provides the data lines with image signals.

The backlight assembly 120 includes a lamp assembly 122, a light-guide plate 124, optical sheets 126, a reflection plate 128 and a mold frame 129.

Figure 4:
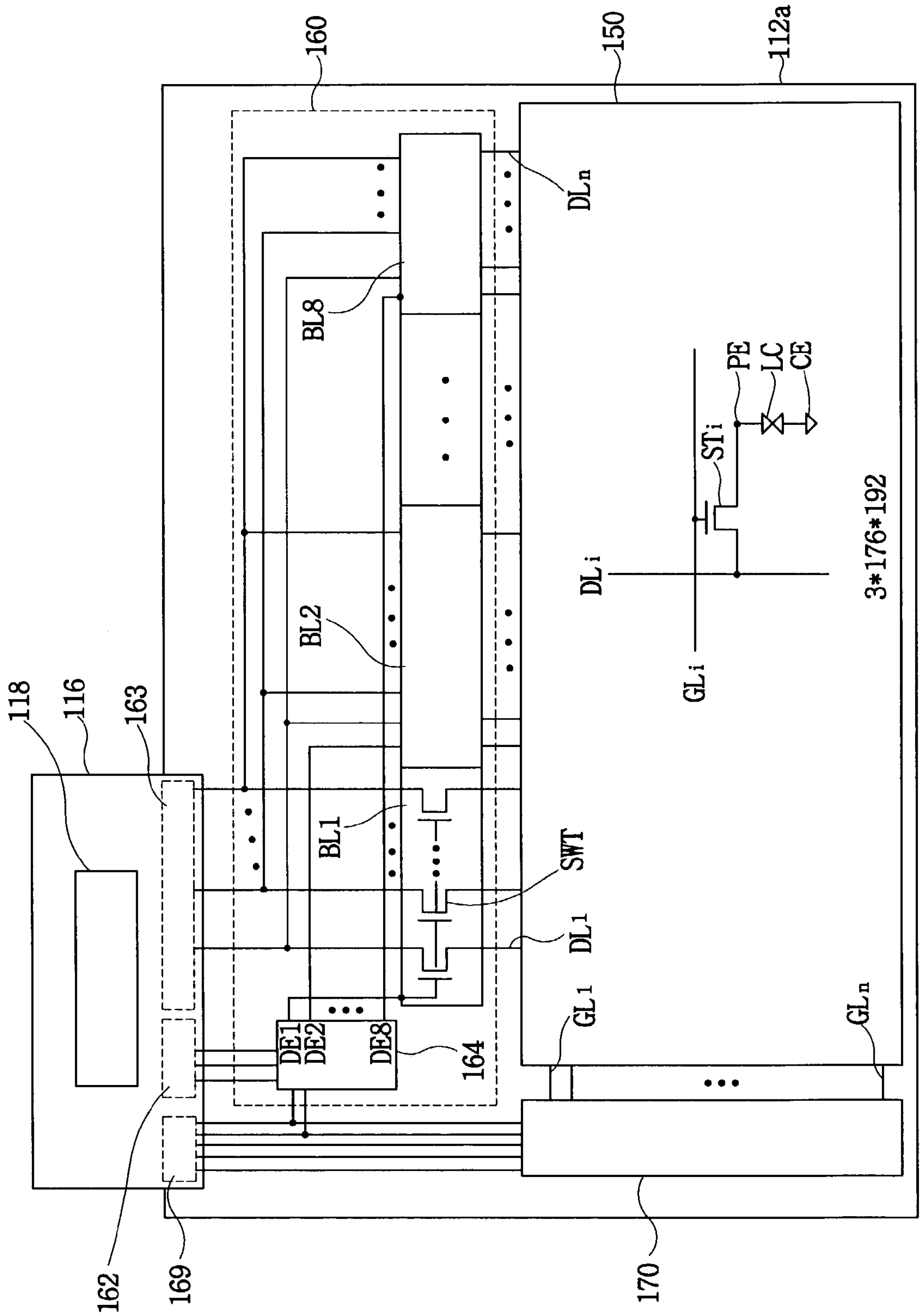
FIG. 4 is a schematic view showing an a-Si thin film transistor substrate of FIG. 3.

FIG. 4 is a schematic view showing an a-Si thin film transistor substrate of FIG. 3.

Referring to FIG. 4, a display cell array 150, a data driver circuit 160, a gate driver circuit 170 and an external connection terminals 162 and 163 for connecting the data driver circuit 160 to the integrated control chip 118 and another external connection terminal 169 for connecting the gate driver circuit 170 to the integrated control chip 118 are formed on the TFT substrate 112*a* in the same process in which the TFTs are formed on the TFT substrate 112*a*.

The display cell array 150 includes m data lines DL1, DL2, . . . , DLm and n gate lines GL1, GL2, . . . , GLn. The data lines DL1, DL2, . . . , DLm are extended in a column direction, and the gate lines GL1, GL2, . . . , GLn are extended in a row direction. For example, a liquid crystal display panel having 2-inch screen size is disclosed. The liquid crystal display panel has 176 data lines and 192 gate lines, to thereby provide a dot resolution 525 (176×3)×192.

Switching transistors (ST; or switching elements) are formed on an intersection between the data lines and the gate lines. A drain of the switching transistor STi is connected to a data line DLi, a gate of the switching transistor STi is connected to a gate line GLi, and a source of the switching transistor STi is connected to a pixel electrode PE. Liquid crystal LC is disposed between the pixel electrode PE and the common electrode CE. The common electrode CE is formed on the color filter substrate 112*b*.

Therefore, the voltage applied to the pixel electrode PE and the common electrode CE changes the alignment angle of the liquid crystal molecules, the amount of the light that passing through the liquid crystal molecules are regulated, and an image may be displayed.

The data driver circuit 160 includes a shift register 164 and 528 switching transistors (SWTs). Each of 8 data line blocks BL1, BL2, . . . , BL8 includes 66 switching transistors (SWTs).

66 input terminals of each of the data line blocks are commonly connected to the external connection terminal 163, and 66 output terminals are connected to the 66 corresponding data lines, respectively. The external connection terminal 163 has 66 data input terminals. A block selection terminal is connected to an output terminal of the shift register 164.

Sources of the 528 switching transistors (SWTs) are connected to the corresponding data lines, drains of the 528 switching transistors (SWTs) are connected to the corresponding data input terminals, respectively, and the gates of the 528 switching transistors (SWTs) are connected to the block selection terminal. Each of the 528 switching transistors (SWTs) is a-Si TFT MOS transistor.

Accordingly, 66 data lines of the 528 data lines are divided into 8 blocks, and 8 block selection signals may sequentially select each of the blocks.

The shift register 164 receives a first clock CKH, a second clock CKHB and a block selection start signal STH through the external connection terminal 162 having three terminals. Each of the output terminals of the shift register 164 is connected to the block selection terminal of the corresponding data line block.

Figure 5:
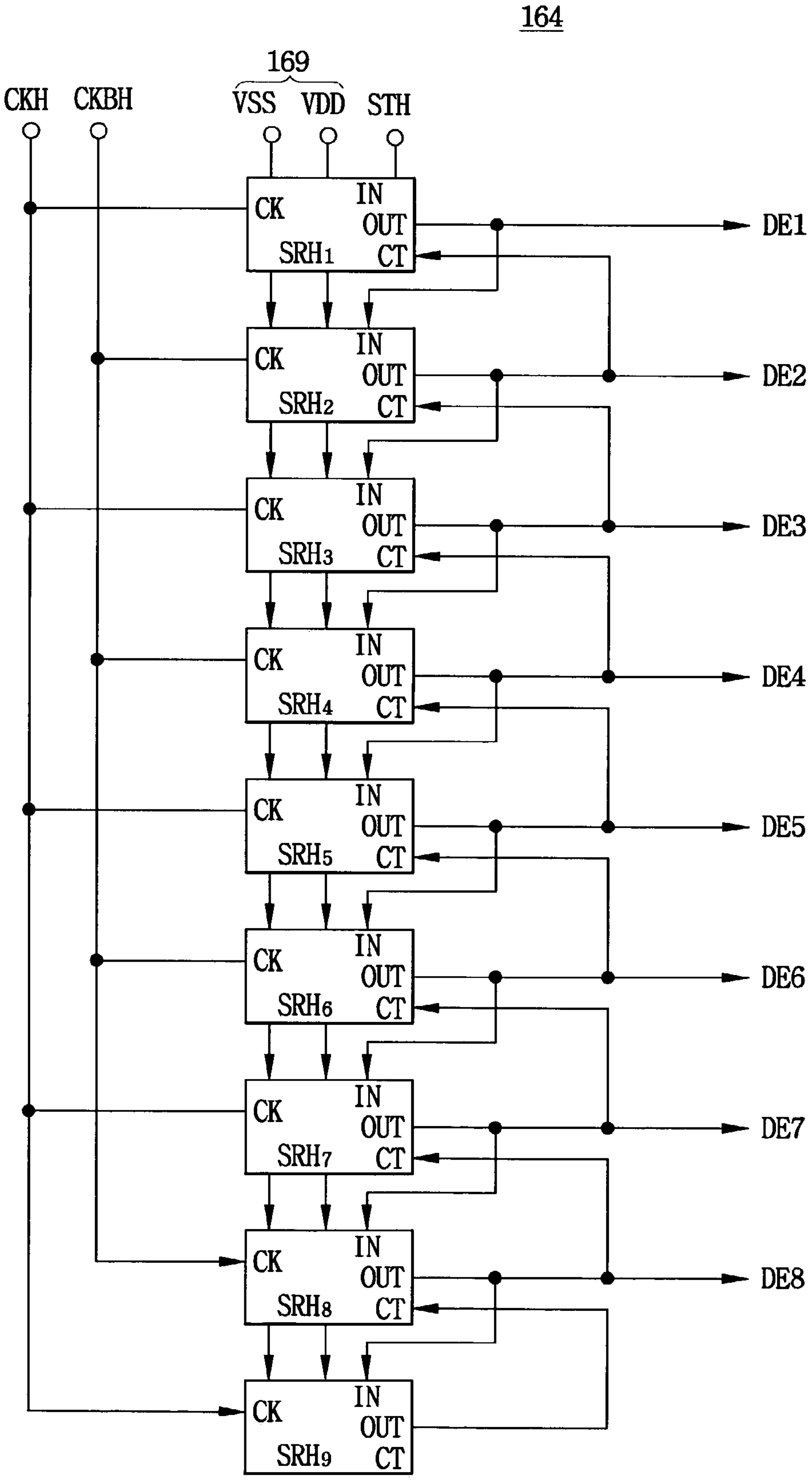
FIG. 5 is a block diagram showing a data driver circuit of FIG. 4.

FIG. 5 is a block diagram showing a data driver circuit of FIG. 4.

Referring to FIG. 5, the shift register 164 according to the present invention includes, for example, 9 stages $SRH_1$, $SRH_2$, . . . , $SRH_9$ that are cascade-connected with each other. An output terminal OUT of each of the stages is connected to the input terminal IN of a next stage. The stages includes 8 stages $SRH_1$, $SRH_2$, . . . , $SRH_8$ and a dummy stage ($SRC_9$). The 8 stages $SRH_1$, $SRH_2$, . . . , $SRH_8$ correspond to the 8 data line blocks. Each of the stages includes an input terminal IN, an output terminal OUT, a control terminal CT, a clock terminal CK, a first power voltage terminal VSS and a second power voltage terminal VDD. The 8 stages $SRH_1$, $SRH_2$, . . . , $SRH_8$ provide the block selection terminal of each of the data line blocks BL1, BL2, . . . , BL8 with the block selection start signals DE1, DE2, . . . , DE8, respectively. The block selection start signals DE1, DE2, . . . , DE8 is an enable signal for selecting each of the data line blocks.

The first clock CKH is applied to odd numbered stages $SRH_1$, $SRH_3$, $SRH_5$, $SRH_7$, and $SRH_9$, and the second clock CKHB is applied to even numbered stages $SRH_2$, $SRH_4$, $SRH_6$, $SRH_8$. The first clock CKH has a phase 180° different from that of the second clock CKHB. For example, the duty period of the first clock CKH and the second clock CKHB is lower than 1/66 ms.

An output signal (or gate line driving signal) of the next stage is applied to a control terminal CT as a control signal.

The output signals of each of the stages have sequentially an active period (or a high level period), the data line block corresponding to the active period is selected.

The dummy stage $SRH_9$ provides the control terminal CT of a previous stage ($SRH_8$) with a control signal.

Figure 6:
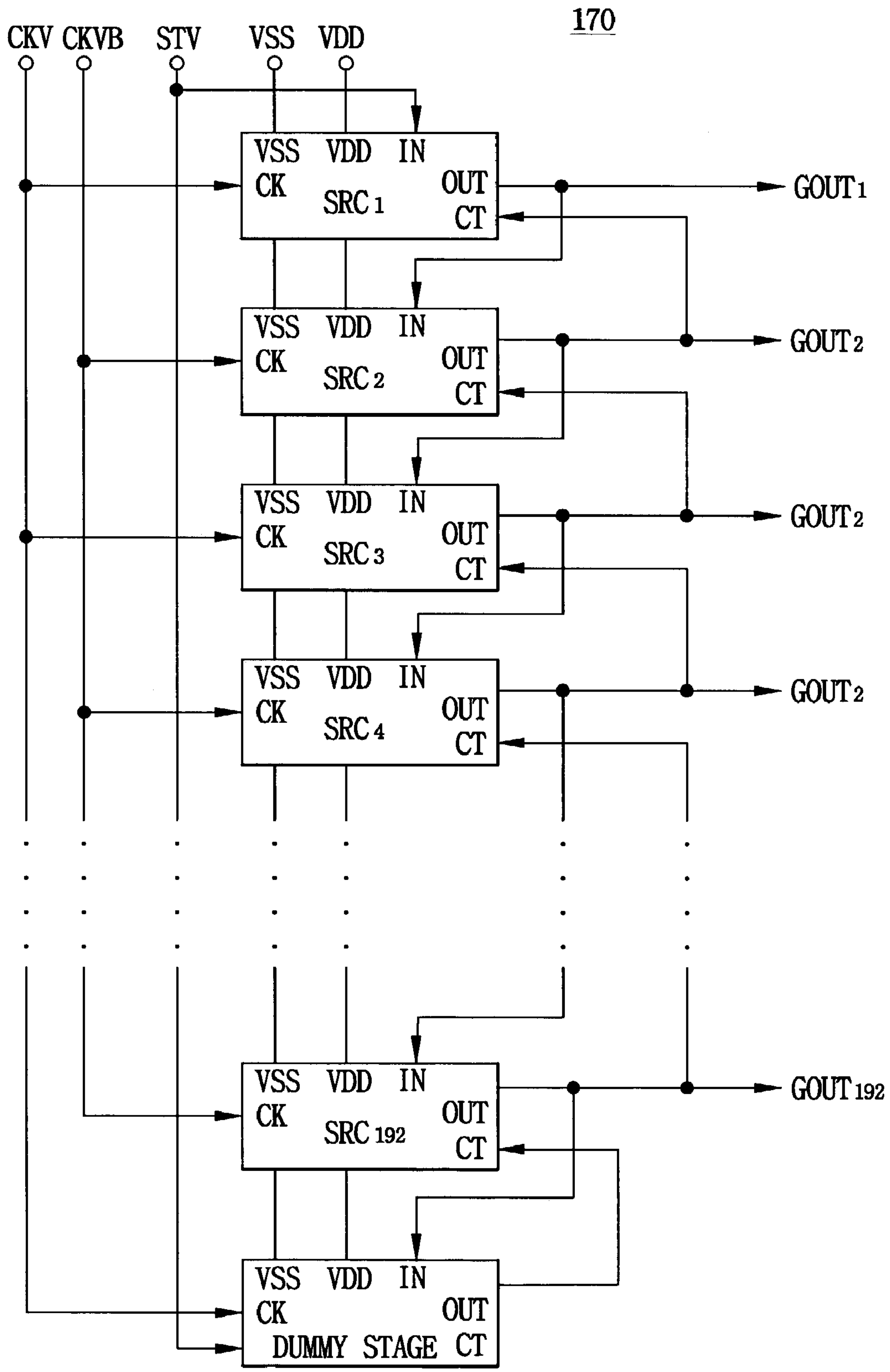
FIG. 6 is a block diagram showing an Nth stage in a shift register of the gate driver circuit of FIG. 4.

FIG. 6 is a block diagram showing an Nth stage in a shift register of the gate driver circuit of FIG. 4.

Referring to FIG. 6, the gate driver circuit 170 includes a shift register, and the shift register, a plurality of stages $SRC_1$, $SRC_2$, . . . , $SRC_{192}$ and a dummy stage that are cascade-connected with each other. An output terminal OUT of each of the stages is connected to an input terminal IN of a next stage. The stages includes 192 stages $SRC_1$, $SRC_2$, . . . , $SRC_{192}$ and a dummy stage.

Each of the stages includes an input terminal IN, an output terminal OUT, a control terminal CT, a clock signal input terminal CK, a first power voltage terminal VSS and a second power voltage terminal VDD.

The first stage $SRC_1$ and the dummy stage receive a scan start signal STV through the input terminal IN. The scan start signal STV is a pulse synchronized with a vertical synchronization signal Vsync. Each of the stages $SRC_1$, $SRC_2$, . . . , $SRC_{192}$ generates gate line driving signals $GOUT_1$, $GOUT_2$, . . . , $GOUT_{192}$, respectively, and the gate line driving signals $GOUT_1$, $GOUT_2$, . . . , $GOUT_{92}$ are connected to the gate lines, respectively, so as to select the gate lines.

A first clock ckv is applied to odd numbered stages ($SRC_1$, $SRC_3$, $SRC_5$, . . . ), and the second clock ckvb is applied to even numbered stages ($SRH_2$, $SRH_4$, $SRH_6$, . . . ). The first clock CKB has a phase 180° different from that of the second clock ckvb. For example, the duty period of the first clock ckv and the second clock ckvb is about 16.6/192 ms.

The duty period of the clock used in the shift register 164 of the data driver circuit is about 8 times larger than that of the clock used in the shift register 170 of the gate driver circuit.

Output signals $GOUT_1$, $GOUT_2$, . . . , $GOUT_{192}$ of the next stage $SRC_2$, $SRC_3$, $SRC_4$ is applied to control terminals CT of the stages $SRC_1$, $SRC_2$, $SRC_3$, respectively, as a control signal.

The output signals of each of the stages have sequentially an active period (or a high level period), the gate line corresponding to the active period is selected.

The dummy stage resets (or inactivates) the last stage ($SRH_{192}$). Specifically, the dummy stage lowers a voltage level of the output signal of the last stage ($SRH_{192}$) from a high voltage level (HIGH) to a low voltage level (LOW).

Figure 7:
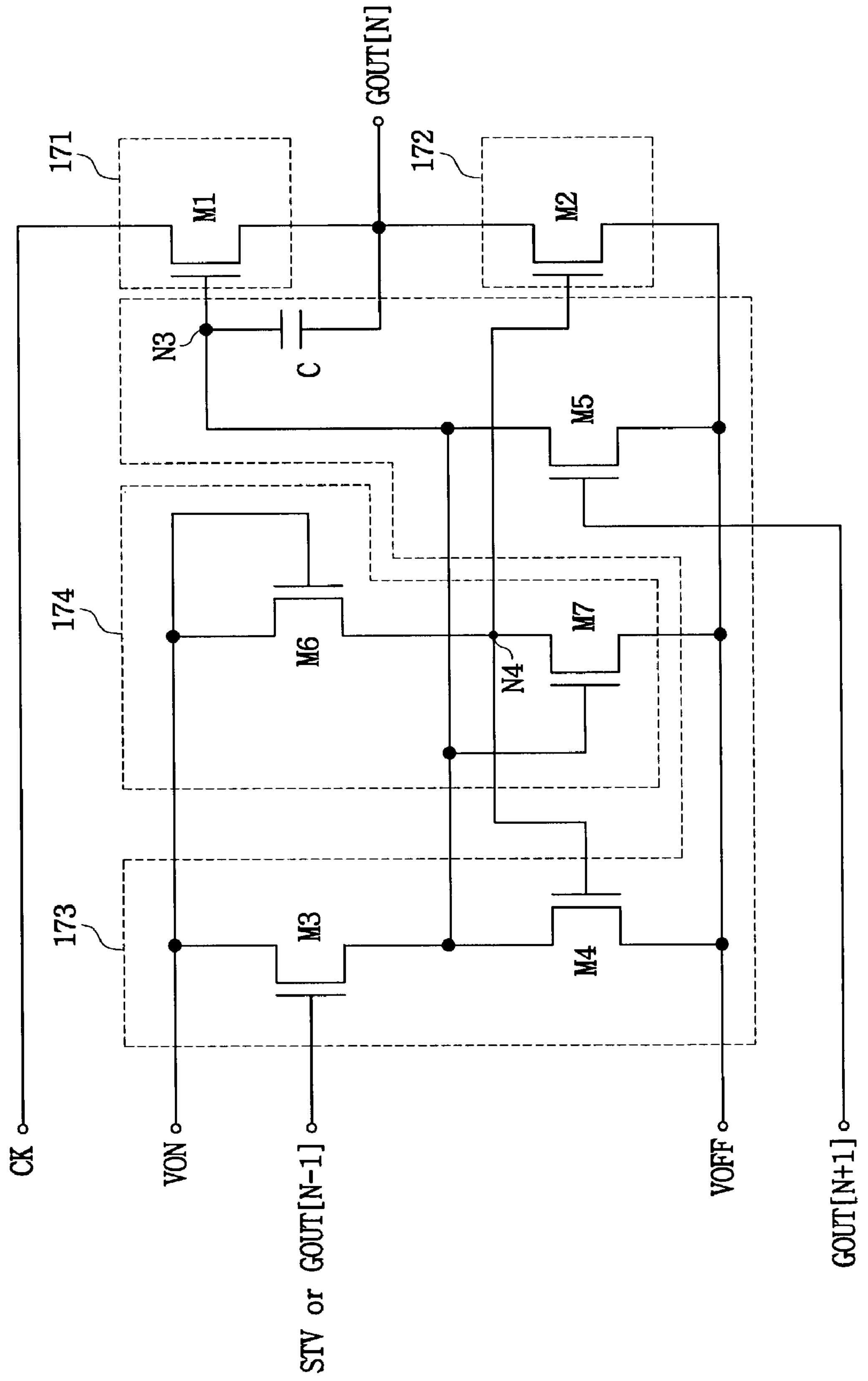
FIG. 7 is a circuit diagram showing a stage of the shift register of FIG. 6.
Figure 8:
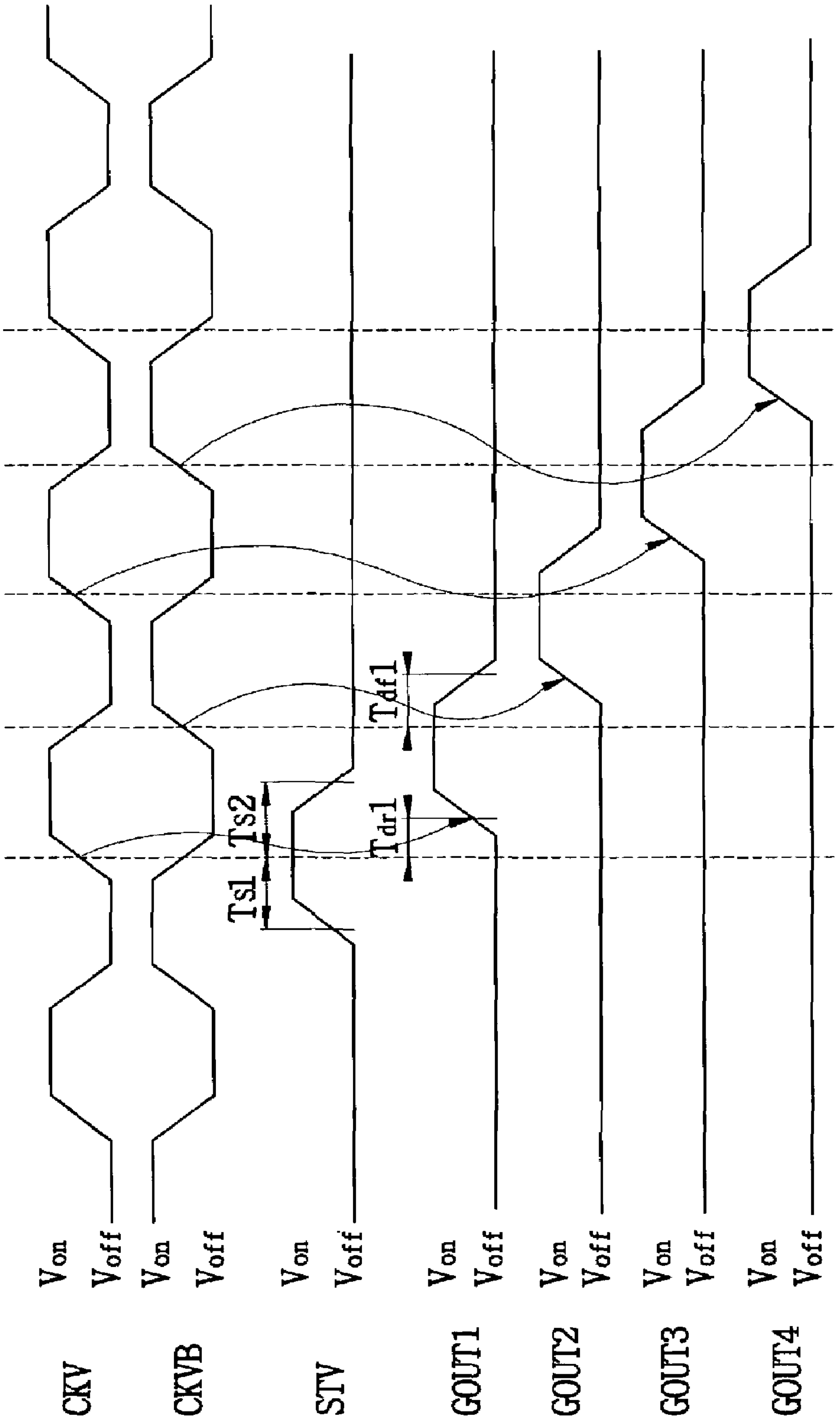
FIG. 8 is a graph showing scan line driving signals outputted from the stage of FIG. 7.

FIG. 7 is a circuit diagram showing a stage of the shift register of FIG. 6, and FIG. 8 is a graph showing scan line driving signals outputted from the stage of FIG. 7.

Referring to FIG. 7, each of the stages of the shift resister 170 includes a pull-up part 171, a pull-down part 172, a pull-up driver part 173 and a pull-down driver part 174.

The pull-up part 171 includes a first NMOS transistor Ml of which a drain is connected to a clock signal input terminal CK, a gate is connected to a third node N3 and a source is connected to an output terminal GOUT[N].

The pull-down part 172 includes a second NMOS transistor M2 of which a drain is connected to an output terminal OUT, a gate is connected to a fourth node N4 and a source is connected to a first power voltage terminal VSS.

The pull-up driver part 173 includes a capacitor C and NMOS transistors M3, M4 and M5. The capacitor C is connected between the third node N3 and the output terminal GOUT[N]. The third NMOS Transistor M3 has a drain connected to a second power voltage VON, a gate connected to an output terminal GOUT[N−1 ] of a previous stage, and a source connected to the third node N3. Transistor M4 has a drain connected to the third node N3, a gate connected to the fourth node N4 and a source connected to the first power voltage VOFF. Transistor M5 has a drain connected to the third node N3, a gate connected to the fourth node N4 and a source connected to the first power voltage VOFF. Transistor M3 has a transistor size about two times larger than that of transistor M5.

The pull-down driver part 174 includes two NMOS transistors M6 and M7. Transistor M6 has a drain and a gate commonly connected with each other to be connected to the second power voltage VON, a source connected to the fourth node N4. Transistor M7 has a drain connected to the fourth node N4, a gate connected to the third node N3 and a source connected to the first power voltage VOFF. Transistor M6 has a transistor size about sixteen times larger than that of transistor M7.

As shown in FIG. 8, when first and second clock signals ckv and ckvb and scan start signal STV are supplied to the shift register 170, the first stage SRC1 delays a high level period of the first clock signal ckv in response to the front (leading) edge of the scan start signal STV for a predetermined time of Tdr1, to thereby output a delayed output signal GOUT1.

As described above, the shift register formed on the glass substrate receives the scan start signal STV, the first clock ckv and the second clock ckvb, and drives the gates of the TFTs formed on the TFT substrate.

Hereinafter, the operation of each of the stages of the shift register is described.

Figure 9:
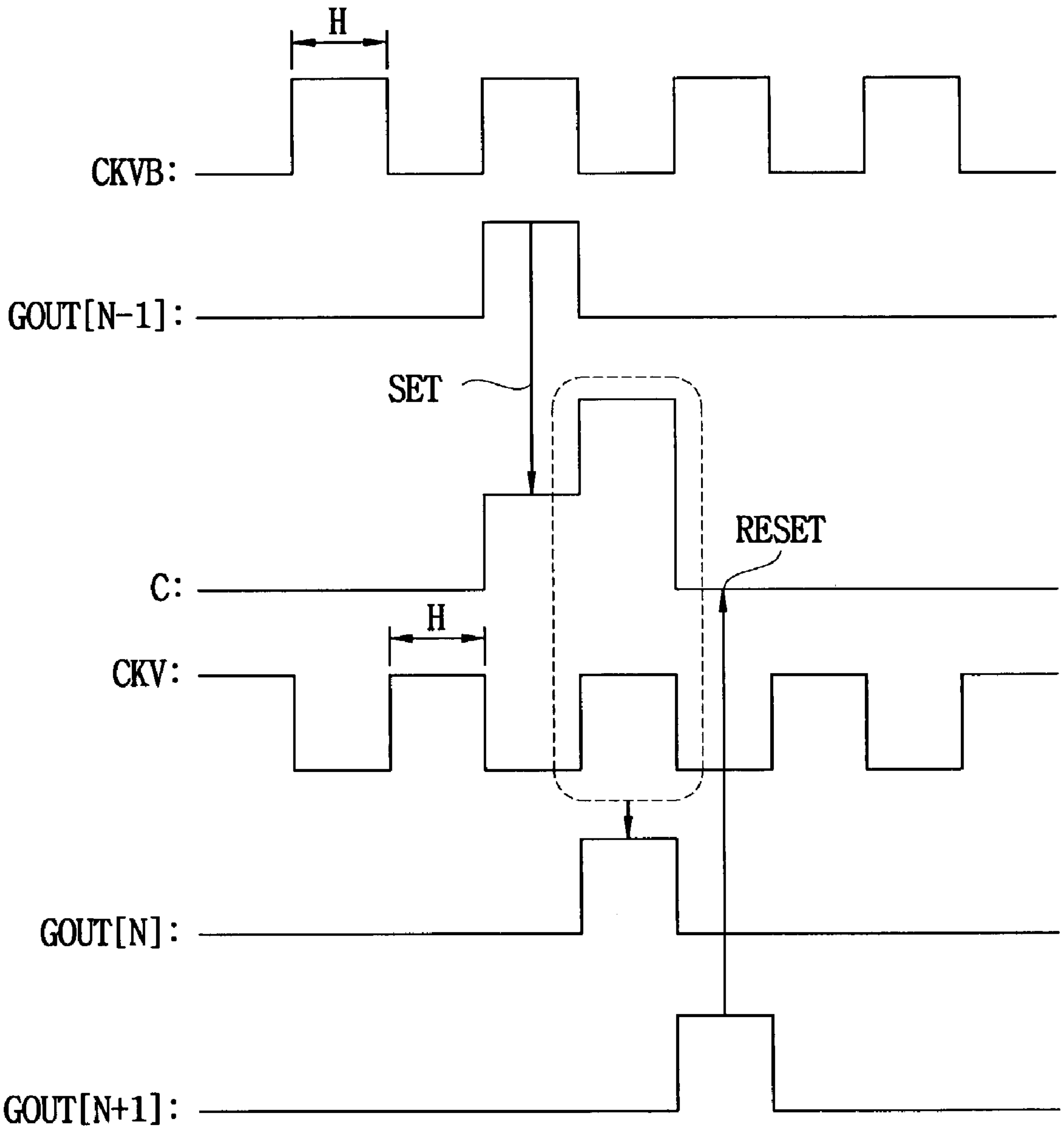
FIG. 9 is a graph showing the scan line driving signals outputted from the shift register of FIG. 6.

FIG. 9 is a graph showing the scan line driving signals outputted from the shift register of FIG. 6.

Referring to FIG. 9, the shift register receives a first clock signal ckv or a second clock signal ckvb and sequentially provides a plurality of gate lines with a plurality of gate line driving signal ($GOUT_1$, $GOUT_2$, $GOUT_3$, . . . ). The second clock ckvb has a phase 180° different from the phase of the first clock ckv. The first and second clock signals swings in a period of 2H, as shown in FIG. 9. A signal outputted from a timing controller (not shown) has a voltage in a range from 0 volt to 3 volts and is amplified to have a voltage in a range from −8 volts to 24 volts, so that the first and second clock signals is acquired.

Referring again to FIG. 7, the output signal (or gate line driving signal) $GOUT_{N-1}$ of the previous stage charges the capacitor C and set (or activate) the present stage. The output signal (or gate line driving signal) $GOUT_{N+1}$ of the next stage discharges the capacitor C and reset (or inactivate) the present stage.

When the first clock signal ckv, the second clock signals ckvb and the scan start signal STV are applied to the first stage, a high level period of the first clock signal ckv is delayed by a predetermined period in response to an rising edge of the scan start signal STV to be outputted at the output terminal as an output signal GOUT[1].

The capacitor C begins to be charged in response to the rising edge of the scan start signal STV that is inputted into the gate of the transistor M1 through the input terminal IN. When the voltage Vc1 charged at the capacitor C is larger than the threshold voltage of the transistor M1, the pull-up transistor M1 is turned on, and the high level period of the first clock signal ckv is outputted at the output terminal OUT.

When the high level period of the first clock signal CKV is outputted at the output terminal OUT, this output voltage, or the high level period of the first clock signal ckv, is bootstrapped at the capacitor C and thereby the gate voltage of the pull-up transistor M1 rises over the turn-on voltage Von. Accordingly, the NMOS pull-up transistor M1 maintains a full turn-on state. The transistor M2 is turned on even when the transistor M4 is turned on by the scan start signal STV since a transistor size of the transistor M3 is about 2 times larger than that of the transistor M4.

Meanwhile, the voltage of the third node N3 rises to the second power voltage Von by the transistor M6 before the scan start signal STV is inputted into the pull-down driver part 174, and the transistor M2 is turned on. Accordingly, the output signal of the output terminal OUT has substantially the first power voltage Voff. When the scan start signal STV is inputted to the pull-down driver part 174, the transistor is turned on, and the voltage of the fourth node N4 is dropped to substantially the first power voltage Voff. Since the transistor size of the transistor M7 is about 16 times larger than that of the transistor M6, the fourth node N4 maintains substantially the first power voltage Voff even though the transistor M6 is turned on. Accordingly, the pull-down transistor M2 is turned off.

When the scan start signal STV is applied to the pull-down driver part 74, the pull-down transistor M2 is turned off, and the first clock signal ckv is delayed by a duty period of the first clock signal ckv to be outputted at the output terminal.

When the voltage of the output signal outputted fro the output terminal OUT is dropped to a turn-off voltage Voff (or Vss), the transistor M7 is turned off. Since only the second power voltage Von is provided to the fourth node N4 through the transistor M6, the voltage of the fourth node N4 begins to rise from a first power voltage Voff to a second power voltage Von. When the voltage of the fourth node begins to rise, the transistor M4 is turned on, and the charges at the capacitor are discharged through the transistor M4. Therefore, the pull-up transistor Ml begins to be turned off.

Then, since the output signal GOUT[N+1] outputted from the next stage rises to the turn-on voltage Von, the transistor M5 is turned on. Since the transistor size of the transistor M5 is about 2 times larger than that of the transistor M4, the voltage of the third node N3 is dropped to the first power voltage Voff more rapidly compared with the case in which only the transistor M4 is turned on.

In addition, when the voltage of the fourth node N4 rises to the second power voltage Von, the pull-down transistor M2 is turned on, and the output voltage outputted from the output terminal OUT is changed from the turn-on voltage Von to the turn-off voltage Voff.

Since the fourth node N4 is connected to the transistor M6, the fourth node N4 maintains the second power voltage Von even though the output signal GOUT[N+1] of the next stage that is applied to the control terminal CT is dropped to a low voltage level and the transistor M5 is turned off. Accordingly, the malfunction due to the turn-off of the pull-down transistor M2 is prevented.

As shown in FIG. 8, the output signals GOUT[1], GOUT[2], GOUT[3], GOUT[4], . . . are sequentially generated.

As described above, the capacitor C is charged in response to the output signal of the previous stage, the clock signal applied to the pull-up part or pull-down part is outputted as an output signal of the present stage. When the output signal of the next stage is generated at the gate line connected to the output terminal of the next stage, the output signal of the next stage turns on the discharge transistor M5 and discharges the capacitor C, to thereby terminate an operation cycle of the shift register.

According to above described shift register, since the present stage is reset by the output signal of the next stage, the shift register requires at least one dummy stage for resetting the last stage. However, the dummy stage should be also reset.

Figure 10:
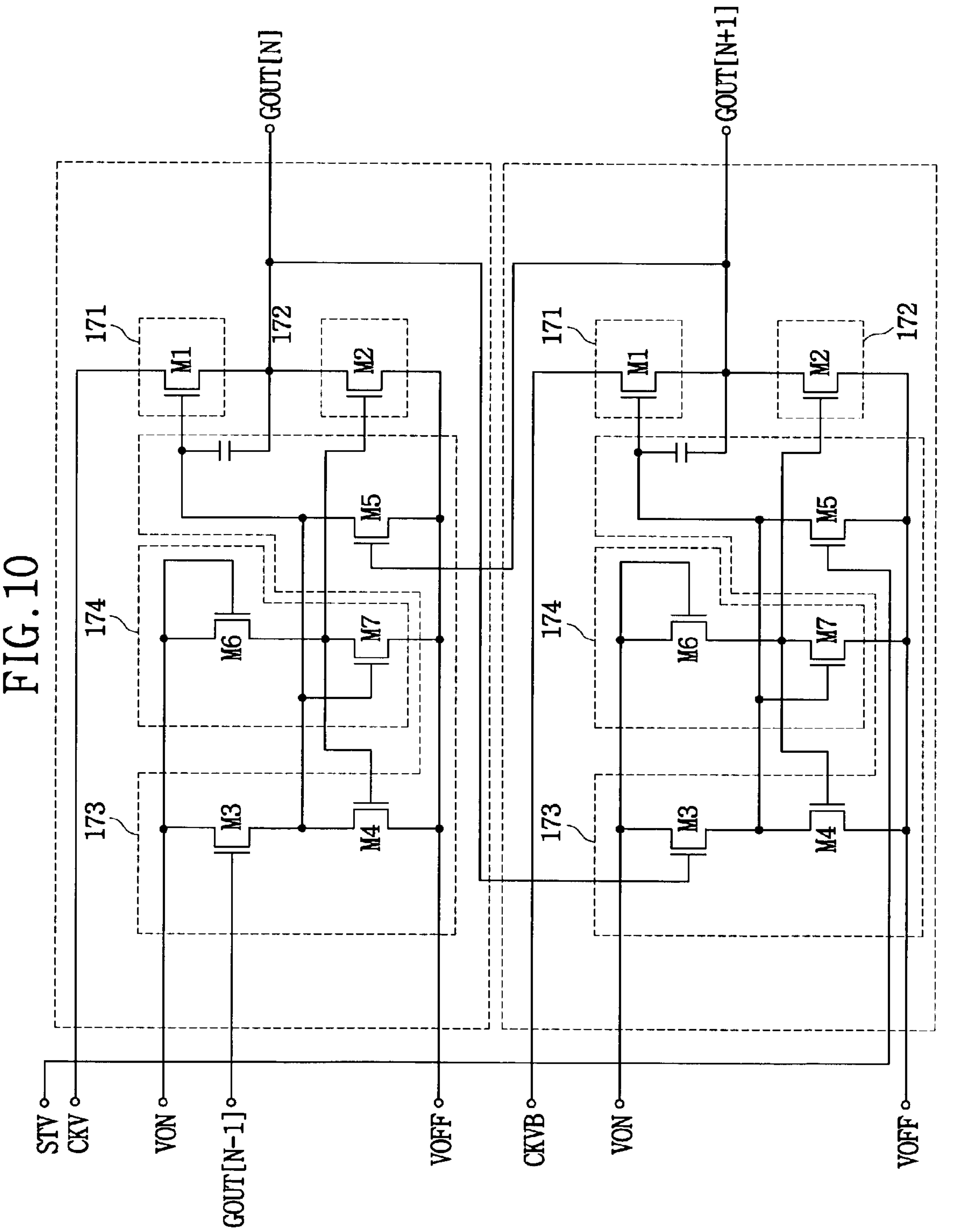
FIG. 10 is a circuit diagram showing an Nth stage and an (N+1)th stage in the shift register of FIG. 7.

As shown in FIG. 10, the scan start signal STV may be connected to the discharge transistor M5 of the dummy stage so as to reset the dummy stage.

FIG. 10 is a circuit diagram showing an Nth stage and an (N+1)th stage in the shift register of FIG. 7, and especially shows the connection between the last stage and the dummy stage.

As shown in FIG. 10, the discharge transistor M5 for discharging the capacitor C is discharged by the scan start signal STV, or the dummy stage is reset by the scan start signal STV.

Figure 11:
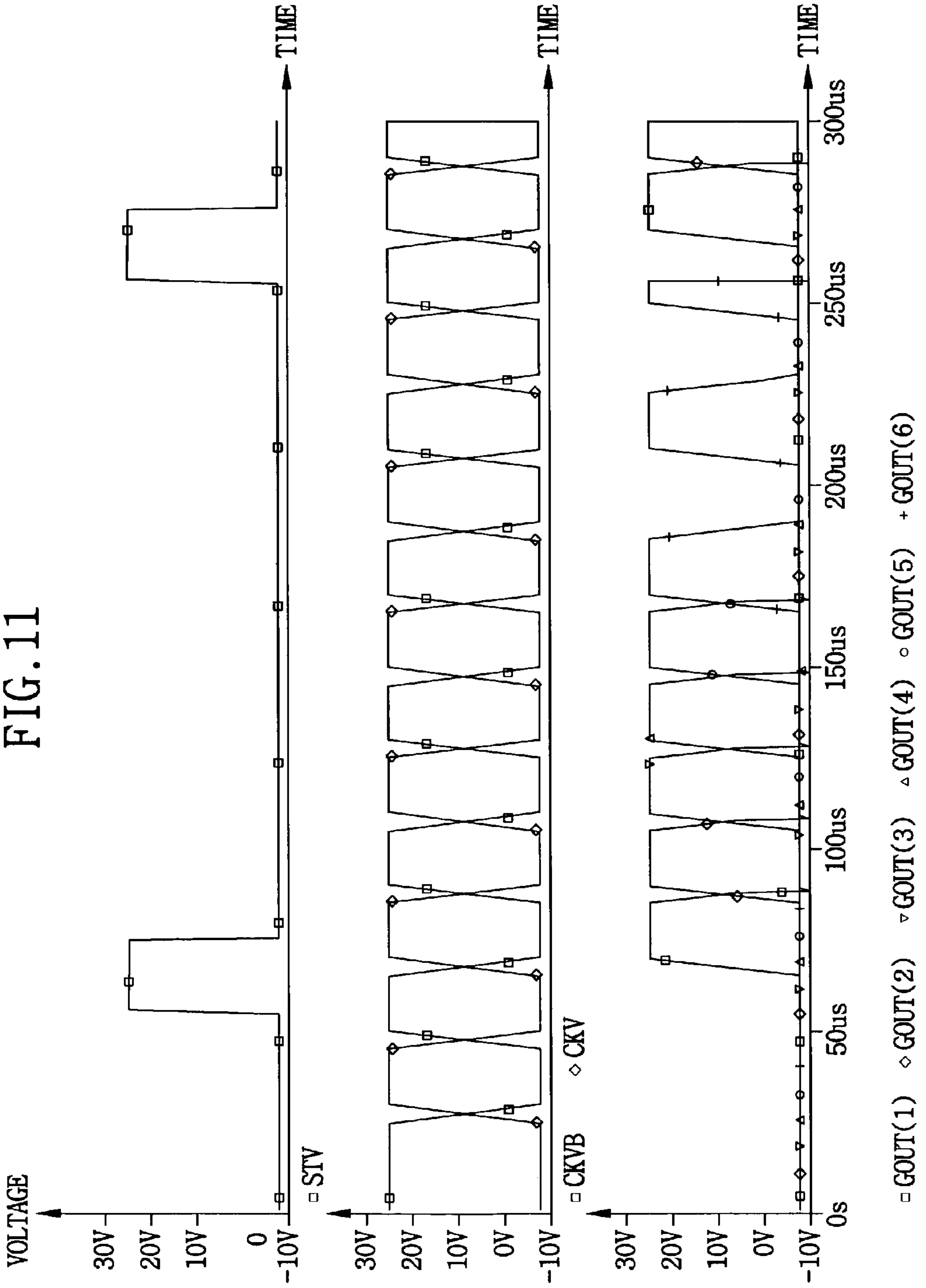
FIG. 11 is a graph showing the output of the shift register of FIG. 7.

FIG. 11 is a graph showing the output of the shift register of FIG. 7, especially shows the output of the shift register when the shift register has five stages and a dummy stage. The output signal of the dummy stage is not related with a gate line driving signal.

Referring to FIG. 11, the voltage of first clock signal ckv is changed to a high level in response to the rising edge of the scan start signal STV after a predetermined period of delay, and then the first gate line driving signal GOUT[1] is generated at the output terminal of the first stage.

Next, the gate line driving signals GOUT[2], GOUT[3], GOUT[4] and GOUT[5] are sequentially generated at the output terminals of the first, second, third, fourth and fifth stages, respectively. Since the scan start signal STV is applied to the first stage and the dummy stage (or the sixth stage), the dummy stage outputs the second clock signal ckvb before the dummy stage is reset by the next scan start signal STV.

However, when the dummy stage is reset by the scan start signal STV, the layout area for gate driver circuit of the TFT LCD increases since the scan start signal line is connected to the first stage and the sixth stage to be extended along the entire stages.

In addition, since the scan start signal line is arranged in a column direction and overlaps with the other wirings arranged in a row direction, the parasitic capacitance between the scan start signal line and the other wirings may increase, so that the distortion of the signals may occur.

Since the first and second clock signals ckv and ckvb discharge and charge the parasitic capacitance, the power consumption increases. The output signal of the dummy stage exists during display blanking period in which image display does not occur, to thereby increase the power consumption.

Figure 12:
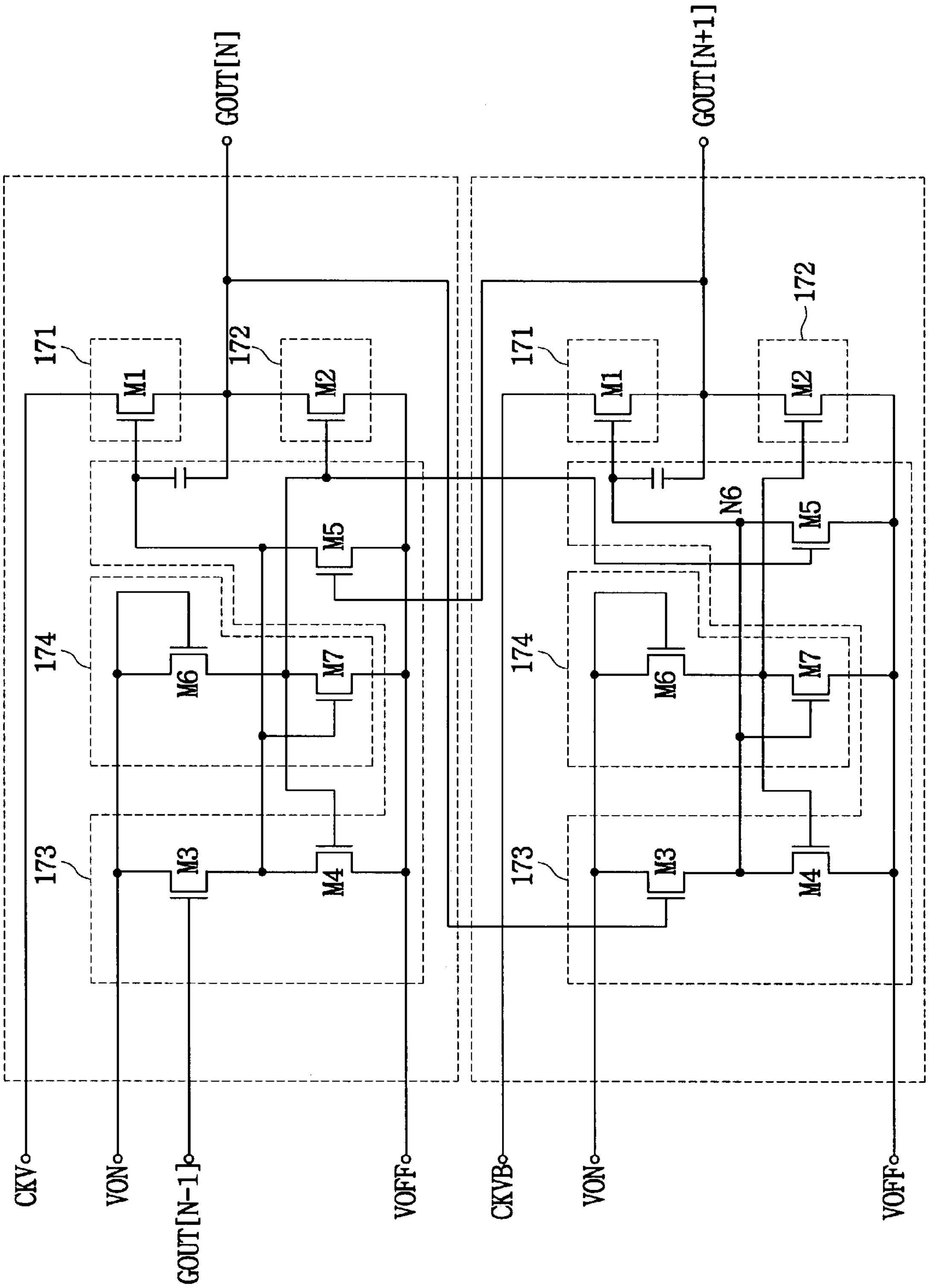
FIG. 12 is a circuit diagram showing an Nth stage and an (N+1)th stage in a shift register according to one exemplary embodiment of the present invention.
Figure 13:
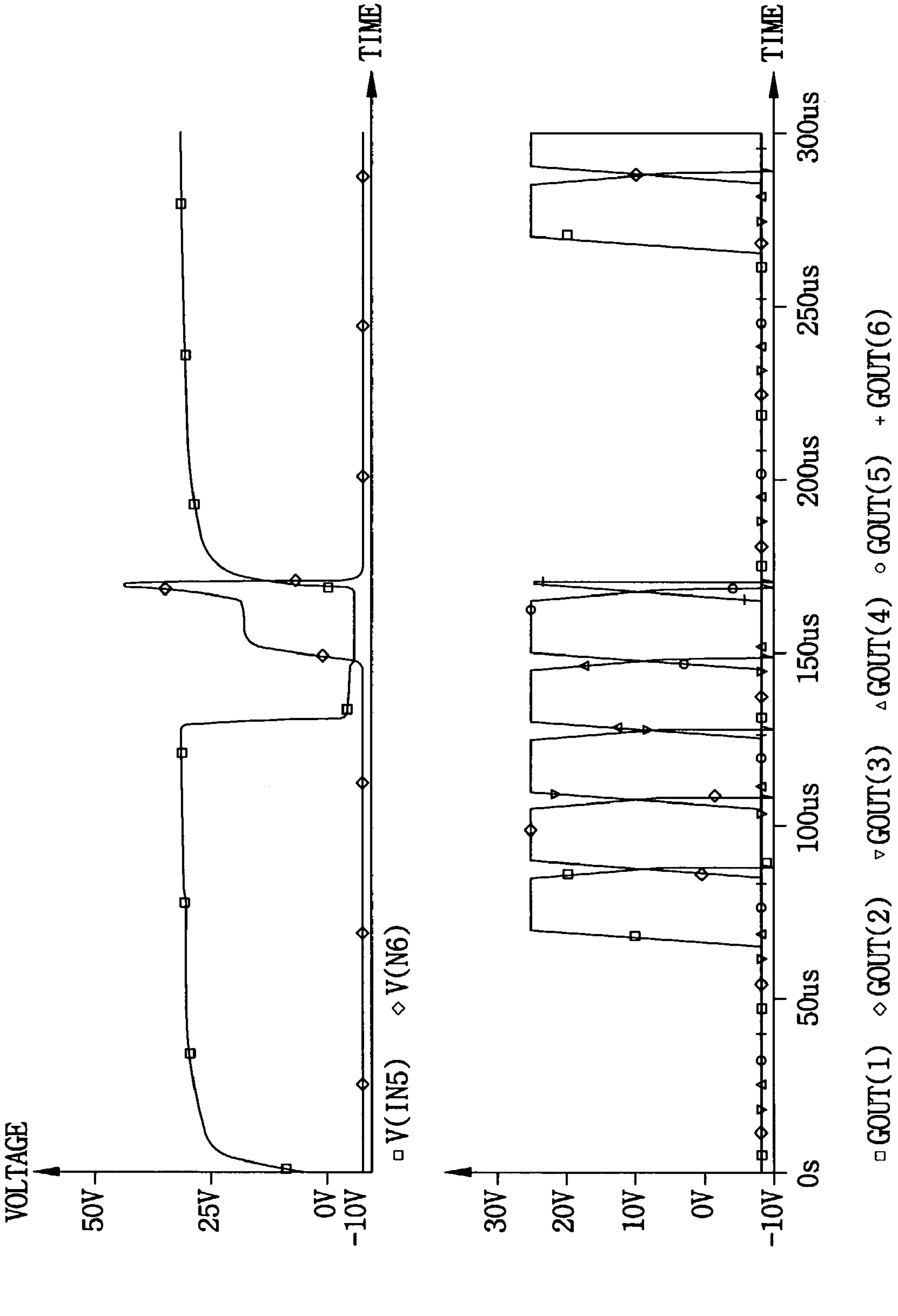
FIG. 13 is a graph showing the output of the shift register of FIG. 12.

FIG. 12 is a circuit diagram showing an Nth stage and an (N+1)th stage in a shift register according to one exemplary embodiment of the present invention, and FIG. 13 is a graph showing the output of the shift register of FIG. 12.

Referring to FIG. 12, each of the stages of the shift register includes a pull-up part 171, a pull-down part 172, a pull-up driver part 173 and a pull-down driver part 174. In FIG. 12, the same reference numerals denote the same elements in FIG. 7, and thus the detailed descriptions of the same elements will be omitted.

The output of the pull-down driver part 174 of the last stage is connected to the pull-down part 172 of the last stage and also is connected to the pull-up driver part 173 of the dummy stage.

Particularly, the source of the sixth transistor M6 is connected to the gate of the fifth transistor M5 of the dummy stage.

The output of an inverter (transistors M6 and M7) has a low voltage level while the Nth stage (the last stage) outputs the Nth gate line driving signal GOUT[N]. The output voltage of the inverter is changed to a high voltage level when the Nth stage is reset (or inactivated) by the (N+1)th gate line driving signal GOUT[N+1]. The high level output voltage of the inverter turns on the fifth transistor M5 of the pull-up driver part 173 of the dummy stage and resets the dummy stage.

Referring to FIG. 13, the output signals GOUT[1], GOUT[2], GOUT[3], GOUT[4] and GOUT[5] is generated. The output signal GOUT[6] of the dummy stage resets the last stage, and then the voltage of GOUT[6] is dropped (or lowered).

Since the output signal of the dummy stage does not exist during the display blanking period, the power consumption may be reduced. Namely, the output signal of the dummy stage exists during the display blanking period in FIG. 11, but the output signal of the dummy stage does not exist during the display blanking period in FIG. 13, so that the power consumption due to the output signal of the dummy stage may be reduced.

In addition, since the dummy stage is reset not by the scan start signal STV, the layout area for gate driver circuit of the TFT LCD is reduced.

In addition, the parasitic capacitance due to the scan start signal line may be reduced, so that the distortion of the signals may be reduced and the power consumption of the first and second clocks due to the parasitic capacitance may be reduced.

In FIG. 10, since the scan start signal line is connected to the first stage and is also connected to the sixth stage so as to reset the dummy stage, another layout area is required, and overlap between the scan start signal line and the other wirings exists.

However, as shown in FIG. 12, since the dummy stage is reset by the output signal of the inverter of the last stage, the layout area may be reduced, and the overlap between wirings may be reduced.

Figure 14:
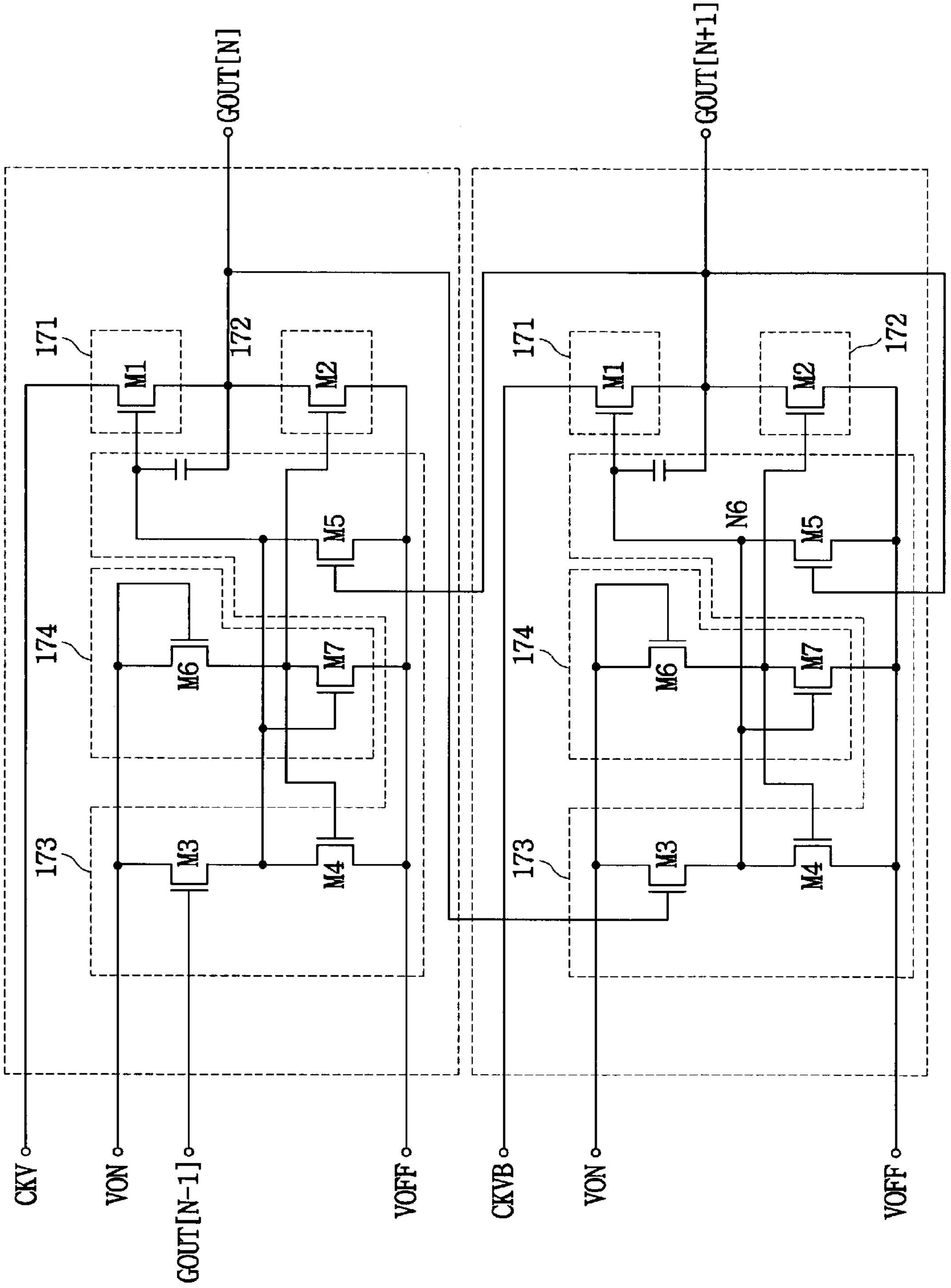
FIG. 14 is a circuit diagram showing an Nth stage and an (N+1)th stage in a shift register according to another exemplary embodiment of the present invention.
Figure 15:
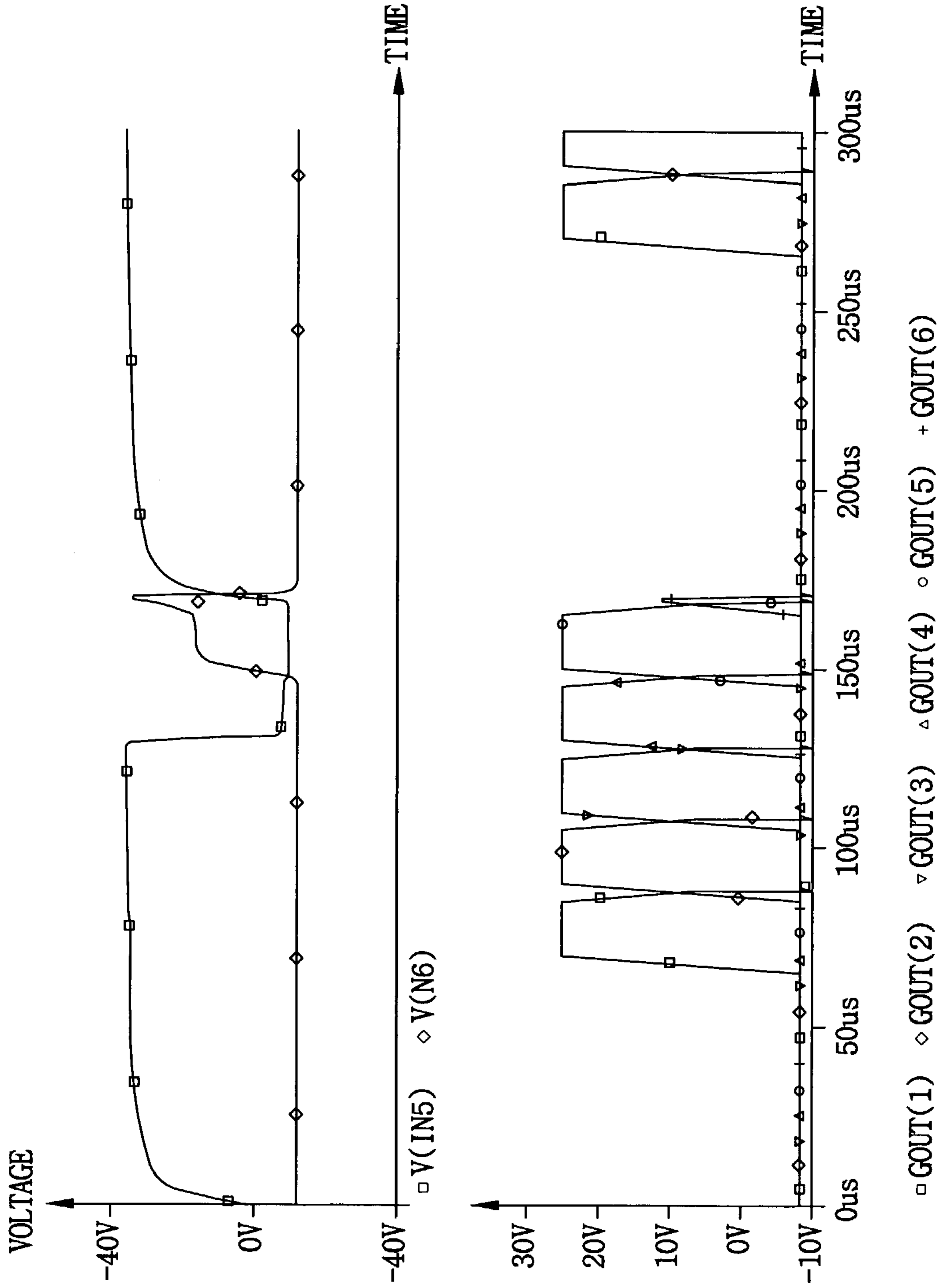
FIG. 15 is a graph showing the output of the shift register of FIG. 14.

FIG. 14 is a circuit diagram showing an Nth stage and an (N+1)th stage in a shift register according to another exemplary embodiment of the present invention, and FIG. 15 is a graph showing the output of the shift register of FIG. 14.

Referring to FIG. 14, each of the stages of the shift register according to another exemplary embodiment of the present invention includes a pull-up part 171, a pull-down part 172, a pull-up driver part 173 and a pull-down driver part 174. In FIG. 14, the same reference numerals denote the same elements in FIG. 7, and thus the detailed descriptions of the same elements will be omitted.

The output of the pull-down driver part 172 of the dummy stage is connected to the discharge transistor M5 of the pull-up driver part 173 of the last stage so as to reset the last stage, and also is connected to the pull-up driver part 173 of the dummy stage so as to reset the dummy stage.

Particularly, the source of the first transistor M1 of the dummy stage, or the drain of the second transistor M2 of the dummy stage is connected to the gate of the fifth transistor M5 of the last stage and also is connected to the gate of the fifth transistor M5 of the dummy stage.

The output signal of the dummy stage turns on the fifth transistor M5 of the discharge transistor M5 of the dummy stage and resets the dummy stage.

Referring to FIG. 15, the output signals GOUT[1], GOUT[2], GOUT[3], GOUT[4] and GOUT[5] is generated. The output signal GOUT[6] of the dummy stage resets the last stage, and then the voltage of GOUT[6] is dropped (or lowered).

Since the output signal of the dummy stage does not exist during the display blanking period, the power consumption may be reduced. Namely, the output signal of the dummy stage exists during the display blanking period in FIG. 11, but the output signal of the dummy stage does not exist during the display blanking period in FIG. 15, so that the power consumption due to the output signal of the dummy stage may be reduced.

In addition, since the dummy stage is reset not by the scan start signal STV, the layout area for gate driver circuit of the TFT LCD is reduced.

In addition, the parasitic capacitance due to the scan start signal line may be reduced, so that the distortion of the signals may be reduced and the power consumption of the first and second clocks due to the parasitic capacitance may be reduced.

In FIG. 10, since the scan start signal line is connected to the first stage and is also connected to the sixth stage so as to reset the dummy stage, another layout area is required, and overlap between the scan start signal line and the other wirings exists.

However, as shown in FIG. 14, since the dummy stage is reset by the output signal of the dummy stage, the layout area may be reduced, and the overlap between wirings may be reduced.

The shift direction of the output signal GOUT[1], GOUT[2], GOUT[3] and GOUT[4] is fixed in the shift register of FIGS. 6 and 7, and the a-Si TFT LCD device using the shift register of FIGS. 6 and 7 does not provide a forward shift function or a backward shift function. Namely, the a-Si TFT LCD device using the shift register of FIGS. 6 and 7 may not display images upside down on the display screen since the forward shift function and the backward shift function is not provided.

Figure 16:
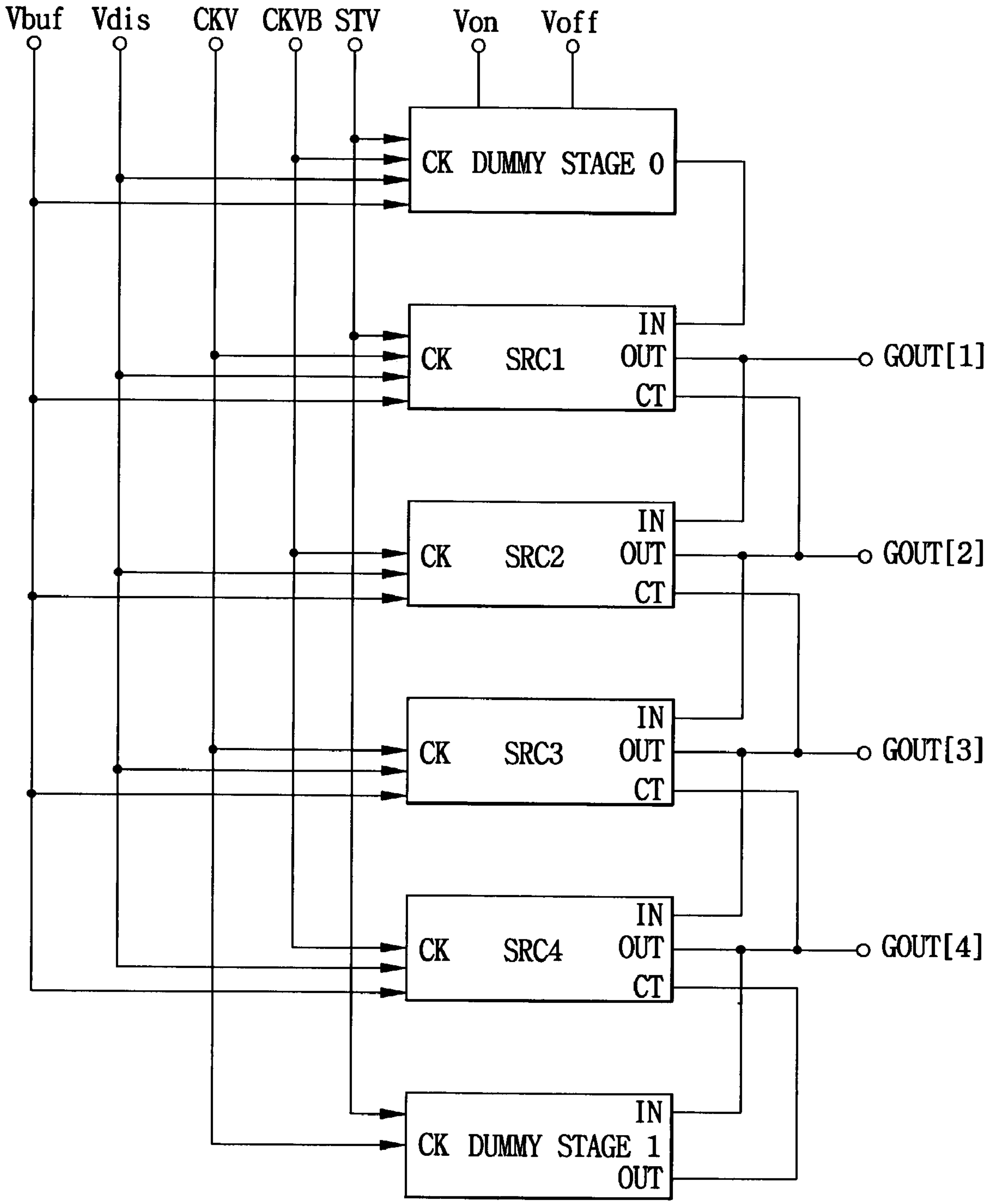
FIG. 16 is a block diagram showing a bi-directional shift register employed in the gate driver circuit of an a-Si TFT LCD according to further another exemplary embodiment of the present invention.

FIG. 16 is a block diagram showing a bi-directional shift register employed in the gate driver circuit of an a-Si TFT LCD according to further another exemplary embodiment of the present invention.

Referring to FIG. 16, the shift register includes a dummy stage 0 and a dummy stage 1. The dummy stage 0 is connected to the first stage. In addition, a first selection signal Vbuf and a second selection signal Vdis are used so as to select the shift direction.

The dummy stage 0 generates a dummy output signal (or a first reset control signal) for resetting the first stage SRC1 when the shift direction is changed to a backward shift.

When a second power voltage Von is applied to the first selection terminal Vbuf, a first power voltage Voff is applied to the second selection terminal Vdis, a first clock signal ckv is applied to a first clock terminal CKV and a second clock signal ckvb is applied to a second clock terminal CKVB, the forward shift operation occurs. In the forward shift operation, the gate line driving signals GOUT[1], GOUT[2], GOUT[3] and GOUT[4] are sequentially generated in the named order.

In addition, when a first power voltage Voff is applied to the first selection terminal Vbuf, a second power voltage Von is applied to the second selection terminal Vdis, the second clock signal ckvb is applied to the first clock terminal CKV and a first clock signal ckv is applied to the second clock terminal CKVB, the backward shift operation occurs. In the backward shift operation, the gate line driving signals GOUT[4], GOUT[3], GOUT[2] and GOUT[1] are sequentially generated in the named order.

Since the a-Si TFT LCD device uses NMOS transistors, the high voltage level of the first and second selection signals Vbuf and Vdis need to be larger than the maximum voltage of the first and second clock signals ckv and ckvb. The first and second selection signals Vbuf and Vdis are complementary each other, and the first and second clocks ckv and ckvb are complementary each other. Namely, the second selection signal Vdis has a phase 180° different from that of the first selection signal Vbuf, and the first clock signal ckv has a phase 180° different from that of the second clock signal ckvb. The first and second clock signals ckv and ckvb may be alternately applied to the first and second clock terminals CKV and CKVB so as to change the shift direction.

Figure 17:
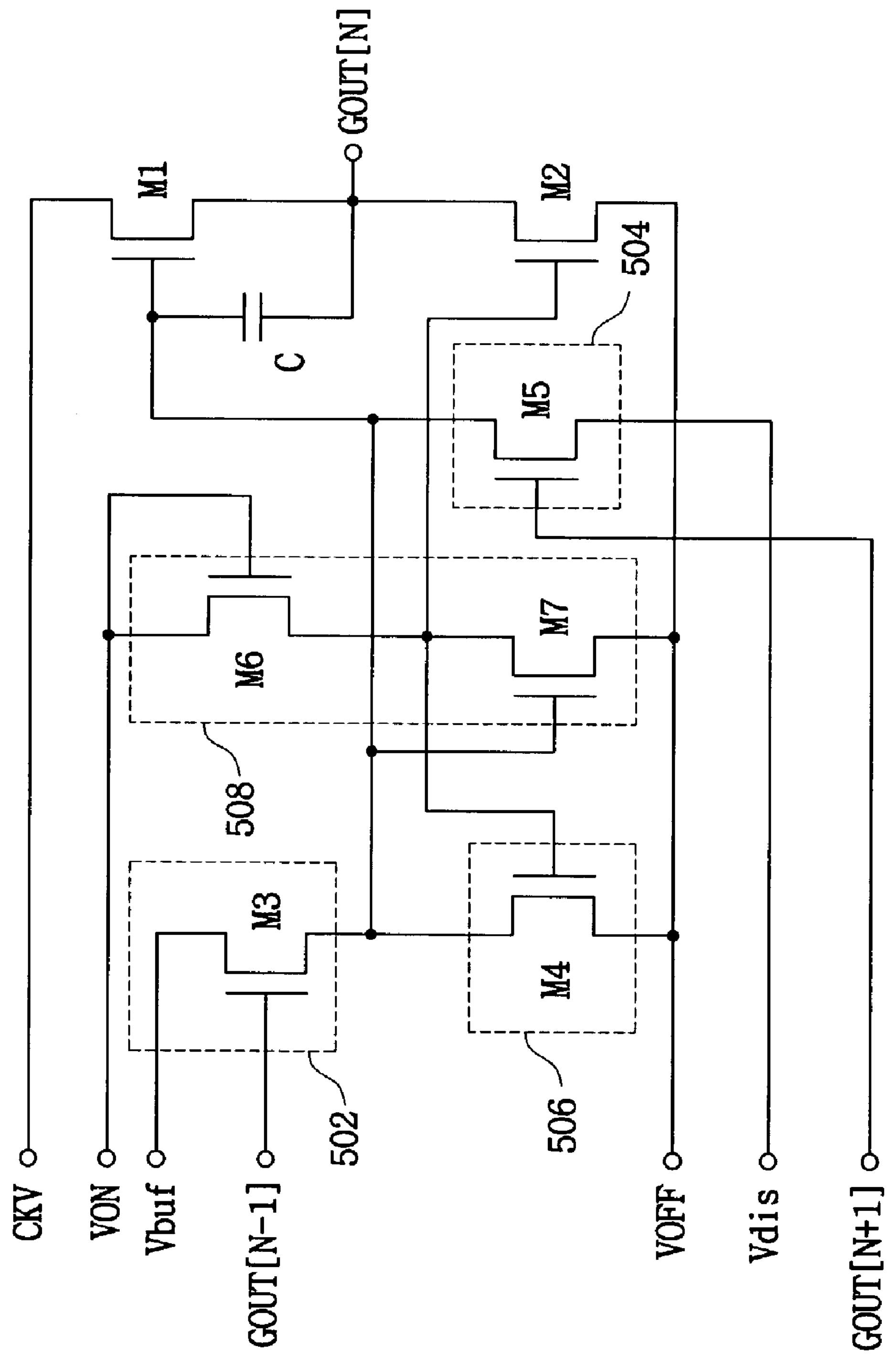
FIG. 17 is a circuit diagram showing a second stage and a third stage in the shift register of FIG. 16.
Figure 18:
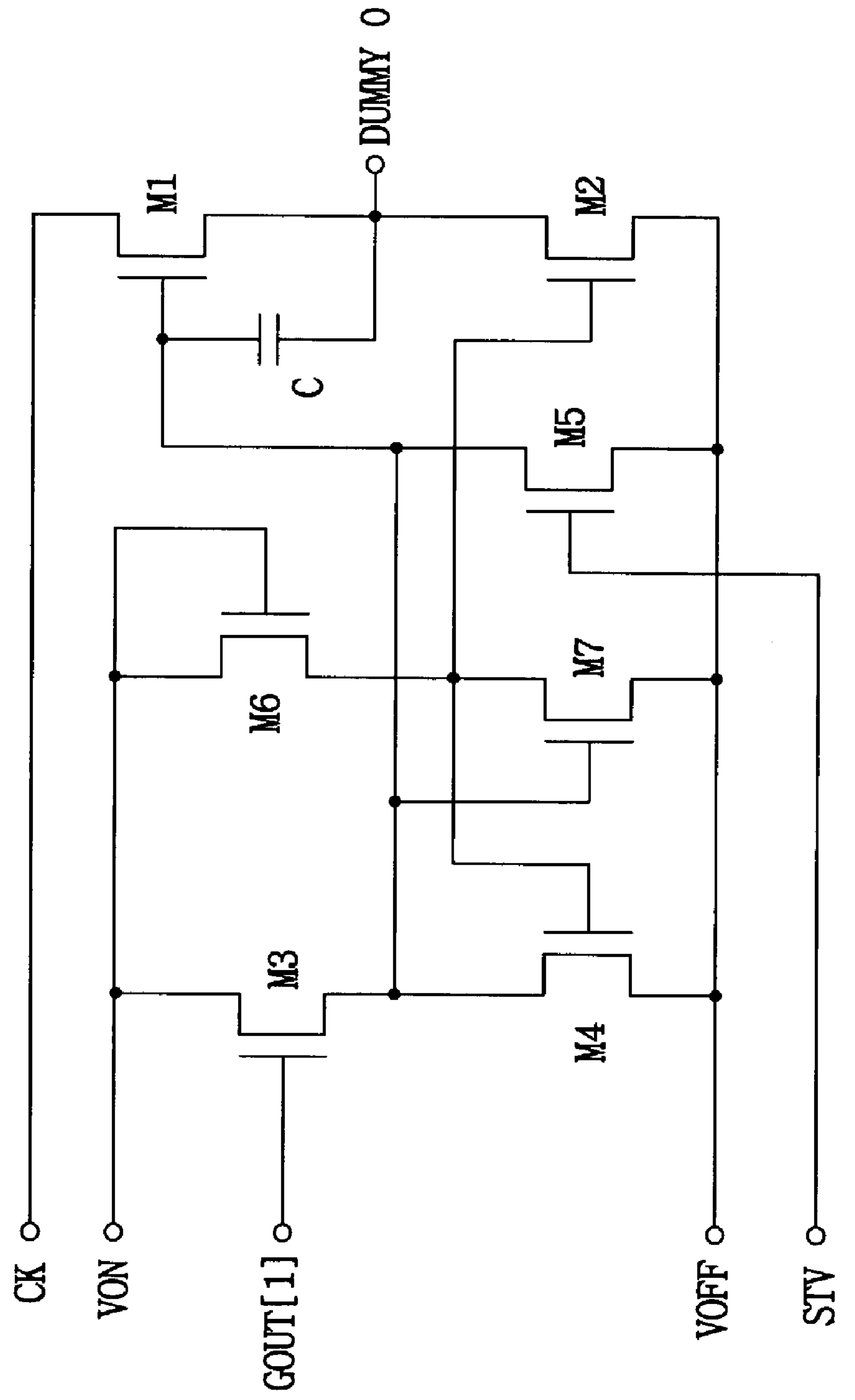
FIG. 18 is a circuit diagram showing a dummy stage 0 in the shift register of FIG. 16.
Figure 19:
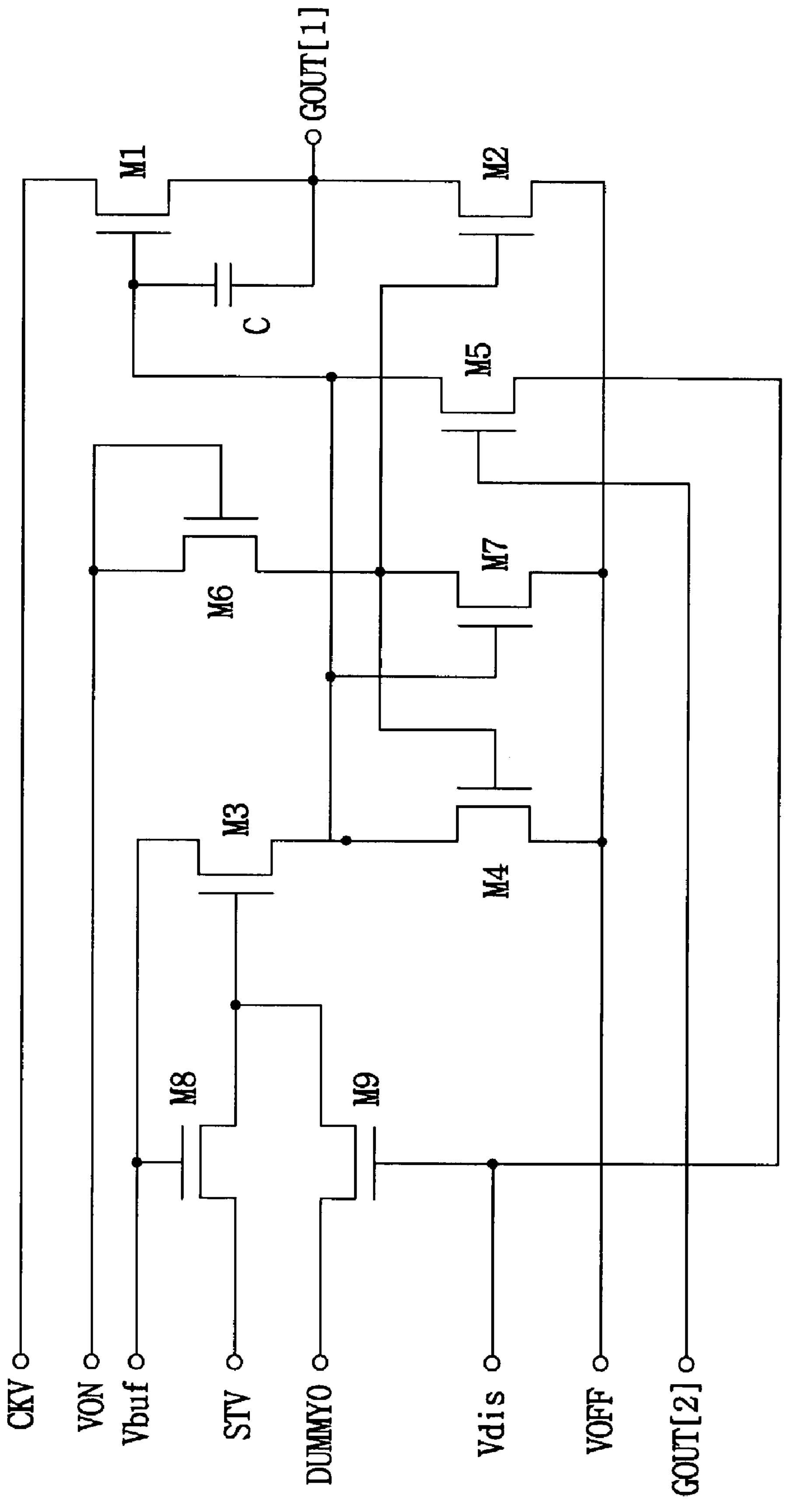
FIG. 19 is a circuit diagram showing a first stage in the shift register of FIG. 16.
Figure 20:
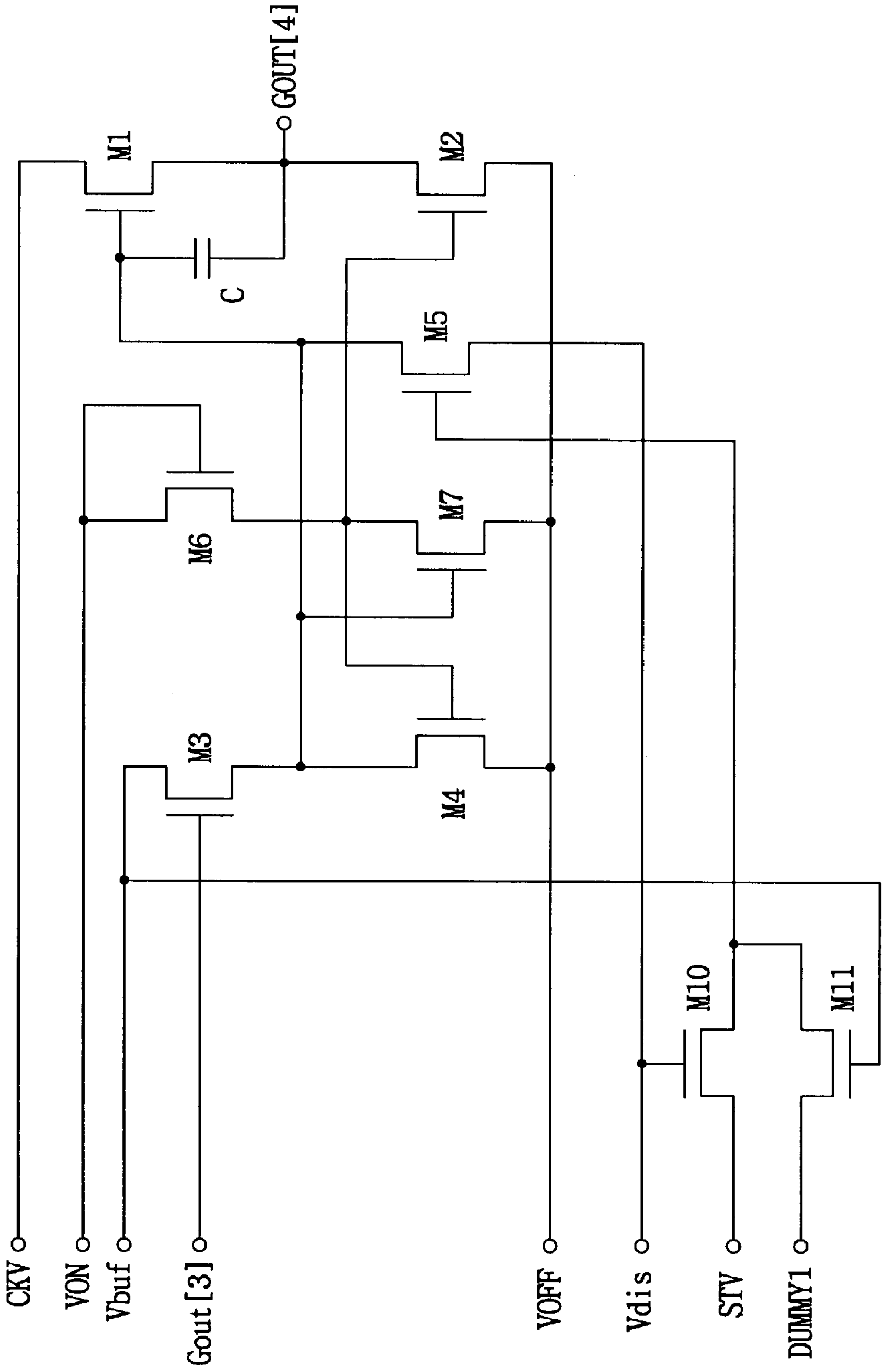
FIG. 20 is a circuit diagram showing a fourth stage in the shift register of FIG. 16.
Figure 21:
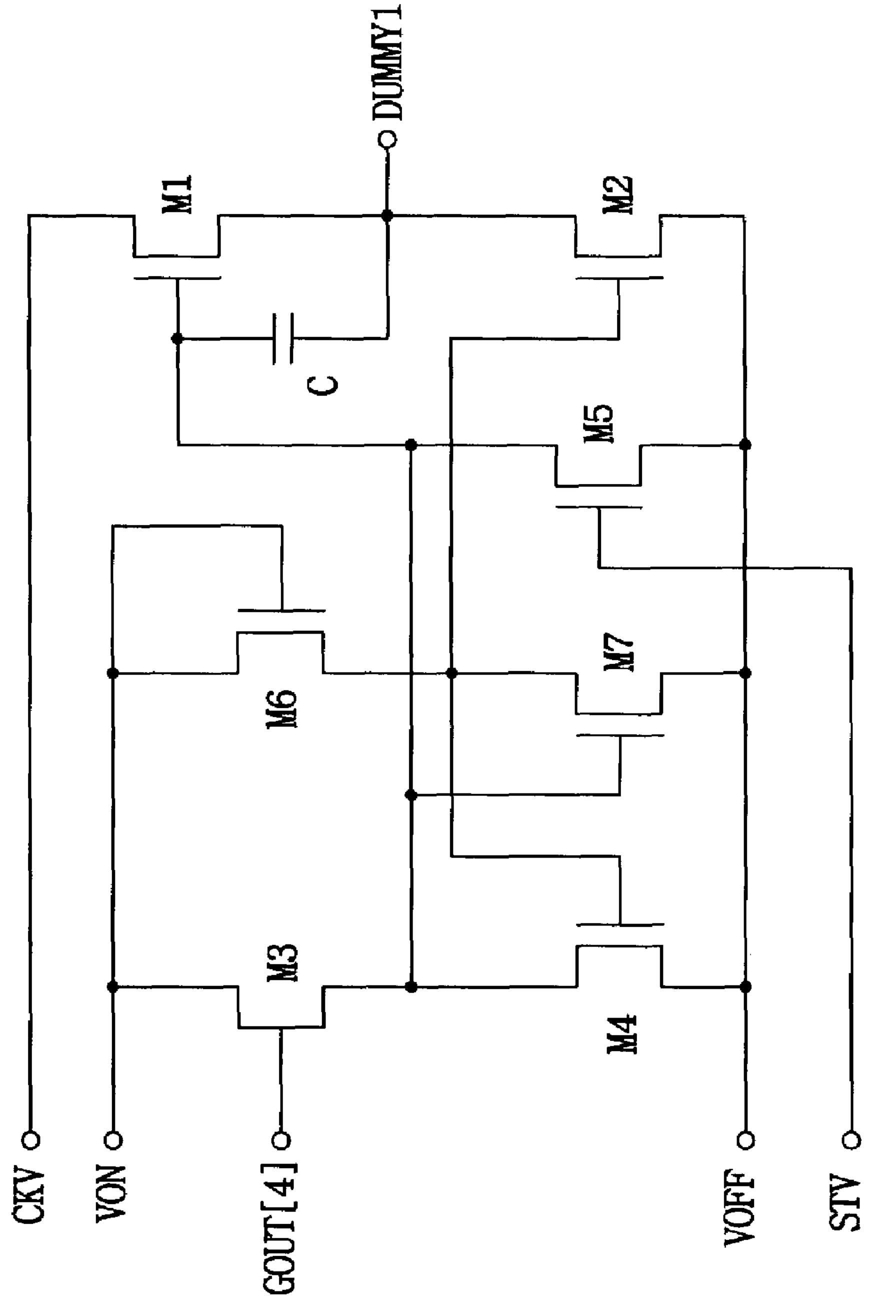
FIG. 21 is a circuit diagram showing a dummy stage 1 in the shift register of FIG. 16.

FIG. 17 is a circuit diagram showing a second stage and a third stage in the shift register of FIG. 16, and FIG. 18 is a circuit diagram showing a dummy stage 0 in the shift register of FIG. 16. FIG. 19 is a circuit diagram showing a first stage in the shift register of FIG. 16, and FIG. 20 is a circuit diagram showing a fourth stage in the shift register of FIG. 16. FIG. 21 is a circuit diagram showing a dummy stage1 in the shift register of FIG. 16.

Referring to FIG. 17, in the second and third stage, the first selection terminal Vbuf is connected to a drain of transistor M1, and the second selection terminal Vdis is connected to a source of transistor M5 so as to provide the forward shift function or the backward shift function.

The forward shift operation occurs when the first selection signal Vbuf has a high voltage level (HIGH) and the first clock signal ckv is applied to the clock terminal CKV. Namely, the Nth stage is set (or activated) by the output signal GOUT[N−1 ] of the previous stage, and is reset (or inactivated) by the output signal GOUT[N+1] of the next stage.

The backward shift operation occurs when the second selection signal Vdis has a high voltage level (HIGH) and the second clock signal ckvb is applied to the clock terminal CKV. Namely, the Nth stage is set (or activated) by the output signal GOUT[N+1] of the next stage, and is reset (or inactivated) by the output signal GOUT[N−1 ] of the previous stage. The first and second selection signals Vbuf and Vdis are complementary each other Referring to FIG. 19, in the first stage, transistors M8 and M9 is connected to a gate of the buffer transistor M3.

The first selection signal Vbuf is applied to the gate of the transistor M8 so as to select the scan start signal STV, and the second selection signal Vdis is applied to the gate of the transistor M9 so as to select a dummy 0 signal, or the output signal of the dummy stage 0.

The forward shift operation occurs when the first selection signal Vbuf has a high voltage level (HIGH) and the first clock signal ckv is applied to the clock terminal CKV. Namely, the first stage is set (or activated) by the scan start signal STV, and is reset (or inactivated) by the output signal GOUT[2] of the next stage.

The backward shift operation occurs when the second selection signal Vdis has a high voltage level (HIGH) and the second clock signal ckvb is applied to the clock terminal CKV. Namely, the first stage is set (or activated) by the output signal GOUT[2] of the next stage, and is reset (or inactivated) by the dummy 0 signal, or the output signal of the dummy stage 0. The first and second selection signals Vbuf and Vdis are complementary each other.

Referring to FIG. 20, in the fourth stage (or a last stage), transistors M10 and M11 are connected to a gate of a discharge transistor M5.

The first selection signal Vbuf is applied to the gate of the transistor M11 so as to select the dummy 1 signal, or the output signal of the dummy stage1, and the second selection signal Vdis is applied to the gate of the transistor M10 so as to select the scan start signal STV.

The forward shift operation occurs when the first selection signal Vbuf has a high voltage level (HIGH) and the second clock signal ckvb is applied to the clock terminal CKV. Namely, the fourth stage is set (or activated) by the output signal GOUT[3] of the previous stage, and is reset (or inactivated) by the dummy1 signal, or the output signal of the dummy stage 1.

The backward shift operation occurs when the second selection signal Vdis has a high voltage level (HIGH) and the first clock signal ckv is applied to the clock terminal CKV. Namely, the fourth stage is set (or activated) by the scan start signal STV, and is reset (or inactivated) by the output signal GOUT[3] of the previous stage. The first and second selection signals Vbuf and Vdis are complementary each other.

Referring to FIG. 21, in the dummy stage 1, the output signal GOUT[4] of the previous stage is applied to a gate of the buffer transistor M3, the power terminal Von is connected to a drain of the transistor M3, the scan start signal STV is applied to a gate of the transistor M5, and the power terminal Voff is connected to a source of the transistor M5.

When the first clock signal ckv is applied to the clock terminal CKV, the dummy stage 1 is set by the output signal GOUT[4] of the previous stage, and is reset by the scan start signal STV.

The dummy stage 1 outputs the dummy1 signal to the drain of the transistor M11 of the fourth stage and resets the last stage (SRC4) during the forward shift operation.

Referring to FIG. 18, in the dummy stage 0, the output signal GOUT[1] of the next stage, or the first stage, is applied to a gate of the buffer transistor M3, the power terminal Von is connected to a drain of the transistor M3, the scan start signal STV is applied to a gate of the transistor M5, and the power terminal Voff is connected to a source of the transistor M5.

When the first clock signal ckvb is applied to the clock terminal CKV, the dummy stage 0 is set by the output signal GOUT[1] of the next stage, and is reset by the scan start signal STV.

The dummy stage 0 outputs the dummy 0 signal to the drain of the transistor M9 of the first stage and resets the first stage (SRC1) during the backward shift operation.

Figure 22:
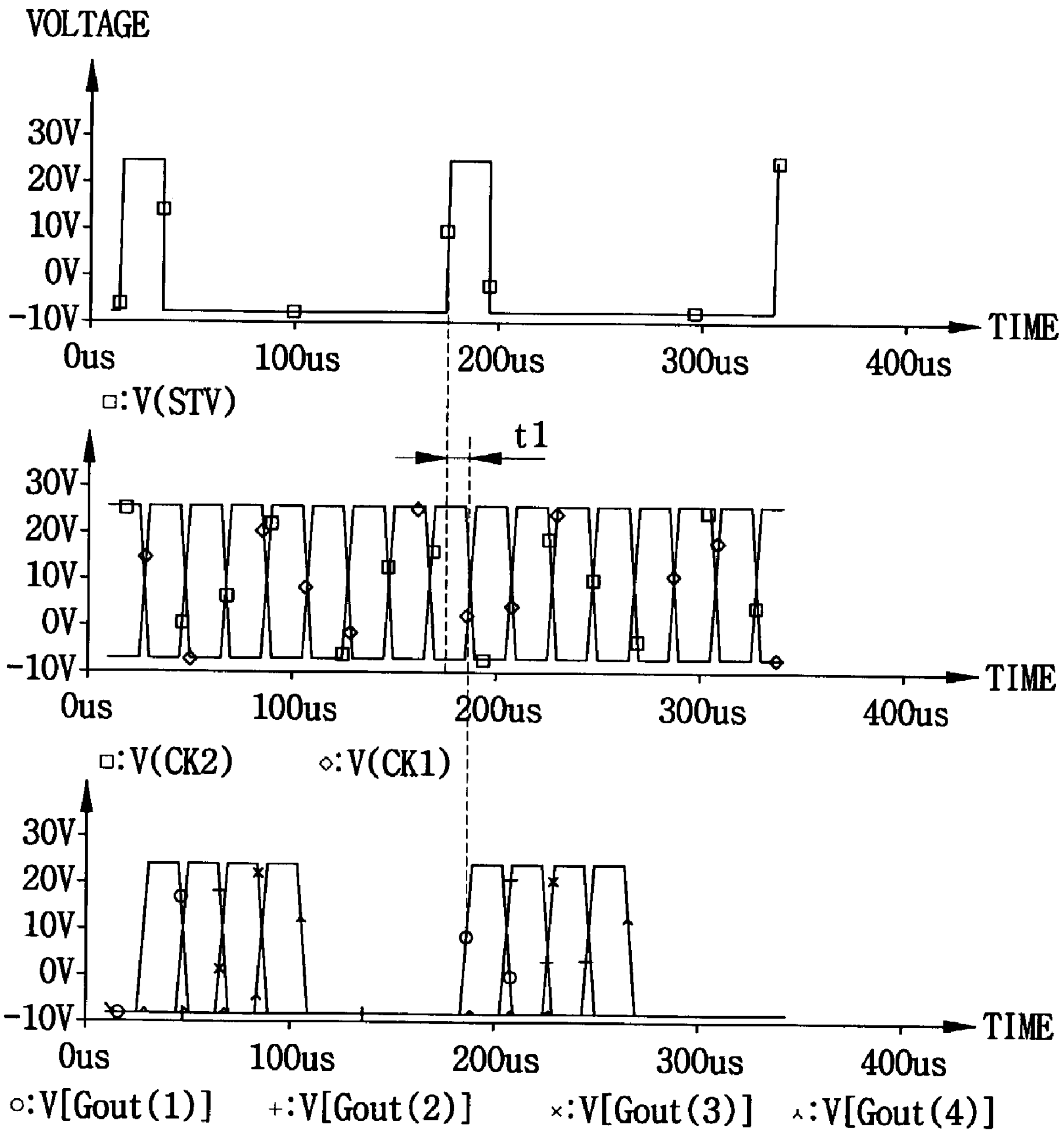
FIG. 22 is a graph showing scan line driving signals outputted from the stages of FIG. 16 during a forward shift.

FIG. 22 is a graph showing scan line driving signals outputted from the stages of FIG. 16 during a forward shift. When Vbuf=Von, Vdis=Voff, CKV=ckv and CKVB=ckvb, the forward shift operation occurs. The second clock signal ckv has a phase 180° different from that of the first clock signal ckvb.

Referring to FIG. 22, the voltage of the first clock signal ckv is changed to a high level in response to the rising edge of the scan start signal STV after a predetermined period (t1) of delay, and then the first gate line driving signal GOUT[1] is generated at the output terminal of the first stage.

Next, the gate line driving signals GOUT[2], GOUT[3] and GOUT[4] are sequentially generated at the output terminals of the first, second, third and fourth stages, respectively.

Figure 23:
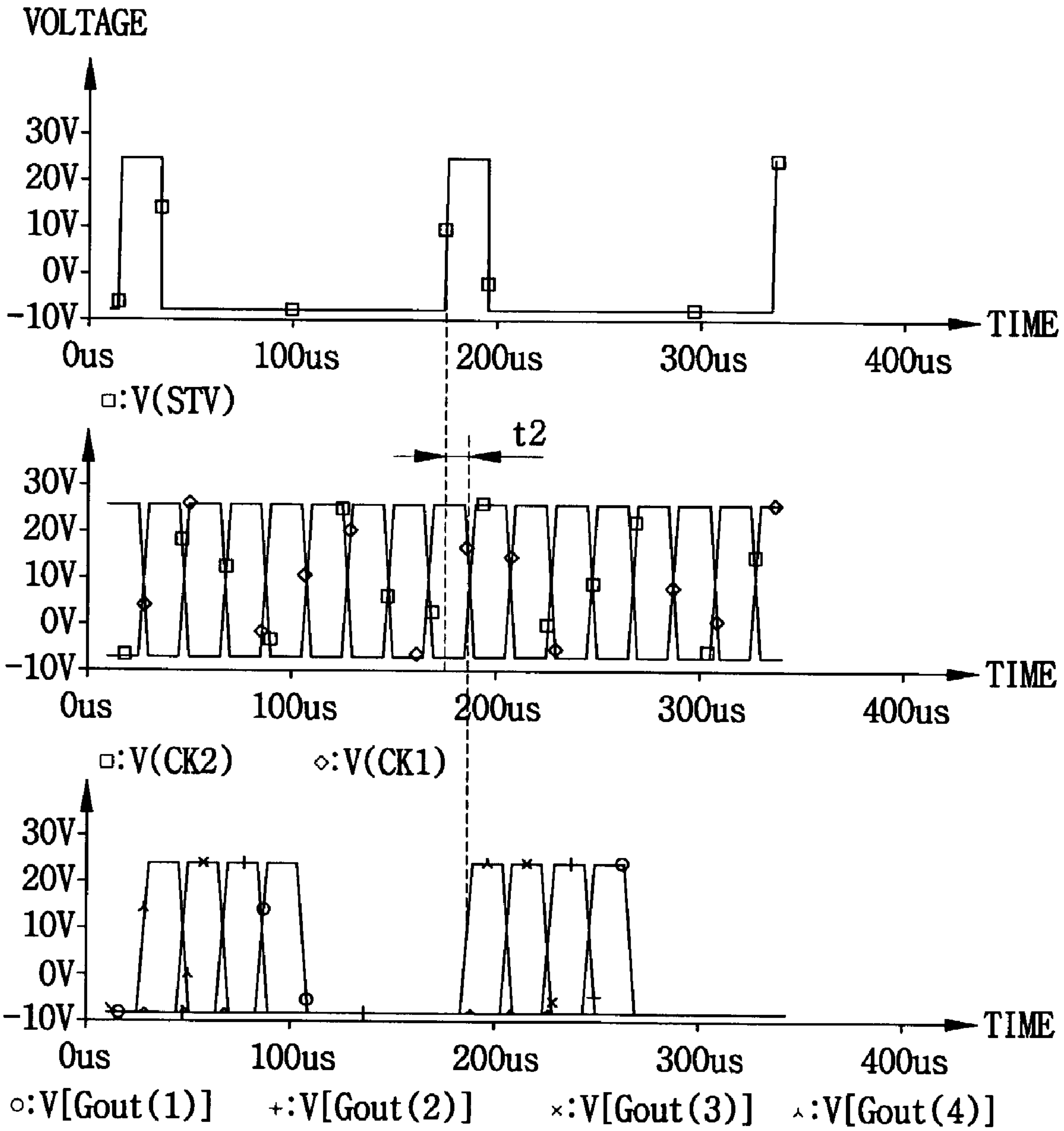
FIG. 23 is a graph showing scan line driving signals outputted from the stages of FIG. 16 during a backward shift.

FIG. 23 is a graph showing scan line driving signals outputted from the stages of FIG. 16 during a backward shift. When Vbuf=Voff, Vdis=Von, CKV=ckvb and CKVB=ckv, the backward shift operation occurs.

Referring to FIG. 23, the voltage of the first clock signal ckv is changed to a high level in response to the rising edge of the scan start signal STV after a predetermined period (t2) of delay, and then the fourth gate line driving signal GOUT[4] is generated at the output terminal of the fourth stage.

Next, the gate line driving signals GOUT[3], GOUT[2] and GOUT[1] are sequentially generated at the output terminals of the first, second, third and fourth stages, respectively.

Figure 24:
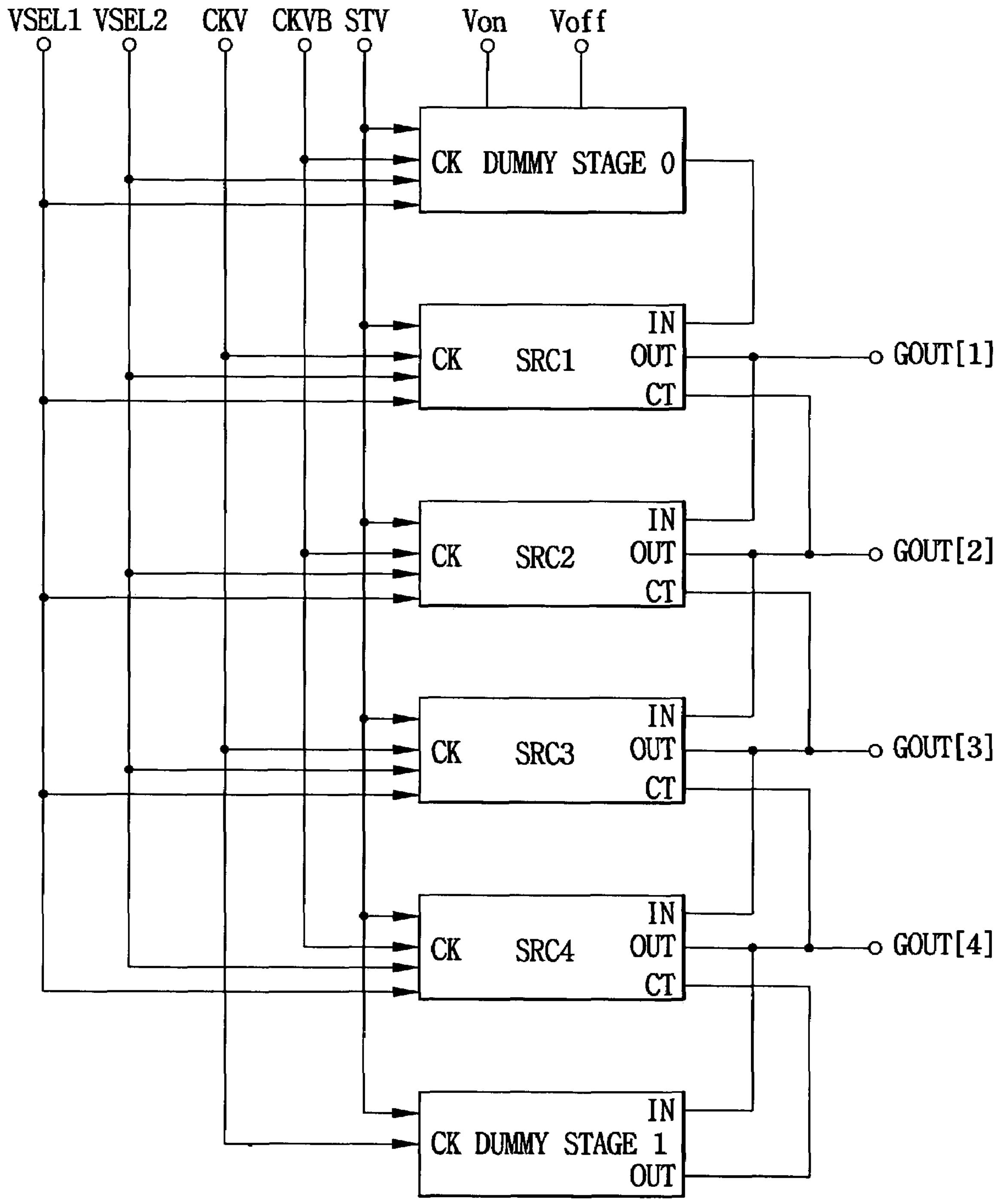
FIG. 24 is a block diagram showing a bi-directional shift register employed in the gate driver circuit of an a-Si TFT LCD according to a still another exemplary embodiment of the present invention.

FIG. 24 is a block diagram showing a bi-directional shift register employed in the gate driver circuit of an a-Si TFT LCD according to a still another exemplary embodiment of the present invention.

Referring to FIG. 24, the dummy stage 0 is connected to the first stage. In addition, a third selection signal VSEL1 and a fourth selection signal VSEL2 are used so as to select the shift direction. The third and fourth selection signals VSEL1 and VSEL2 are applied to each of the stages through transistors M8, M9, M10 and M11.

The high voltage level of the third and fourth selection signals VSEL1 and VSEL2 need to be larger than the maximum voltage of the first and second clock signals ckv and ckvb. The third and fourth selection signals VSEL1 and VSEL2 are complementary each other; and the first and second clock signals ckv and ckvb are complementary each other. The first and second clock signals ckv and ckvb may be alternately applied to the first and second clock terminals CKV and CKVB so as to change the shift direction.

When the second power voltage Von is applied to the third selection terminal VSEL1, the first power voltage Voff is applied to the fourth selection terminal VSEL2, the first clock signal ckv is applied to the first clock terminal CKV and the second clock signal ckvb is applied to the second clock terminal CKVB, the forward shift operation occurs. In the forward shift operation, the gate line driving signals GOUT[1], GOUT[2], GOUT[3] and GOUT[4] are sequentially generated in the named order.

In addition, when the first power voltage Voff is applied to the third selection terminal VSEL1, the second power voltage Von is applied to the fourth selection terminal VSEL2, the second clock signal ckvb is applied to the first clock terminal CKV and a first clock signal ckv is applied to the second clock terminal CKVB, the backward shift operation occurs. In the backward shift operation, the gate line driving signals GOUT[4], GOUT[3], GOUT[2] and GOUT[1] are sequentially generated in the named order.

Figure 25:
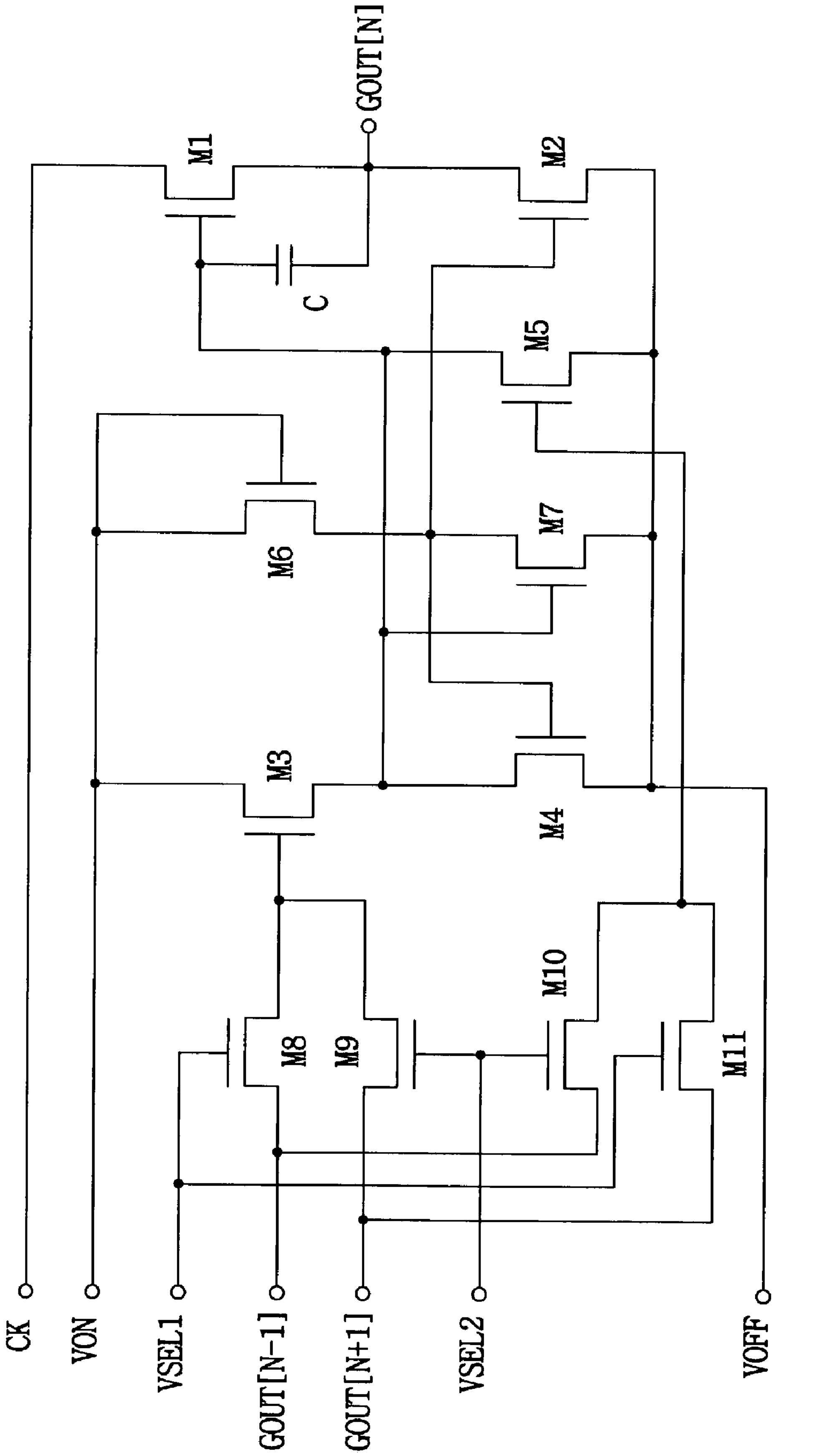
FIG. 25 is a circuit diagram showing a second stage and a third stage in the shift register of FIG. 24.
Figure 26:
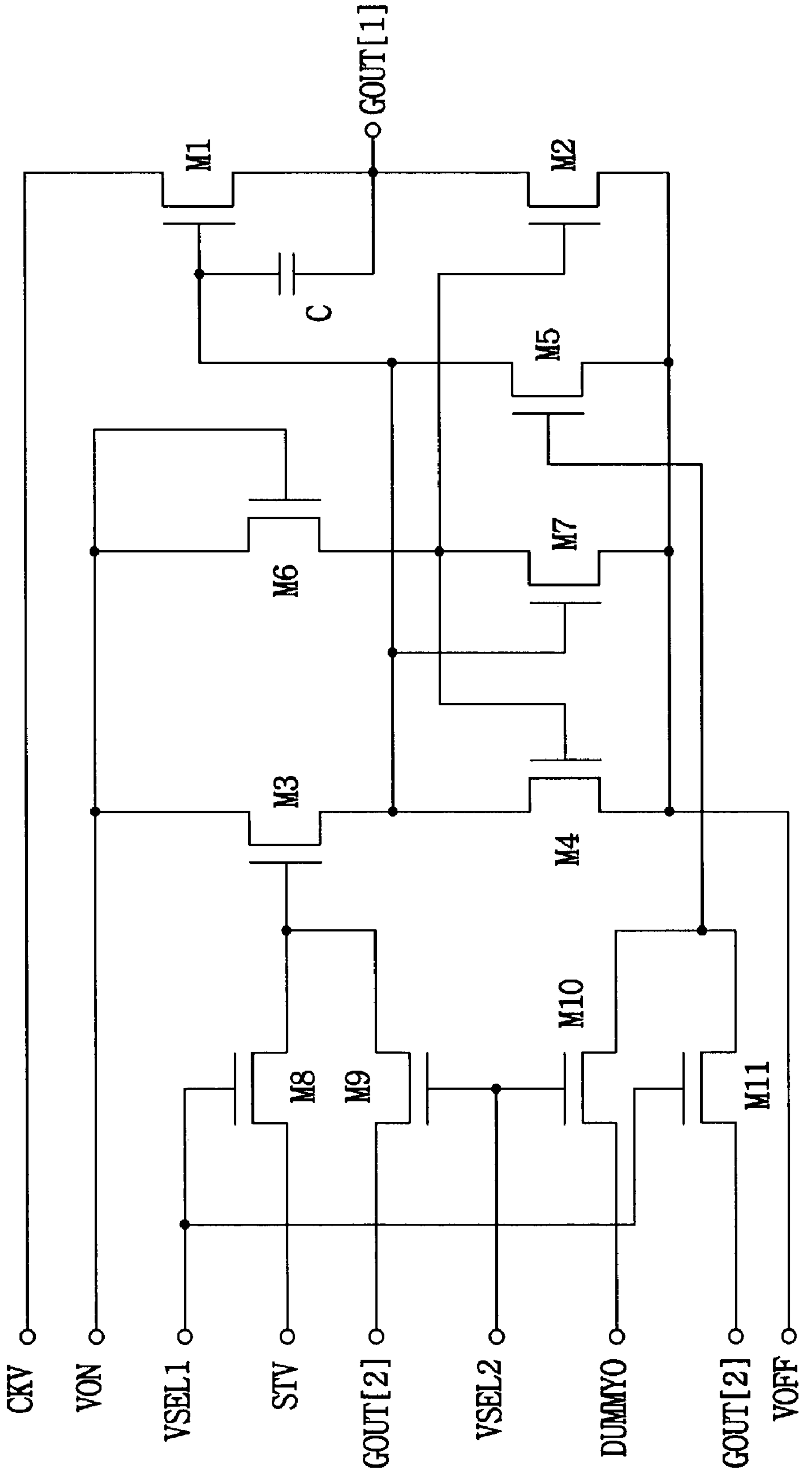
FIG. 26 is a circuit diagram showing a first stage in the shift register of FIG. 24.
Figure 27:
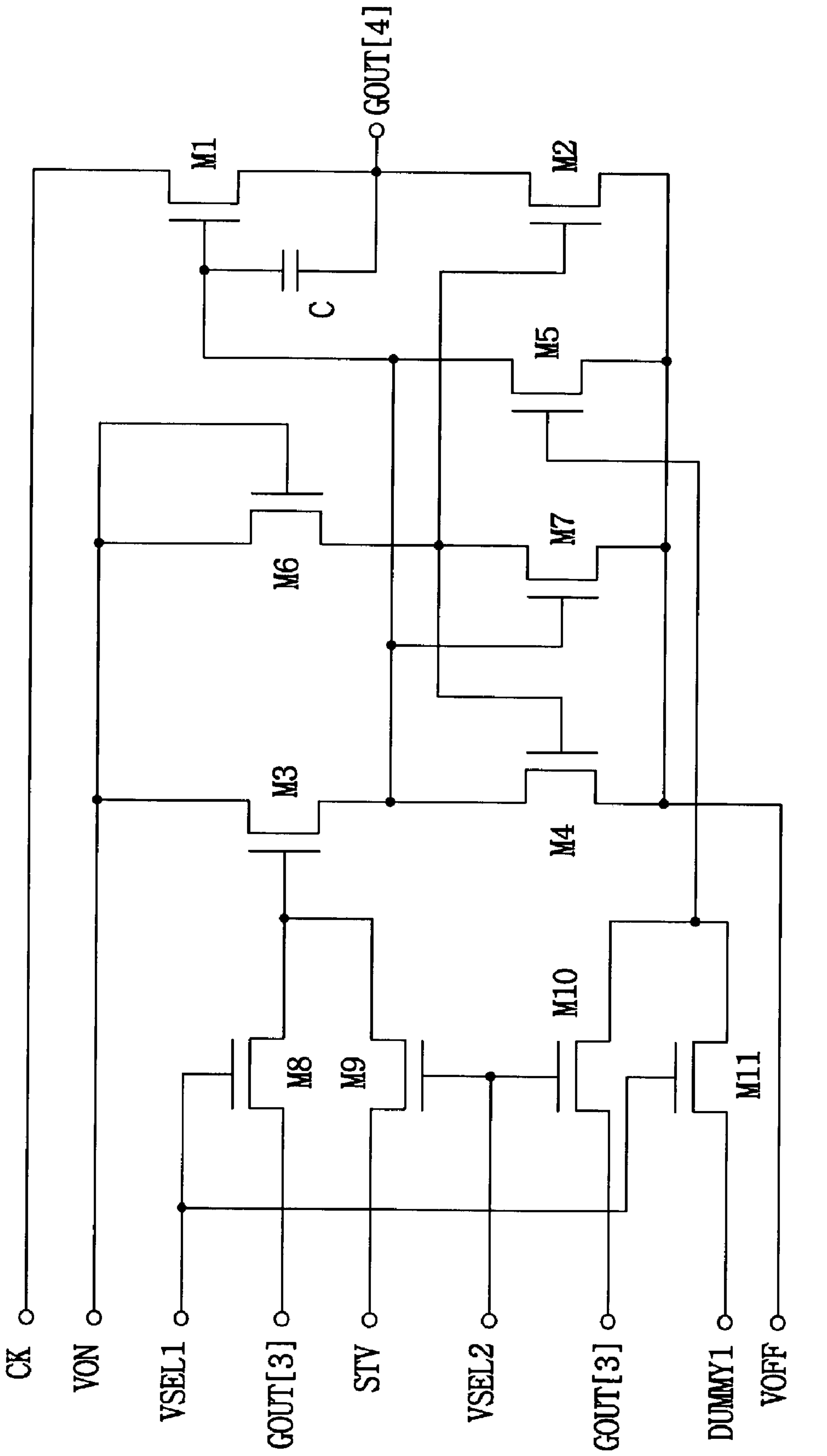
FIG. 27 is a circuit diagram showing a fourth stage in the shift register of FIG. 24.

FIG. 25 is a circuit diagram showing a second stage and a third stage in the shift register of FIG. 24, FIG. 26 is a circuit diagram showing a first stage in the shift register of FIG. 24, and FIG. 27 is a circuit diagram showing a fourth stage in the shift register of FIG. 24.

Transistors M8 and M9 are connected to a drain of transistor M3, and transistors M10 and M11 are connected to a gate of transistor M5.

The third selection terminal VSEL1 is connected to gates of transistor M8 and M11, and the fourth selection terminal VSEL2 is connected to gates of transistor M9 and M10.

Referring to FIG. 25, in the second and third stages, the forward shift operation occurs when the third selection signal VSEL1 has a high voltage level (HIGH). Namely, the Nth stage is set (or activated) by the output signal GOUT[N−1] of the previous stage. The output signal GOUT[N−1] of the previous stage is selected by transistor M8. The Nth stage is reset (or inactivated) by the output signal GOUT[N+1] of the next stage. The output signal GOUT[N+1] of the next stage is selected by transistor M11.

The backward shift operation occurs when the fourth selection signal VSEL2 has a high voltage level (HIGH). Namely, the Nth stage is set (or activated) by the output signal GOUT[N+1] of the next stage. The output signal GOUT[N+1] of the next stage is selected by transistor M9. The Nth stage is reset (or inactivated) by the output signal GOUT[N−1] of the previous stage. The output signal GOUT[N−1] of the previous stage is selected by transistor M10. Namely, the third and fourth selection signal VSEL1 and VSEL2 determines the shift direction.

Referring to FIG. 26, in the first stage, the scan start signal STV is applied to a drain of transistor M8, a dummy 0 signal, or the output signal of the dummy stage 0, is applied to a transistor M10.

The third selection signal VSEL1 is applied to the gates of transistors M8 and M11 so as to select the scan start signal STV and GOUT[2] signal, and the fourth selection signal VSEL2 is applied to the gates of transistors M9 and M10 so as to select a dummy 0 signal and GOUT[2].

The forward shift operation occurs when the third selection signal VSEL1 has a high voltage level (HIGH) and the first clock signal ckv is applied to the clock terminal CK. Namely, the first stage is set (or activated) by the scan start signal STV, and is reset (or inactivated) by the output signal GOUT[2] of the next stage.

The backward shift operation occurs when the fourth selection signal VSEL2 has a high voltage level (HIGH) and the second clock signal ckvb is applied to the clock terminal CK. Namely, the first stage is set (or activated) by the output signal GOUT[2] of the next stage, and is reset (or inactivated) by the dummy 0 signal, or the output signal of the dummy stage 0.

Referring to FIG. 27, in the fourth stage (or a last stage), the third selection signal VSEL1 is applied to the gates of transistors M8 and M11 so as to select GOUT[3] and the dummy 1 signal, and the fourth selection signal VSEL2 is applied to the gates of transistors M9 and M10 so as to select the scan start signal STV and GOUT[3]. The dummy 1 signal, or the output signal of the dummy stage 1, is used to provide the backward shift function.

The forward shift operation occurs when the third selection signal VSEL1 has a high voltage level (HIGH) and the second clock signal ckvb is applied to the clock terminal CK. Namely, the fourth stage is set (or activated) by the output signal GOUT[3] of the previous stage, and is reset (or inactivated) by the dummy 1 signal, or the output signal of the dummy stage 1.

The backward shift operation occurs when the fourth selection signal VSEL2 has a high voltage level (HIGH) and the first clock signal ckv is applied to the clock terminal CK. Namely, the fourth stage is set (or activated) by the scan start signal STV, and is reset (or inactivated) by the output signal GOUT[3] of the previous stage.

The dummy stage 0 and the dummy stage 1 has the same circuit structure as that of the dummy stage 0 and the dummy stage 1 of FIGS. 18 and 21.

Figure 28:
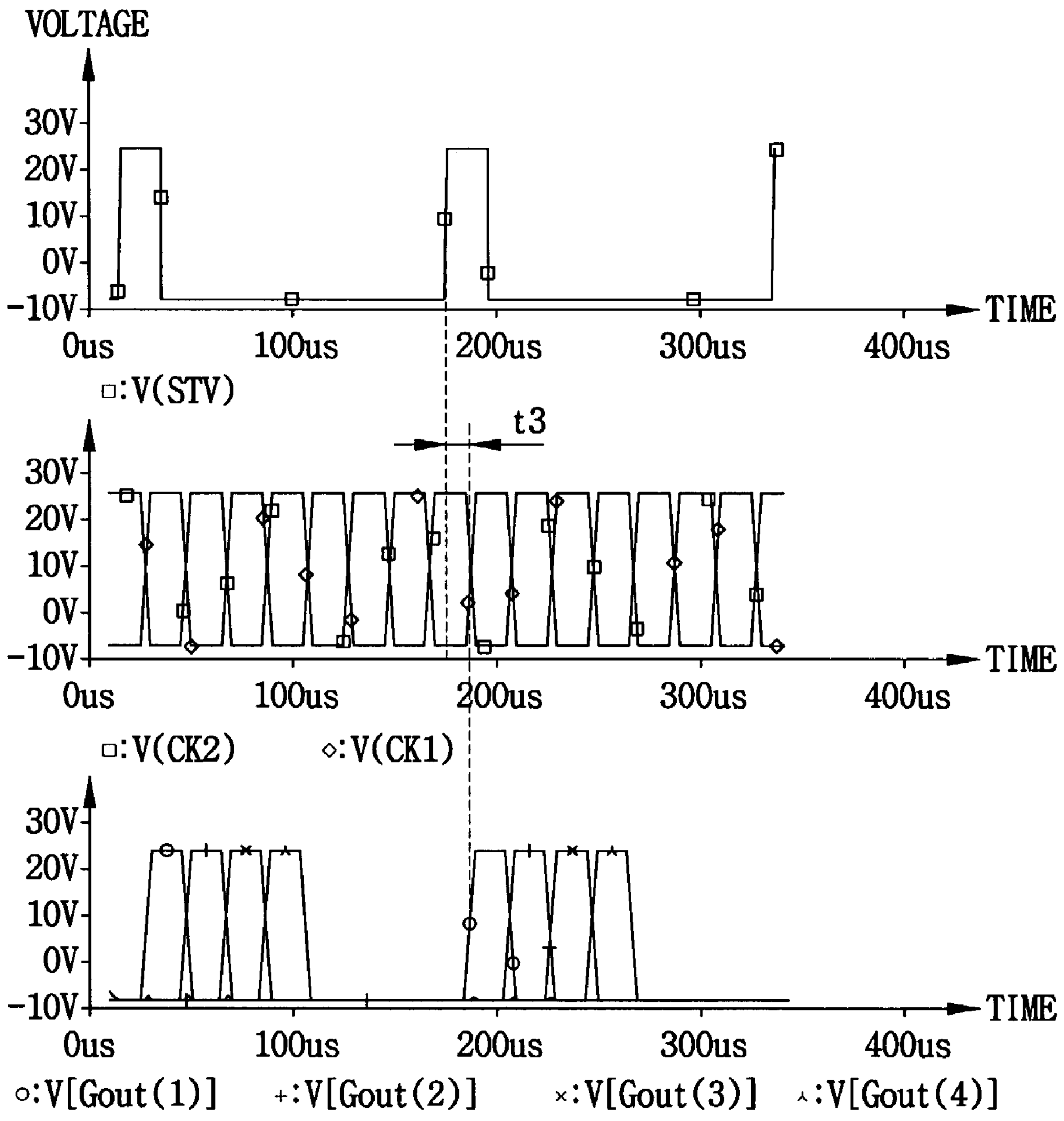
FIG. 28 is a graph showing scan line driving signals outputted from the stages of FIG. 24 during a forward shift.

FIG. 28 is a graph showing scan line driving signals outputted from the stages of FIG. 24 during a forward shift.

When VSEL1=Von, VSEL2=Voff, CKV=ckv and CKVB=ckvb, the forward shift operation occurs. The second clock signal ckv has a phase 180° different from that of the first clock signal ckvb.

Figure 29:
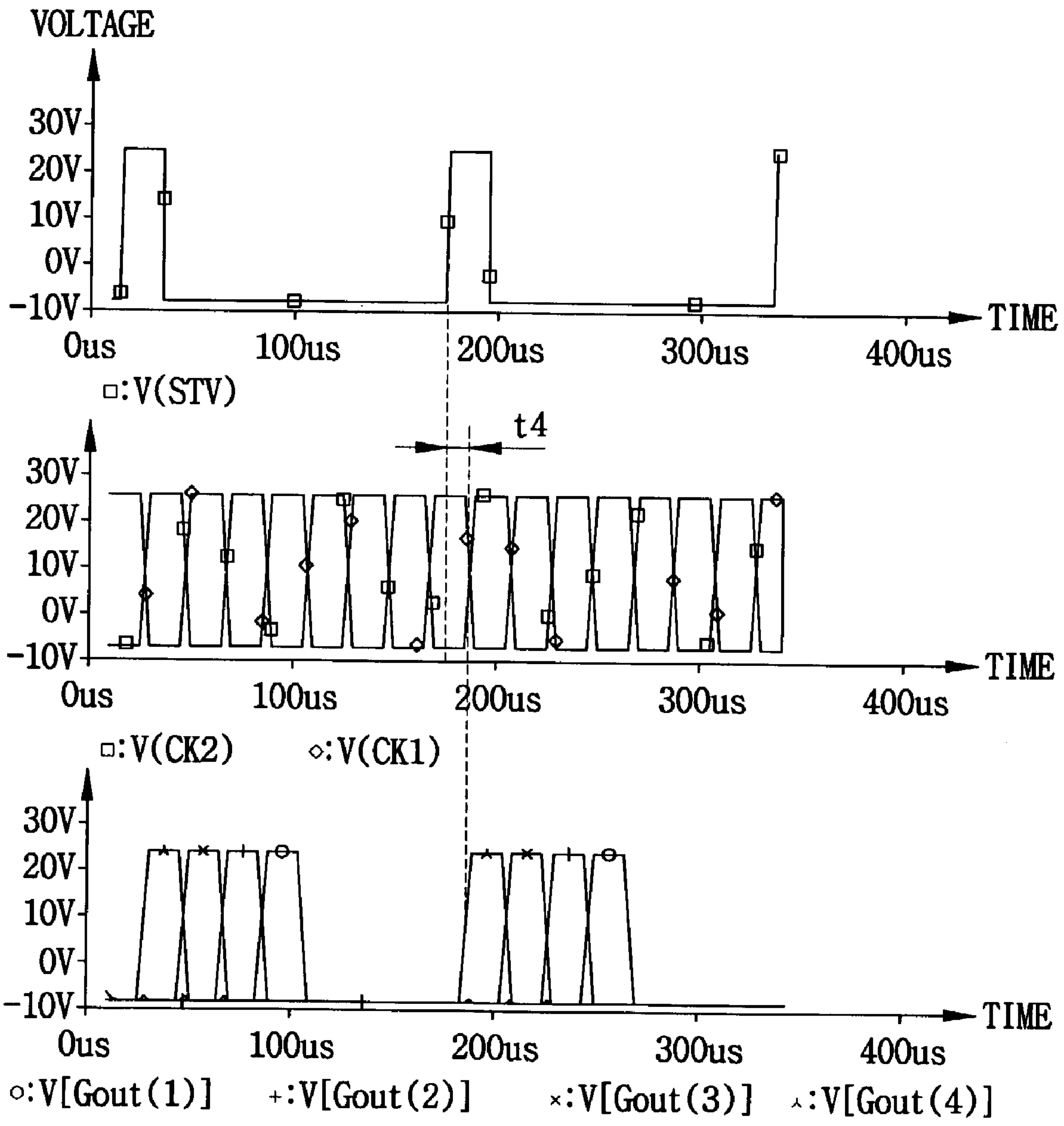
FIG. 29 is a graph showing scan line driving signals outputted from the stages of FIG. 24 during a backward shift.

FIG. 29 is a graph showing scan line driving signals outputted from the stages of FIG. 24 during a backward shift.

When VSEL1=Voff, VSEL2=Von, CKV=ckvb and CKVB=ckv, the backward shift operation occurs.

Figure 30:
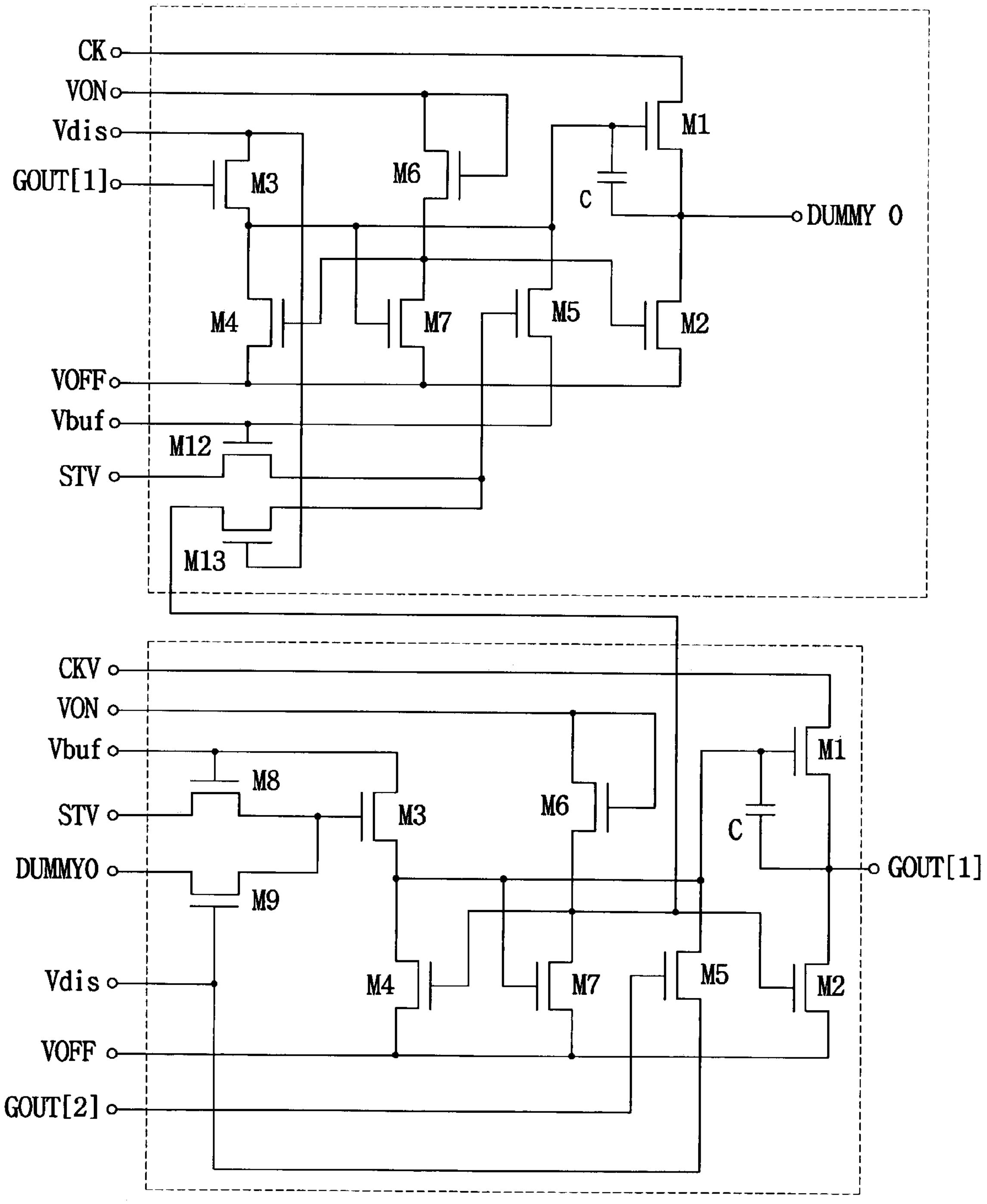
FIGS. 30, 31, 32 and 33 are block diagrams respectively showing a bi-directional shift register according to still another embodiment of the present invention.
Figure 31:
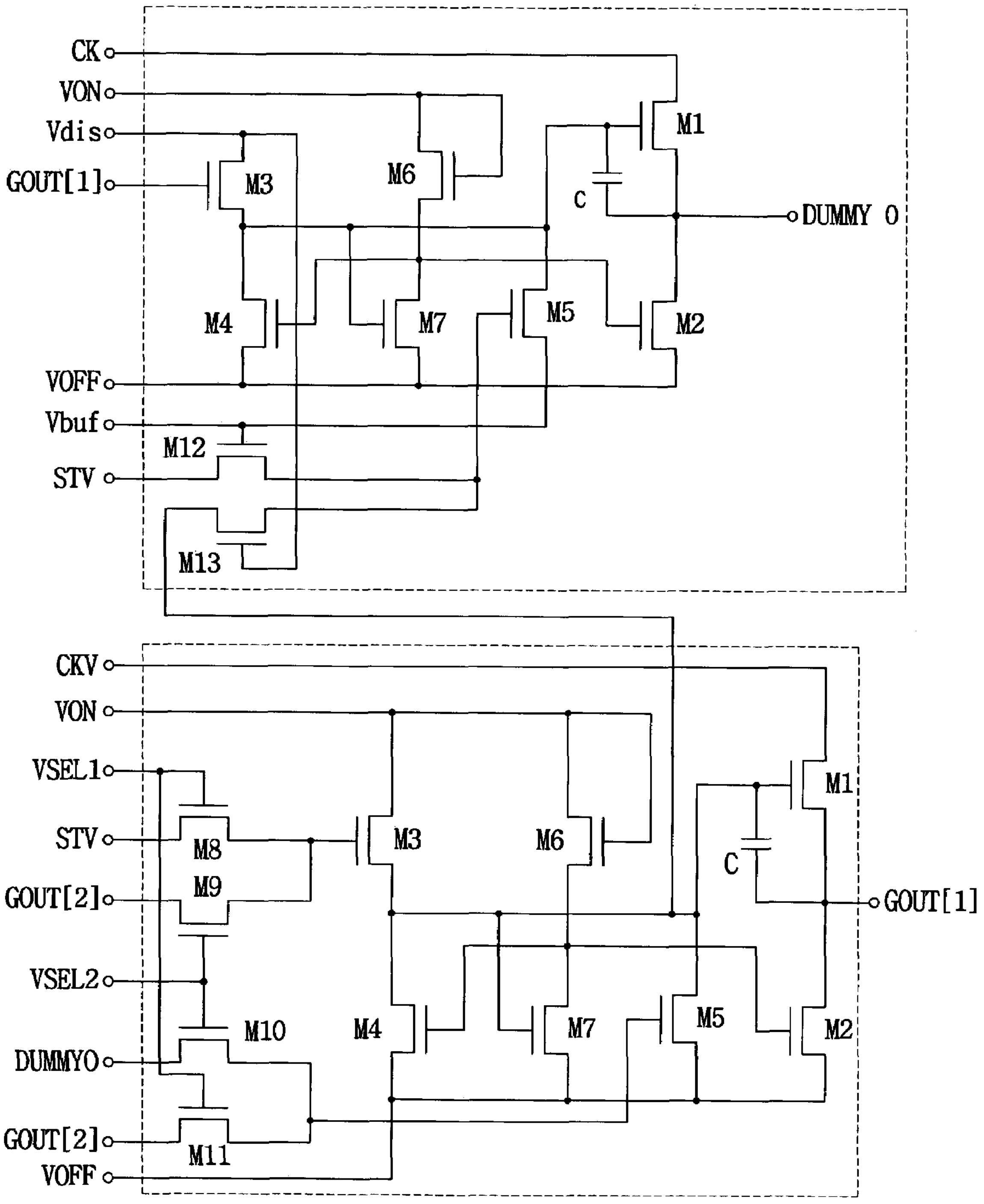
Figure 32:
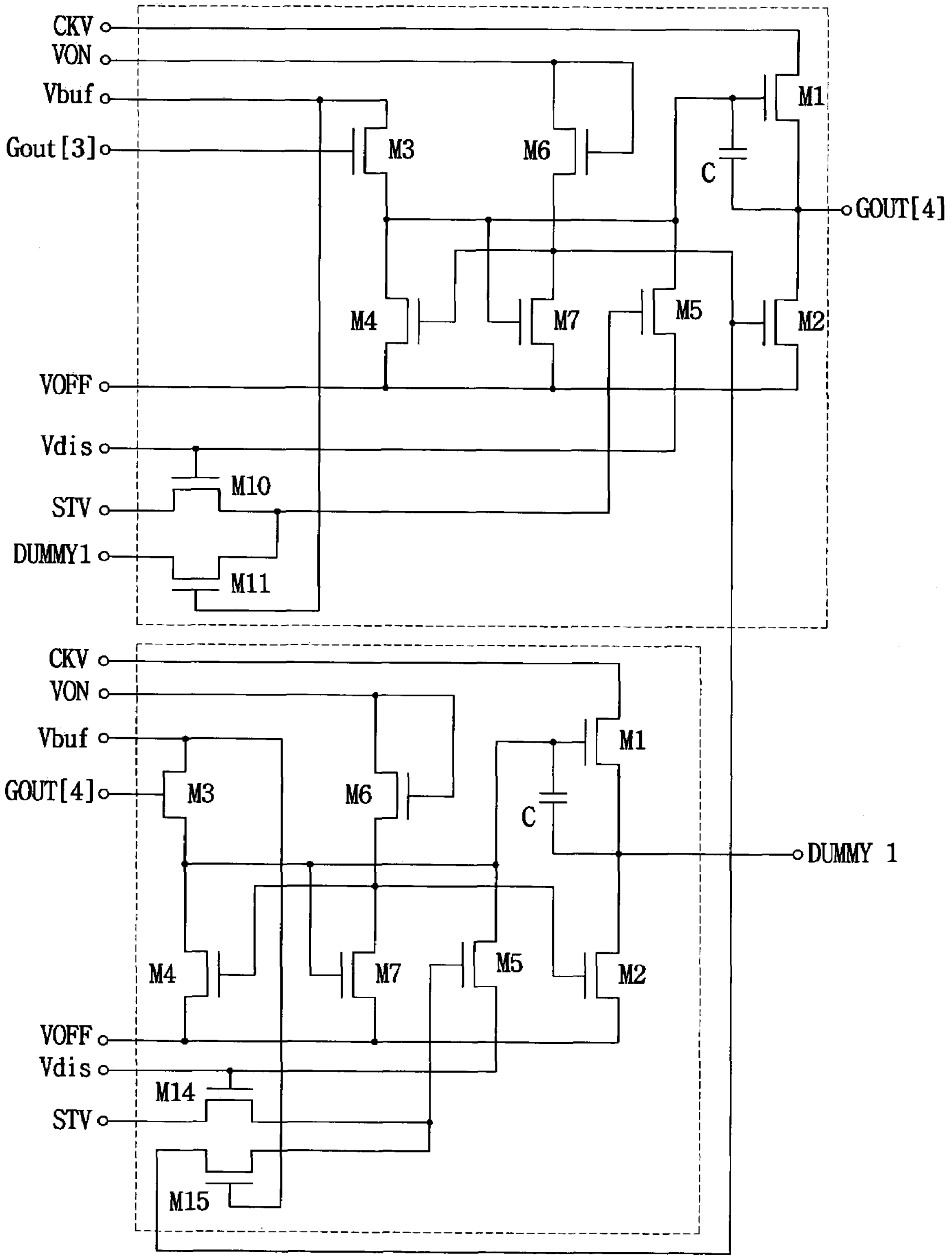
Figure 33:
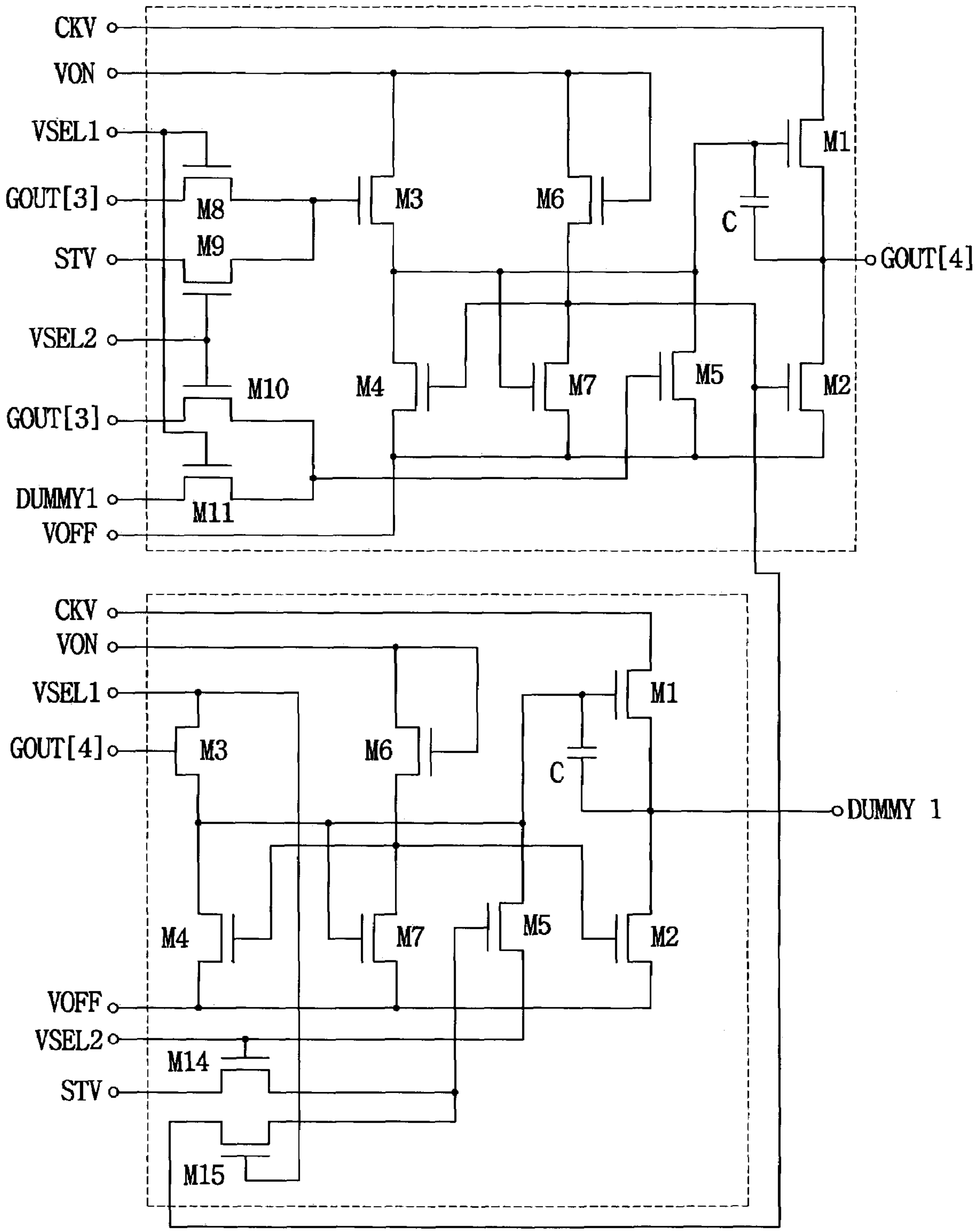

FIGS. 30, 31, 32 and 33 are block diagrams respectively showing a bi-directional shift register according to still another embodiment of the present invention. A dummy stage 0 and a dummy stage 1 are reset by the output signals of the first stage or the last stage instead of the scan start signal STV in order to prevent the output signals of the dummy stage 0 and the dummy stage 1 from existing during the display blanking period. FIG. 30 shows the connection between the dummy stage 0 and the first stage of FIG. 19, and FIG. 31 shows the connection between the dummy stage 0 and the first stage of FIG. 26. FIG. 32 shows the connection between the dummy stage 1 and the last stage of FIG. 20, and FIG. 33 shows the connection between the dummy stage 1 and the last stage of FIG. 27.

Referring to FIG. 30 and FIG. 31, a gate of a pull-down transistor M2 of the first stage is connected to the output of an inverter (M6 and M7) of the first stage, and is connected to a hold transistor M5 of the dummy stage 0 through a transistor M13 of the dummy stage 0.

In the dummy stage 0, the forward shift operation occurs when Vbuf=Von, Vdis=Voff. The dummy stage 0 is set (or activated) by the scan start signal STV inputted through the transistor M12 of the dummy stage 0, and is reset (or inactivated) by the output signal GOUT[1] of the first stage. The backward shift operation occurs when Vbuf=Voff, Vdis=Von. The dummy stage 0 is set (or activated) by the output signal GOUT[1] of the first stage, and is reset (or inactivated) by the output signal of the inverter of the first stage.

Accordingly, in the backward shift operation, the dummy stage 0 is reset by a control signal, or the output of the inverter of the first stage instead of the scan start signal STV, to thereby prevent the output signal of the dummy stage 0 from remaining during the display blanking period.

Referring to FIG. 32 and FIG. 33, a gate of a pull-down transistor M2 of the last stage is connected to the output of an inverter (M6 and M7) of the last stage, and is connected to a hold transistor M5 of the dummy stage 1 through a transistor M13 of the dummy stage 1.

In the dummy stage 1, the forward shift operation occurs when Vbuf=Von, Vdis=Voff. The dummy stage 1 is set (or activated) by the output signal GOUT[4] of the last stage, and is reset (or inactivated) by the output of the inverter (M6 and M7) of the last stage. The backward shift operation occurs when Vbuf=Voff, Vdis=Von. The dummy stage 1 is set (or activated) by the scan start signal STV inputted through transistor M14 of the dummy stage 1, and is reset (or inactivated) by the output signal GOUT[4] of the last stage.

Accordingly, in the forward shift operation, the dummy stage 1 is reset by a control signal, or the output of the inverter of the last stage instead of the scan start signal STV, to thereby prevent the output signal of the dummy stage 1 from remaining during the display blanking period.

Figure 34:
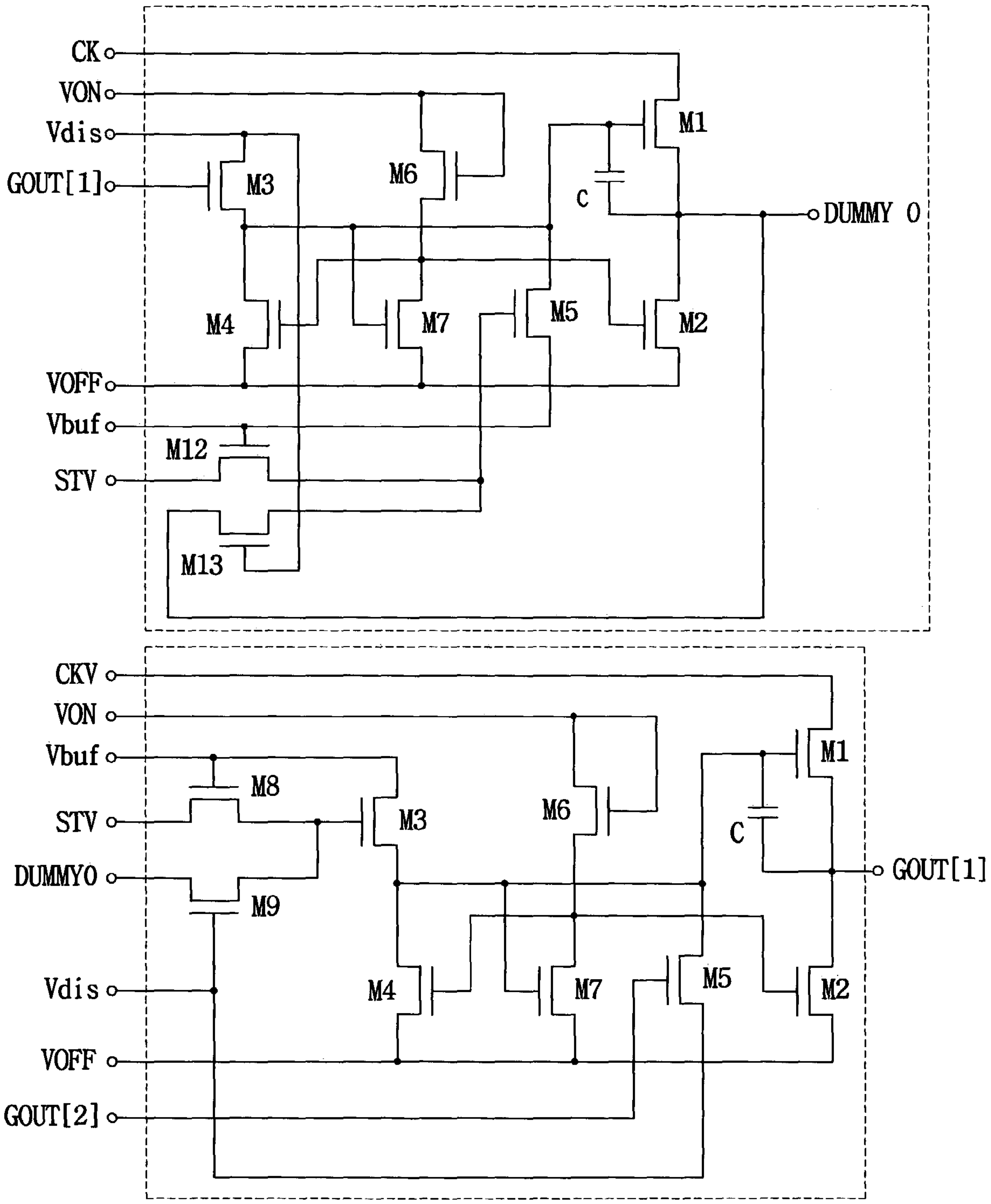
FIGS. 34, 35, 36 and 37 are block diagrams respectively showing a bi-directional shift register according to still another exemplary embodiment of the present invention.
Figure 35:
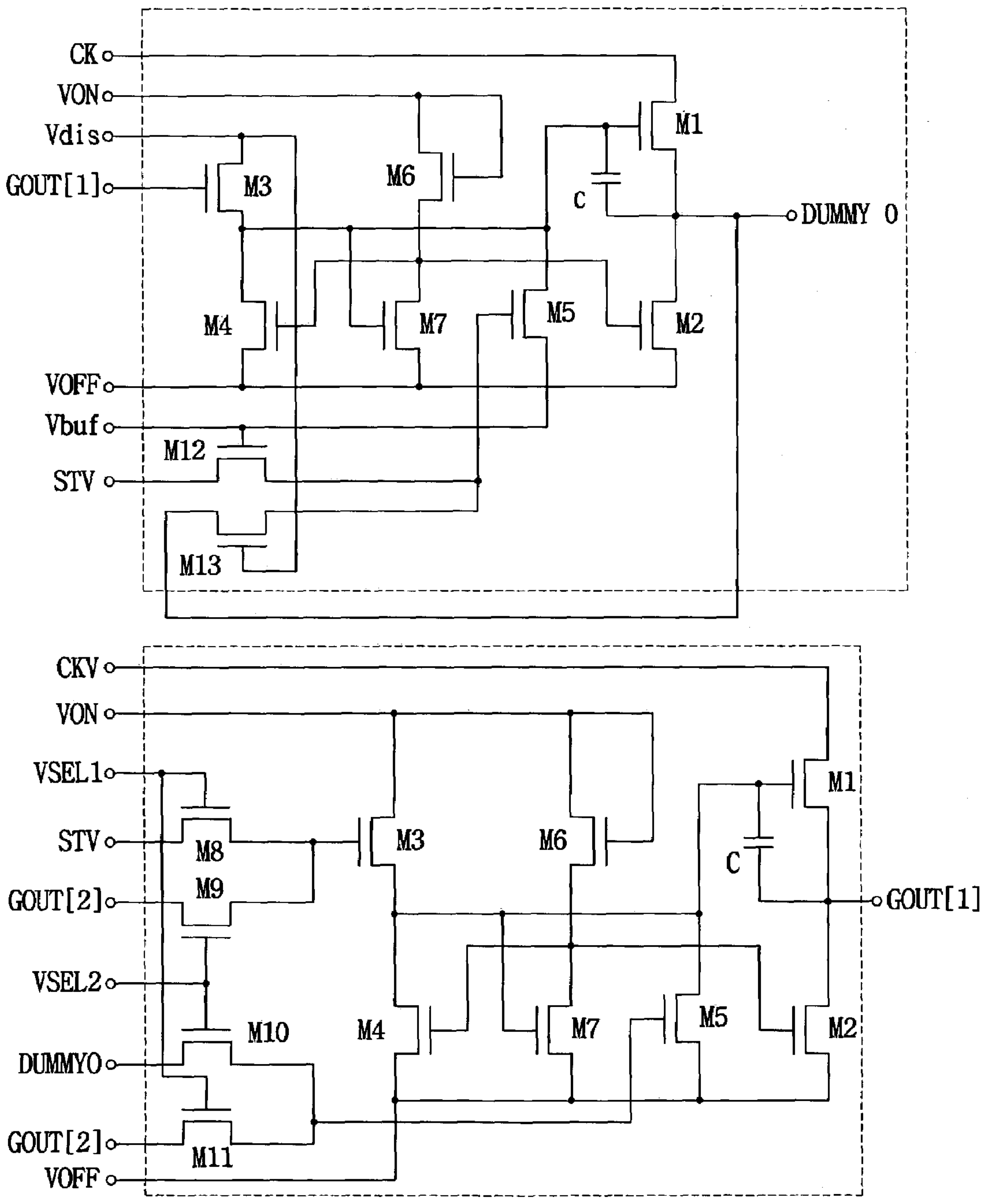
Figure 36:
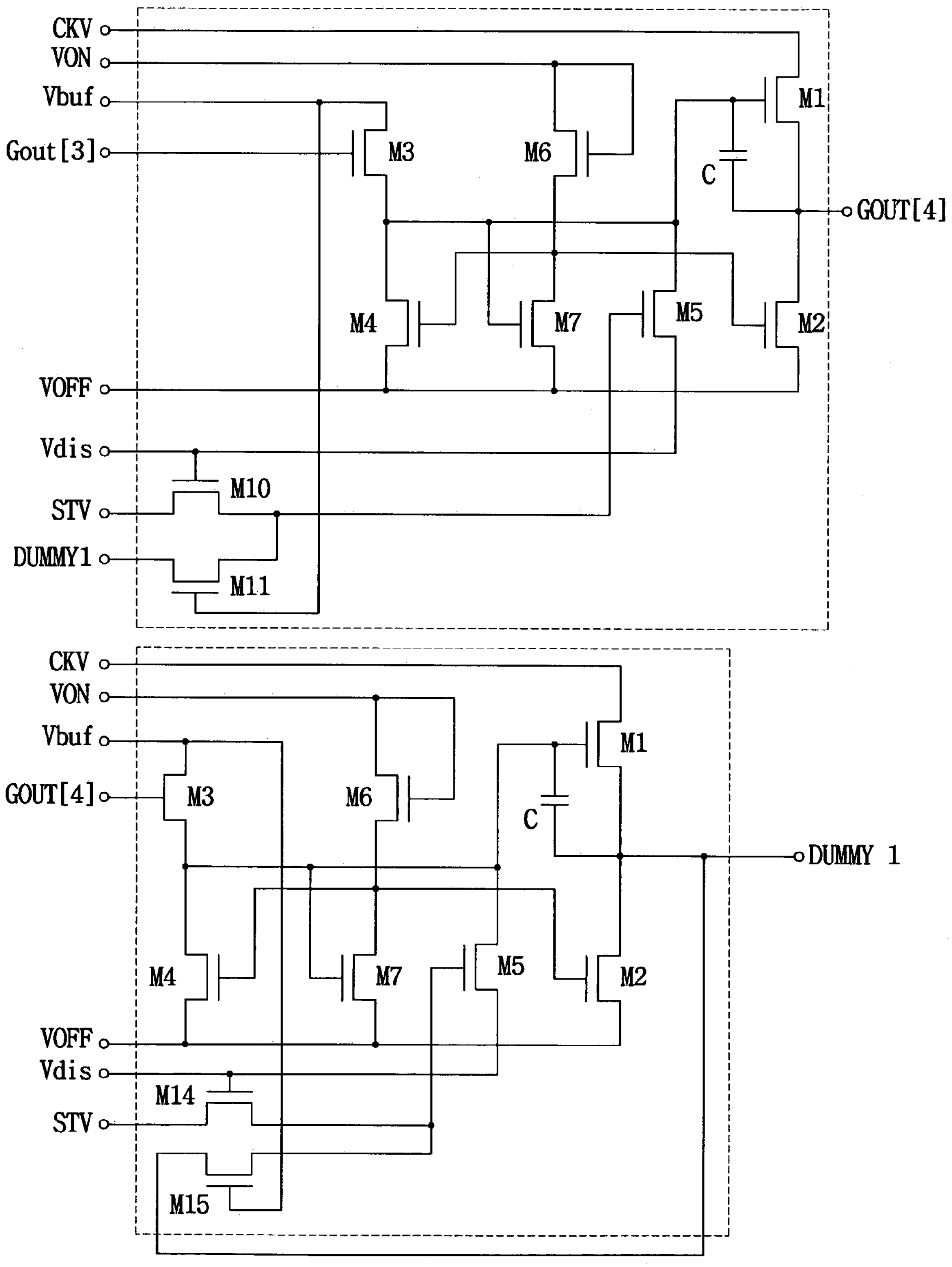
Figure 37:
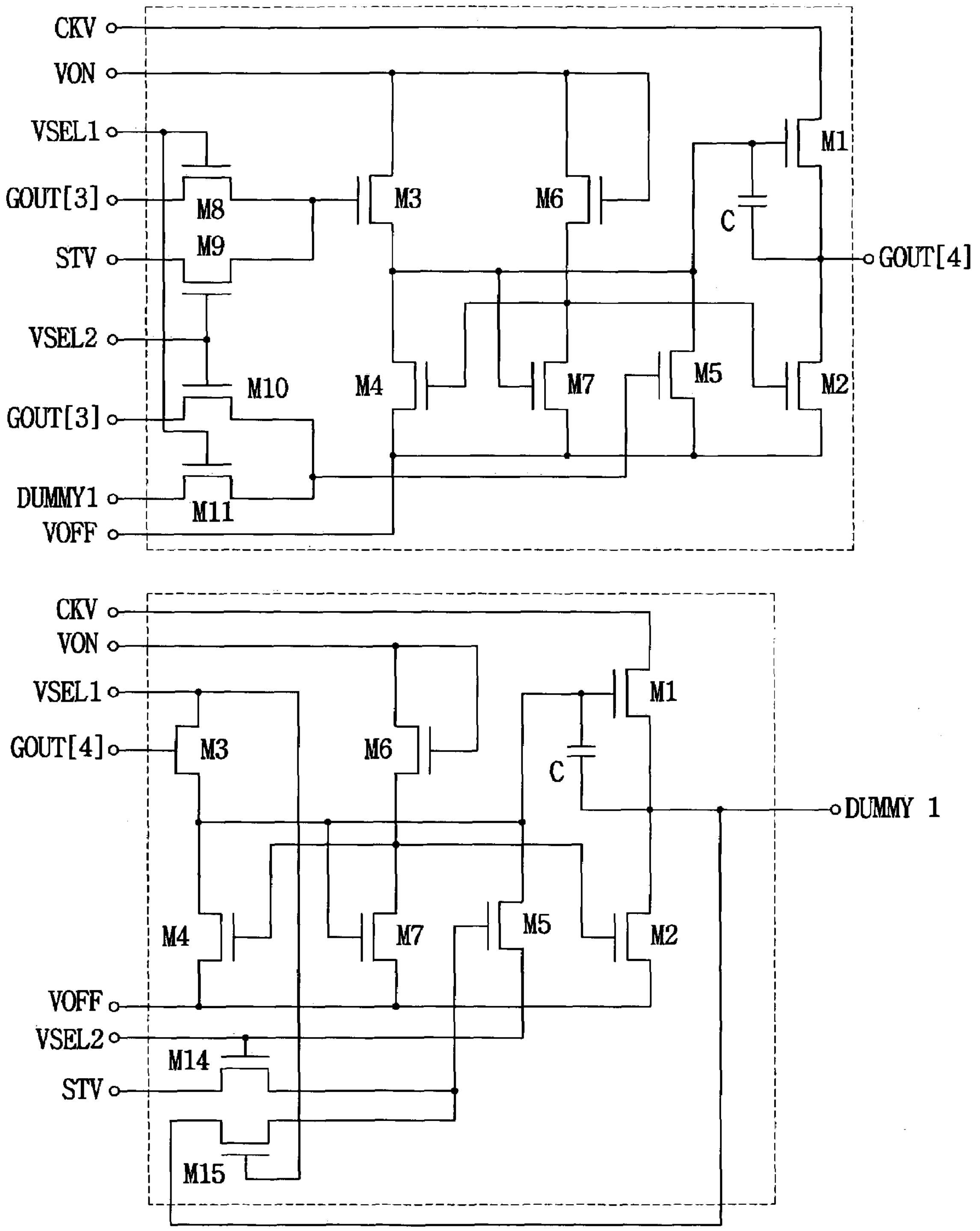

FIGS. 34, 35, 36 and 37 are block diagrams respectively showing a bi-directional shift register according to still another exemplary embodiment of the present invention. A dummy stage 0 and a dummy stage 1 are reset by the output signals of the dummy stage 0 and the dummy stage 1 instead of the scan start signal STV in order to prevent the output signals of the dummy stage 0 and the dummy stage 1 from existing during the display blanking period. FIG. 34 shows the connection between the dummy stage 0 and the first stage of FIG. 19, and FIG. 35 shows the connection between the dummy stage 0 and the first stage of FIG. 26. FIG. 36 shows the connection between the dummy stage 1 and the last stage of FIG. 20, and FIG. 37 shows the connection between the dummy stage 1 and the last stage of FIG. 27.

Referring to FIG. 34 and FIG. 35, an output signal of the dummy stage 0 is connected to a hold transistor M5 of the dummy stage 0 through a transistor M13 of the dummy stage 0, and the output signal GOUT[1] of the first stage is connected to a gate of a buffer transistor M3 of the dummy stage 0.

In the dummy stage 0, the forward shift operation occurs when Vbuf=Von, Vdis=Voff. The dummy stage 0 is set (or activated) by the scan start signal STV inputted through the transistor M12 of the dummy stage 0, and is reset (or inactivated) by the output signal GOUT[1] of the first stage. The backward shift operation occurs when Vbuf=Voff, Vdis=Von. The dummy stage 0 is set (or activated) by the output signal GOUT[1] of the first stage, and is reset (or inactivated) by the output signal of the dummy stage 0.

Accordingly, in the backward shift operation, the dummy stage 0 is reset by the output signal of the dummy stage 0, to thereby prevent the output signal of the dummy stage 0 from remaining during the display blanking period.

Referring to FIG. 36 and FIG. 37, an output signal of the dummy stage 1 is connected to a hold transistor M5 of the dummy stage 1 through a transistor M15 of the dummy stage 1, and the output signal GOUT[4] of the last stage is connected to a gate of a buffer transistor M3 of the dummy stage 1.

In the dummy stage 1, the forward shift operation occurs when Vbuf=Von, Vdis=Voff. The dummy stage 1 is set (or activated) by the output signal GOUT[4] of the last stage, and is reset (or inactivated) by the output of the inverter (M6 and M7) of the last stage. The backward shift operation occurs when Vbuf=Voff, Vdis=Von. The dummy stage 1 is set (or activated) by the scan start signal STV inputted through transistor M14 of the dummy stage 1, and is reset (or inactivated) by the output signal GOUT[4] of the last stage.

Accordingly, in the forward shift operation, the dummy stage 1 is reset by a control signal, or the output of the inverter of the last stage instead of the scan start signal STV, to thereby prevent the output signal of the dummy stage 1 from remaining during the display blanking period.

Although the above embodiments discuss the shift register for driving the gate lines of the liquid crystal display device, the present invention may also be utilized in the organic electroluminescent display device.

While the exemplary embodiments of the present invention and its advantages have been described in detail, it should be understood that various changes, substitutions and alterations can be made herein without departing from the scope of the invention as defined by appended claims.

What is claimed is:

1. A shift register comprising:

a plurality of stages including odd numbered stages and even numbered stages, the odd numbered stages respectively receiving a first clock and a first control signal, the first clock being prevented from being outputted from each of the odd numbered stages in response to the first control signal, the even numbered stages respectively receiving a second clock and a second control signal, the second clock being prevented from being outputted from each of the even numbered stages in response to the second control signal, the second clock having a first phase 180° different from a second phase of the first clock, the stages respectively delaying the first clock or the second clock by a first period to sequentially output the first clock end the second clock as a scan line driving signal;

a dummy stage for generating a dummy output signal, the scan line driving signal of a last stage falling below a first predetermined voltage level in response to the dummy output signal of the dummy stage, the dummy output signal being delayed by a second period and falling below a second predetermined voltage level in response to the dummy output signal.

2. The shift register of claim 1, wherein each of the stages comprises:

a pull-up part for providing an output terminal of each of the stages with the first clock or the second clock with;

a pull-down part for providing the output terminal of each of the stage with a first power voltage;

a pull-up driver part for turning on the pull-up part in response to the scan line driving signal of a previous stage and turning off the pull-up part in response to the first control signal or the second control signal; and a pull-down driver part for turning off the pull-up part in response to the scan line driving signal of the previous stage and turning on the pull-up part in response to the first control signal or the second control signal.

3. The shift register of claim 1, wherein the dummy stage comprises:

a dummy pull-up part for providing a dummy output terminal with the first clock or the second clock;

a dummy pull-down part for providing the dummy output terminal with the first power voltage;

a dummy pull-up driver part for turning on the dummy pull-up part in response to the scan line driving signal of the last stage and turning off the dummy pull-up part rnreuponse to the first clock or the second clock that is applied to the dummy pull-up driver part through the dummy pull-up part: and a dummy pull-down driver part for turning off the dummy pull-down part in response to the scan line driving signal of the last stage and turning on the dummy pull-down part in response to the first control signal or the second control signal.

4. The shift register of claim 3, wherein the dummy pull-up driver part comprises:

a capacitor coupled between a first input node of the dummy pull-up part and the dummy output terminal;

a first transistor, a first drain of the first transistor receiving the first power voltage, a first gate of the first transistor receiving the scan line driving signal of the previous stage, and a first source of the first transistor coupled to the first input node of the dummy pull-up part;

a second transistor, a second drain of the second transistor coupled to the first input node of the dummy pull-up part, a second gate of the second transistor coupled to a second input node of the dummy pull-down part, and a second source of the second transistor receiving the first power voltage; and a third transistor, a third drain of the third transistor coupled to the first input node of the dummy pull-up part, a third gate of the third transistor coupled to an output terminal of the dummy pull-up part, and a third source of the third transistor receiving the first power voltage.

5. A shift register comprising:

a plurality of stages including odd numbered stages and even numbered stages, the odd numbered stages respectively receiving a first clock and a first control signal, the first clock being prevented from being outputted from each of the odd numbered stages in response to the first control signal, the even numbered stages respectively receiving a second clock and a second control signal, the second clock being prevented from being outputted from each of the even numbered stages in response to the second control signal, the second clock having a first phase 180° different from a second phase of the first clock, the stages respectively delaying the first clock or the second clock by a first period to sequentially output the first clock and the second clock as a scan line driving signal;

a dummy stage, coupled to a last stage, for generating a dummy output signal, the scan line driving signal of the last stage falling below a first predetermined voltage level in response to the dummy output signal of the dummy stage, the dummy output signal being delayed by a second period and falling below a second predetermined voltage level in response to a control signal of the last stage.

6. The shift register of claim 5, wherein each of the stages comprises:

a pull-up part for providing a first output terminal of each of the stages with the first clock or the second clock;

a pull-down part for providing the first output terminal of each of the stages with a first power voltage;

a pull-up driver part for turning on the pull-up part in response to the scan line driving signal of a previous stage and turning off the pull-up part in response to the first control signal or the second control signal; and a pull-down driver part for turning off the pull-up part in response to the scan line driving signal of the previous stage and turning on the pull-up part in response to the first control signal or the second control signal.

7. The shift register of claim 5, wherein the dummy stage comprises:

a dummy pull-up part for providing a dummy output terminal with the first clock or the second clock;

a dummy pull-down part for providing the dummy output terminal with a first power voltage;

a dummy pull-up driver part for turning on the dummy pull-up part in response to the scan line driving signal of the last stage and turning off the dummy pull-up part when the pull-down driver part of the last stage is turned off; and a dummy pull-down driver part for turning off the dummy pull-down part in response to the scan line driving signal of the last stage and turning on the dummy pull-down part in response to the first control signal or the second control signal.

8. The shift register of claim 7, wherein the dummy pull-up driver part comprises:

a capacitor coupled between a first input node of the dummy pull-up part and the dummy output terminal, a first transistor, a first drain of the first transistor receiving the first power voltage, a first gate of the first transistor receiving the scan line driving signal of the previous stage, and a first source of the first transistor coupled to the first input node of the dummy pull-up part;

a second transistor, a second drain of the second transistor coupled to the first input node of the dummy pull-up part, a second gate of the second transistor coupled to a second input node of the dummy pull-down part, and a second source of the second translator receiving the first power voltage; and a third transistor, a third drain of the third transistor coupled to the first input node of the dummy pull-up part, a third gate of the third transistor coupled to a second output terminal of the dummy pull-down driver part of the last stage, and a third source of the third transistor receiving the first power voltage.

9. A shift register including odd numbered stages and even numbered stages, the odd numbered stages respectively receiving a first clock, the even numbered stages respectively receiving a second clock having a first phase 180° different from a second phase of the first clock, the shift register comprising:

a first stage performing a forward shift from the first stage to a last stage when a first selection signal has a first voltage level and performing a backward shift from the last stage to the first stage when a second selection signal has the first voltage level;

a Nth stage performing the forward shift from the first stage to the last stage when the first selection signal has the first voltage level and performing the backward shift from the last stage to the first stage when the second selection signal has the first voltage level, N being an integer greater than or equal to 2;

a last stage performing the forward shift from the first stage to the last stage when the first selection signal has the first voltage level and performing the backward shift from the last stage to the first stage when the second selection signal has the first voltage level;

a first dummy stage for inactivating the last stage during the forward shift; and a second dummy stage for inactivating the first stage during the backward shift.

10. The shift register of claim 9, wherein the first selection signal has a first phase 180° different from a second phase of the second selection signal.

11. The shift register of claim 9, wherein the first and second selection signals have a first electric potential higher than a second electric potential of the first and second clocks.

12. The shift register of claim 9, wherein a shift direction of the stages is changed by exchanging the first clock and the second clock in correspondence with the first and second selection signal.

13. The shift register of claim 9, wherein each of the stages includes a plurality of transistors, each of the transistors being a-Si NMOS transistor.

14. The shift register of claim 9, wherein the first and second selection signals have a first electric potential higher than a second electric potential of the first and second clocks.

15. The shift register of claim 9, wherein a shift direction of the stages is changed by exchanging the first clock and the second clock in correspondence with the first and second selection signal.

16. The shift register of claim 9, wherein each of the stages includes a plurality of transistors, each of the transistors being a-Si NMOS transistor.

17. A shift register including odd numbered stages and even numbered stages, the odd numbered stages respectively receiving a first clock, the even numbered stages respectively receiving a second clock having a first phase 180° different from a second phase of the first clock, the stages of the shifter register being sequentially shifted in synchronization with the first and second clock signals in a forward direction and in a backward direction, the shift register comprising:

a first stage receiving a scan start signal to generate a first scan line driving signal when a first selection signal has a first voltage level and lowering a second voltage level of the first scan line driving signal in response to a second scan line driving signal generated from a second stage, the first stage generating the first scan line driving signal in response to the second scan line driving signal when a second selection signal has the first voltage level and lowering the second voltage level of the first scan line driving signal in response to a second dummy output signal;

a Nth stage generating a Nth scan line driving signal in response to a (N−1)th scan line driving signal outputted from a (N−1)th stage when the first selection signal has the first voltage level and lowering a third voltage level of the Nth scan line driving signal in response to an (N+1)th scan line driving signal outputted from an (N+1)th stage, the Nth stage generating the Nth scan line driving signal in response to the (N+1)th scan line driving signal when the second selection signal has the first voltage level and lowering the third voltage level of the Nth scan line driving signal in response to the (N−1)th scan line driving signal, N being an integer greater than 2;

a Mth stage generating a Mth scan line driving signal in response to a (M−1)th scan line driving signal outputted from a (M−1)th stage when the first selection signal has the first voltage level and lowering a fourth voltage level of the Mth scan line driving signal in response to a first dummy output signal, the Mth stage generating the Mth scan line driving signal in response to the scan start signal when the second selection signal has the first voltage level and lowering the fourth voltage level of the Mth scan line driving signal in response to the (M−1)th scan line driving signal, M being the integer greater than N;

a first dummy stage receiving the first clock signal and to Mth scan line driving signal to generate the first dummy output signal, and the first dummy stage lowering a fifth voltage level of the first dummy output signal in response to the scan start signal; and a second dummy stage receiving the second clock signal and the first scan line driving signal to generate the second dummy output signal, and the second dummy stage lowering a sixth voltage level of the second dummy output signal in response to the scan start signal.

18. The shift register of claim 17, wherein the first stage including:

a pull-up transistor for providing an output terminal of the first stage with the first scan line driving signal;

a pull-down transistor for providing the output terminal of each of the stages with a first power voltage;

a first pull-up driver transistor turning on the pull-up transistor in response to the scan start signal inputted to the first pull-up driver transistor through a first selection transistor when the first selection signal has the first voltage level, and the first pull-up driver transistor turning off the pull-up transistor in response to the second dummy output signal inputted to the first pull-up driver transistor through a second selection transistor when the second selection signal has the first voltage level;

a second pull-up driver transistor turning on the pull-up transistor in response to the second scan line driving signal when the second selection signal has the first voltage level, and the second pull-up driver transistor turning off the pull-up transistor in response to the second scan line driving signal when the first selection signal has the first voltage level;

a pull-down driver part turning off the pull-down transistor in response to the scan start signal or the second dummy output signal, and the pull-down driver part turning on the pull-down transistor in response to the second scan line driving signal; and a third pull-up driver transistor being turned off when the pull-up transistor is turned on.

19. The shift register of claim 17, wherein the Nth stage includes:

a pull-up transistor for providing an output terminal of the Nth stage with the Nth scan line driving signal;

a pull-dawn transistor for providing the output terminal of the Nth stage with a first power voltage;

a first pull-up driver transistor turning on the pull-up transistor in response to the (N−1)th scan line driving signal when the first selection signal has the first voltage level, and the first pull-up driver transistor turning off the pull-up transistor in response to the (N−1)th scan line driving signal when the second selection signal has the first voltage level;

a second pull-up driver transistor turning on the pull-up transistor in response to the (N+1)th scan line driving signal when the second selection signal has the first voltage level, and the second pull-up driver transistor turning of the pull-up transistor in response to the (N+1)th scan line driving signal when the first selection signal has to first voltage level;

a pull-down driver part turning off the pull-down transistor in response to the (N−1)th scan line driving signal, and the pull-down driver part turning on the pull-down transistor in response to the (N+1)th scan line driving signal; and a third pull-up driver transistor being turned off when the pull-up transistor is turned on.

20. The shift register of claim 17, wherein the Mth stage including:

a pull-up transistor for providing an output terminal of the Mth stage with the Mth scan line driving signal;

a pull-down transistor for providing the output terminal of the Mth stages with a first power voltage;

a first pull-up driver transistor turning on the pull-up transistor in response to the (M−1)th scan line driving signal when the first selection signal has the first voltage level, and the first pull-up driver transistor turning off the pull-up transistor in response to the (M−1)th scan line driving signal when the second selection signal has the first voltage level;

a second pull-up driver transistor turning on the pull-up transistor in response to the scan start signal inputted to the second pull-up driver transistor through a third selection transistor when the second selection signal has the first voltage level, and the second pull-up driver transistor turning off the pull-up transistor in response to the first dummy output signal inputted to the second pull-up driver transistor through a fourth selection transistor when the first selection signal has the first voltage level;

a pull-down driver part turning off the pull-down transistor in response to the (M−1)th scan line driving signal, and the pull-down driver part turning on the pull-down transistor in response to the first scan line driving signal and the scan start signal; and a third pull-up driver transistor being turned off when the pull-up transistor is turned on.

21. The shift register of claim 17, wherein the first dummy stage including:

a pull-up transistor for providing an output terminal of the first dummy stage with the first dummy output signal;

a pull-down transistor for providing the output terminal of the first dummy stage with a first power voltage;

a first pull-up driver transistor turning on the pull-up transistor in response to the Mth scan line driving signal;

a second pull-up driver transistor turning off the pull-up transistor in response to the scan start signal;

a pull-down driver part turning off the pull-down transistor in response to the first scan line driving signal, and the pull-down driver part turning on the pull-down transistor in response to the scan start signal; and a third pull-up driver transistor being turned off when the pull-up transistor is turned on.

22. The shift register of claim 17, wherein the second dummy stage including:

a pull-up transistor for providing an output terminal of the second dummy stage with the second dummy output signal;

a pull-down transistor for providing the output terminal of the second dummy stage with a first power voltage;

a first pull-up driver transistor turning on the pull-up transistor in response to the first scan line driving signal;

a second pull-up driver transistor turning off the pull-up transistor in response to the scan start signal;

a pull-down driver part turning off the pull-down transistor in response to the first scan line driving signal, and the pull-down driver part turning on the pull-down transistor in response to the scan start signal; and a third pull-up driver transistor being turned off when the pull-up transistor is turned on.

23. The shift register of claim 17, wherein the first selection signal has a first phase 180° different from a second phase of the second selection signal.

* * * * *